US006441669B2

(12) United States Patent
Ooishi

(10) Patent No.: US 6,441,669 B2
(45) Date of Patent: Aug. 27, 2002

(54) INTERNAL POWER-SOURCE POTENTIAL SUPPLY CIRCUIT, STEP-UP POTENTIAL GENERATING SYSTEM, OUTPUT POTENTIAL SUPPLY CIRCUIT, AND SEMICONDUCTOR MEMORY

(75) Inventor: Tsukasa Ooishi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/797,988

(22) Filed: Mar. 5, 2001

Related U.S. Application Data

(62) Division of application No. 08/755,923, filed on Nov. 25, 1996, now Pat. No. 6,229,383.

(30) Foreign Application Priority Data

| | | |
|---|---|---|
| Nov. 28, 1995 | (JP) | 7-309618 |
| May 10, 1996 | (JP) | 8-116227 |
| Jun. 10, 1996 | (JP) | 8-147181 |

(51) Int. Cl.[7] .................. H03L 5/00
(52) U.S. Cl. .................. 327/308
(58) Field of Search .................. 327/308, 530, 327/534, 535, 538, 545

(56) References Cited

U.S. PATENT DOCUMENTS

| | | | | |
|---|---|---|---|---|
| 4,038,568 A | | 7/1977 | May et al. | 307/351 |
| 4,313,067 A | | 1/1982 | White | 307/494 |
| 4,451,703 A | | 5/1984 | Brightman et al. | 307/257 |
| 4,570,115 A | | 2/1986 | Misawa et al. | 323/313 |
| 4,839,865 A | * | 6/1989 | Sato et al. | 365/201 |
| 5,253,201 A | * | 10/1993 | Atsumi et al. | 365/185.2 |
| 5,253,205 A | * | 10/1993 | Eaton, Jr. | 365/149 |
| 5,255,232 A | * | 10/1993 | Foss et al. | 365/203 |
| 5,388,084 A | | 2/1995 | Itoh et al. | 365/226 |
| 5,485,117 A | | 1/1996 | Furumochi | 327/538 |
| 5,500,824 A | * | 3/1996 | Fink | 365/149 |
| 5,504,452 A | | 4/1996 | Takenaka | 327/541 |
| 5,508,962 A | * | 4/1996 | McLaughlin et al. | 327/530 |
| 5,534,818 A | | 7/1996 | Peterson | 327/545 |
| 5,576,990 A | * | 11/1996 | Camerlenghi et al. | 365/185.18 |
| 5,619,123 A | | 4/1997 | Okamura | 323/312 |
| 6,040,736 A | | 3/2000 | Milanesi et al. | 327/541 |

FOREIGN PATENT DOCUMENTS

| | | |
|---|---|---|
| JP | 3-164814 | 7/1991 |

* cited by examiner

*Primary Examiner*—Jeffrey Zweizig
(74) *Attorney, Agent, or Firm*—McDermott, Will & Emery

(57) ABSTRACT

An internal power-source potential supply circuit for supplying an internal power-source potential with high accuracy is disclosed. An external power-source potential (VCE) is connected to the source of a PMOS transistor (Q1) having a drain for applying an internal power-source potential (VCI) to a load (11) and a gate receiving a control signal (S1) from a comparator (1). The comparator (1) outputs the control signal (S1) on the basis of a comparison result between a reference potential (Vref) and a divided internal power-source potential (DCI). The drain of the PMOS transistor (Q1) is connected to a first end of a resistor (R1), and a current source (2) is connected between a second end of the resistor (R1) and ground. A voltage provided at a node (N1) serving as the second end of the resistor (R1) is applied to a positive input of the comparator (1) as the divided internal power-source potential (DCI).

3 Claims, 57 Drawing Sheets

INTERNAL POWER-SOURCE POTENTIAL SUPPLY CIRCUIT, STEP-UP POTENTIAL GENERATING SYSTEM, OUTPUT POTENTIAL SUPPLY CIRCUIT, AND SEMICONDUCTOR MEMORY

This application is a Divisional of application Ser. No. 08/755,923 filed Nov. 25, 1996, now U.S. Pat. No. 6,229, 383.

BACKGROUND OF THE INVENTION

1. Field of the Invention

The present invention relates to an internal power-source potential supply circuit for supplying an internal power-source potential to a predetermined load.

2. Description of the Background Art

FIG. 98 is a circuit diagram of a conventional internal power-source potential supply circuit for use in a semiconductor device. As shown, an external power-source potential VCE is applied as an internal power-source potential VCI to a load 11 through a PMOS transistor Q1. A comparator 1 has a negative input receiving a reference potential Vref and a positive input receiving the internal power-source potential VCI as a feedback signal, and provides a control signal S1 based on the result of comparison between the reference potential Vref and the internal power-source potential VCI to the gate of the PMOS transistor Q1.

In such an arrangement, if the internal power-source potential VCI is lower than the reference potential Vref, the control signal S1 from the comparator 1 has a lower potential to cause the PMOS transistor Q1 to conduct heavily. This increases the current supply capability from the external power-source potential VCE. Then, the circuit acts to raise the lowered internal power-source potential VCI. Conversely, if the internal power-source potential VCI is higher than the reference potential Vref, the control signal S1 from the comparator 1 has a higher potential to cause the PMOS transistor Q1 to conduct lightly. This stops the current supply capability from the external power-source potential VCE. Then, the circuit prevents further increase in raised internal power-source potential VCI. The comparator 1 may include a differential amplifier having a current mirror circuit or the like. In this manner, the internal power-source potential supply circuit may supply the internal power-source potential VCI equal to the reference potential Vref.

FIG. 99 is a circuit diagram of another conventional internal power-source potential supply circuit for use in a semiconductor device. As shown. the external power-source potential VCE is applied as the internal power-source potential VCI to the load 11 through the PMOS transistor Q1. The comparator 1 has a negative input receiving the reference potential Vref and a positive input receiving a divided internal power-source potential DVCI as a feedback signal.

The drain of the PMOS transistor Q1 is grounded through a resistor R11 and a resistor R12. The internal power-source potential VCI divided by the resistors R11 and R12 is applied as the divided internal power-source potential DVCI to the positive input of the comparator 1.

The circuit of FIG. 99 is advantageous in that the operating point of the comparator 1 may be freely selected, allowing the characteristics of the comparator 1 to be held satisfactory independently of the conditions set for the internal power-source potential VCI and external power-source potential VCE. In the arrangement of FIG. 98, a small difference between the external power-source potential VCE and the internal power-source potential VCI deteriorates the characteristics of the comparator 1, resulting in a delay in operation and a large amount of temporary reduction in internal power-source potential VCI.

The arrangement of FIG. 99 may supply the internal power-source potential VCI in a stable manner when the reference potential Vref is constant.

FIG. 100 is a graph indicating a drawback of the circuit of FIG. 99. In FIG. 100, (R11+R12)/R12=3/2. As shown in FIG. 100, a time interval T11 is defined during which the reference potential Vref rises to follow the varying external power-source potential VCE. During the time interval T11, the internal power-source potential VCI also rises to follow the varying external power-source potential VCE, but has a tendency to provide access to the external power-source potential VCE as the external power-source potential VCE increases. The internal power-source potential VCI grows higher than required, resulting in dangers of an increase in current consumption and a lower degree of reliability.

Additionally, the resistors R11 and R12 have fixed resistances, resulting in the fixed internal power-source potential VCI.

In this manner, the conventional internal power-source potential supply circuits are disadvantageous in that variations in the external power-source potential may cause decreased performance of the circuit, finding difficulties in supplying the internal power-source potential with high accuracy.

SUMMARY OF THE INVENTION

According to a first aspect of the present invention, an output potential supply circuit for supplying an output potential, comprises: a comparator circuit having a first node and a second node receiving an associated output potential associated with the output potential, the comparator circuit receiving first and second potentials provided respectively at the first and second nodes to provide the output potential on the basis of a comparison result between the first and second potentials; and a resistor element having a first end connected to the first node, and a second end connected to the second node.

Preferably, according to a second aspect of the present invention, the first node receives a reference potential through a reference potential resistor element.

Preferably, according to a third aspect of the present invention, the second node receives the associated output potential through a capacitor.

According to a fourth aspect of the present invention, an output potential supply circuit for supplying an output potential, comprises: a comparator circuit having first and second nodes and receiving first and second potentials provided respectively at the first and second nodes to output the output potential on the basis of a comparison result between the first and second potentials, the first node receiving a first reference potential through a first reference potential resistor element, the second node receiving a second reference potential different from the first reference potential through a second reference potential resistor element, the second node receiving an associated output potential associated with the output potential through a capacitor.

Preferably, according to a fifth aspect of the present invention, the output potential supply circuit further comprises: current supply means between the associated output potential received by the second node and a fixed potential for supplying a predetermined current to between the associated output potential and the fixed potential; and current control means receiving the associated output potential for controlling the amount of the predetermined current so that the associated output potential is stable on the basis of a potential difference between the associated output potential and the fixed potential.

According to a sixth aspect of the present invention, an output potential supply circuit for supplying an output potential for use in a semiconductor memory, comprises: a first resistor element having a first end receiving an internal power-source potential, and a second end specified as an output node; and a second resistor element having a first node connected to the output node, and a second end receiving a fixed potential, the output node providing a potential specified as the output potential, wherein a resistance ratio of the first resistor element to the second resistor element is variable.

Preferably, according to a seventh aspect of the present invention, the semiconductor memory includes a memory cell having a capacitance element and a bit line, the memory cell having a first electrode electrically connected to the bit line for read and write operations; a potential at the first electrode of the memory cell is specified as a storage node potential, and a potential at a second electrode of the memory cell is specified as a cell plate potential; the output node has a capacitance element; and the output potential is the cell plate potential.

Preferably, according to a eighth aspect of the present invention, the semiconductor memory includes a memory cell having a capacitance element and a bit line, the memory cell being formed on a semiconductor substrate, the memory cell having a first electrode electrically connected to the bit line for read and write operations; a potential at the first electrode of the memory cell is specified as a storage node potential, and a potential at a second electrode of the memory cell is specified as a cell plate potential; and the output potential is a precharge potential to which the bit line is set before the write operation.

In accordance with the output potential supply circuit of the first aspect of the present invention, the comparator circuit receives at the second node the associated output potential associated with the output potential and receives the first and second potentials provided respectively at the first and second nodes to output the output potential on the basis of the comparison result between the first and second potentials. The resistor element is connected between the first and second nodes. Thus, a potential difference exists between the first and second nodes during a time period over which at least the variation in the associated output potential is propagated from the second node through the resistor element to the first node.

Therefore, the comparator circuit may vary the output potential on the basis of the potential difference between the first and second nodes.

In accordance with the output potential supply circuit of the second aspect of the present invention, the first node receives the reference potential through the reference potential resistor element. Thus, the output potential may be set to the reference potential when the comparator circuit is stable.

In accordance with the output potential supply circuit of the third aspect of the present invention, the second node receives the associated output potential through the capacitor. The variation in associated output potential may be transmitted to the second node earlier by the capacitor coupling. This achieves control with a good response.

In accordance with the output potential supply circuit of the fourth aspect of the present invention, the comparator circuit receives at the second node the associated output potential associated with the output potential through the capacitor, and receives the first and second potentials provided respectively at the first and second nodes to output the output potential on the basis of the comparison result between the first and second potentials. In a stable state, the first and second reference potentials are applied to the first and second nodes through the first and second reference potential resistor elements, respectively.

Thus, a potential difference exists between the second node receiving the associated output potential and the first node during a high-frequency operation if the associated output potential varies. Then, the comparator circuit may vary the output potential on the basis of the potential difference between the first and second nodes.

Additionally, the offset potential may be provided between the first and second reference potentials to prevent the comparator circuit from operating in response to a relatively small variation in associated output potential.

The output potential supply circuit of the fifth aspect of the present invention further comprises the current supply means between the associated output potential received by the second node and the fixed potential for supplying the predetermined current to between the associated output potential and the fixed potential, and the current control means receiving the associated output potential for controlling the amount of the predetermined current so that the associated output potential is stable on the basis of the potential difference between the associated output potential and the fixed potential. The current control means may control the amount of the predetermined current to suppress the variation in associated output potential.

In accordance with the output potential supply circuit of the sixth aspect of the present invention, the resistance ratio of the first resistor element to the second resistor element is variable. Varying the resistance ratio may variably set the output potential for use in the semiconductor memory.

In accordance with the output potential supply circuit of the seventh aspect of the present invention, the cell plate potential (output potential) may be varied using the time constant of the capacitance element of the output node and the first and second resistance elements so that the cell plate potential reverses the variation in storage node potential. This improves the retention characteristic of the memory cell of the semiconductor memory receiving the output potential.

In accordance with the output potential supply circuit of the eighth aspect of the present invention, the precharge potential (output potential) may be set closer to the substrate potential of the semiconductor substrate to prolong the time period over which the storage node potential changes toward the substrate potential by the leak current to reach the insensitive region adjacent the precharge potential. As a result, the retention characteristic of the memory cell of the semiconductor memory receiving the output potential may be improved.

It is therefore an object of the present invention to provide an output potential supply circuit which is capable of variably supplying an output potential.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

<Basic Construction>

Figure 1:
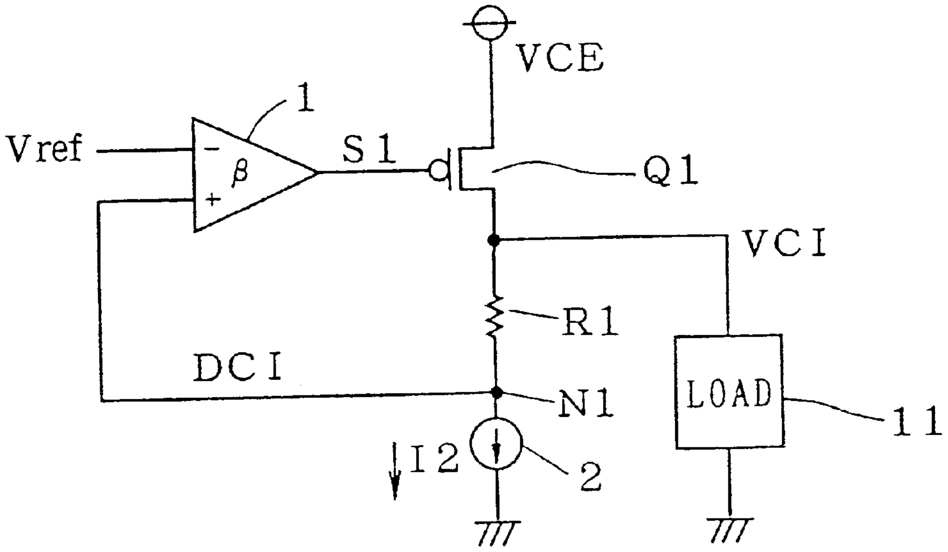
FIG. 1 is a circuit diagram showing the basic construction of an internal power-source potential supply circuit according to a first preferred embodiment of the present invention.

FIG. 1 is a circuit diagram showing the basic construction of an internal power-source potential supply circuit according to a first preferred embodiment of the present invention. As shown in FIG. 1, an external power-source potential VCE is connected to the source of a PMOS transistor Q1, and an internal power-source potential VCI is applied to a load 11 from the drain of the PMOS transistor Q1. A comparator 1 applies a control signal S1 to the gate of the PMOS transistor Q1. The comparator 1 has a negative input receiving a reference potential Vref and a positive input receiving a divided internal power-source potential DCI as a feedback signal, and outputs the control signal S1 on the basis of the result of comparison between the reference potential Vref and the divided internal power-source potential DCI.

The drain of the PMOS transistor Q1 is connected to a first end of a resistor R1, and a current source 2 is connected between a second end of the resistor R1 and the ground. A voltage provided at a node N1 serving as the second end of the resistor R1 is applied as the divided internal power-source potential DCI to the positive input of the comparator 1.

In this arrangement, the divided internal power-source potential DCI is lower than the internal power-source potential VCI by the amount of a potential determined by the amount of current I2 from the current source 2 and the resistance of the resistor R1. Thus, while the current source 2 always draws the fixed current I2, a potential difference between the internal power-source potential VCI and the divided internal power-source potential DCI is fixed at all times, and the internal power-source potential VCI is not dependent upon the external power-source potential VCE.

Figure 2:
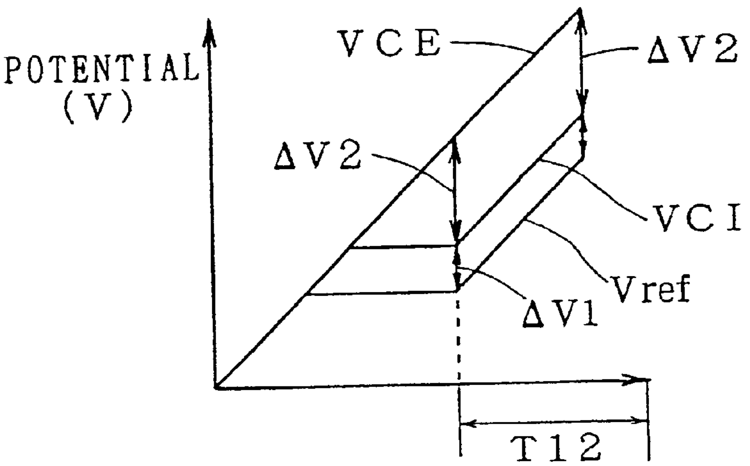
FIG. 2 is a graph showing the operation of the internal power-source potential supply circuit of FIG. 1.

FIG. 2 is a graph showing the operation of the basic construction of the first preferred embodiment. A potential difference ΔV1 between the internal power-source potential VCI and the reference potential Vref is fixed. As shown in FIG. 2, a time interval T12 is defined during which the reference potential Vref rises to follow the varying external power-source potential VCE. During the time interval T12, a potential difference ΔV2 between the internal power-source potential VCI and the external power-source potential VCE is fixed independently of an increase in the external power-source potential VCE.

In this manner, the internal power-source potential supply circuit according to the first preferred embodiment may supply the constantly stable internal power-source potential VCI having a fixed potential difference from the external power-source potential VCE.

<First Mode>

Figure 3:
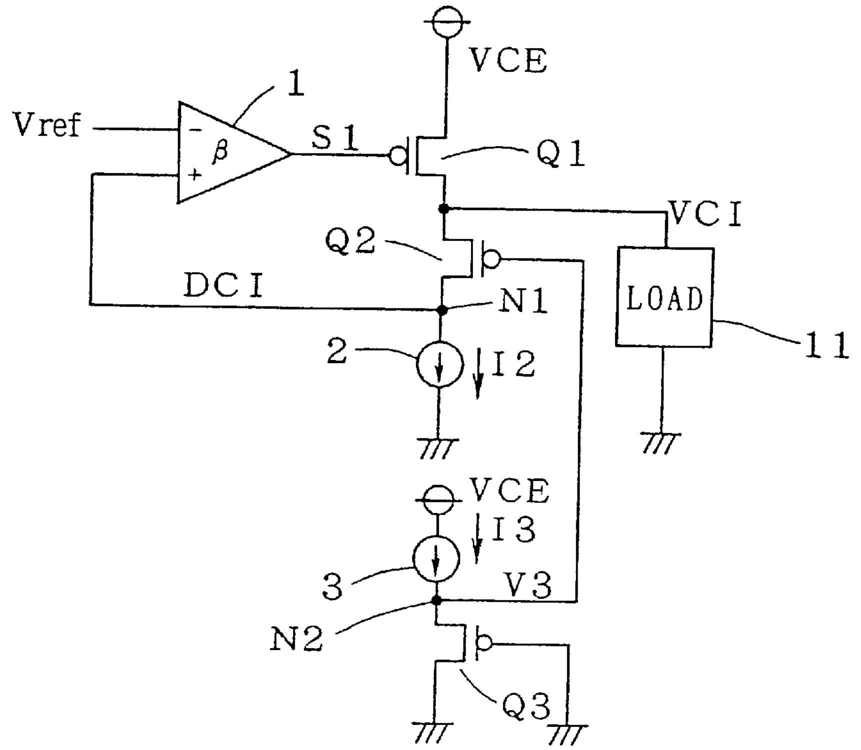
FIG. 3 is a circuit diagram of a first mode of the first preferred embodiment.

FIG. 3 is a circuit diagram of a first mode of the first preferred embodiment according to the present invention. As shown in FIG. 3, the external power-source potential VCE is connected to the source of the PMOS transistor Q1, and the internal power-source potential VCI is applied to the load 11 from the drain of the PMOS transistor Q1. The comparator 1 has a negative input receiving the reference potential Vref and a positive input receiving the divided internal power-source potential DCI as the feedback signal, and outputs the control signal S1 on the basis of the result of comparison between the reference potential Vref and the divided internal power-source potential DCI.

The drain of the PMOS transistor Q1 is connected to the source of a PMOS transistor Q2, and the drain of the PMOS transistor Q2 is grounded through the current source 2 for supplying the current I2. The voltage provided at the node N1 serving as the drain of the PMOS transistor Q2 is applied as the divided internal power-source potential DCI to the positive input of the comparator 1.

A constant current source 3 for supplying a current I3 and a PMOS transistor Q3 are connected between the external power-source potential VCE and the ground. The gate of the PMOS transistor Q3 is grounded. A fixed voltage V3 provided at a node N2 serving as the source of the PMOS transistor Q3 is applied to the gate of the PMOS transistor Q2.

In this arrangement, the fixed potential V3 is applied to the gate of the PMOS transistor Q3 which in turn is held in the ON position with a constant ON-state resistance.

In this manner, the internal power-source potential supply circuit of the first mode of the first preferred embodiment includes the PMOS transistor Q2 substituted for the resistor R1 of the first preferred embodiment. and is similar in function and effect to the first preferred embodiment.

The fixed potential V3 is not limited to that of FIG. 3 but may be supplied from the exterior, such as a GND level, or generated within the circuit.

<Second Mode>

Figure 4:
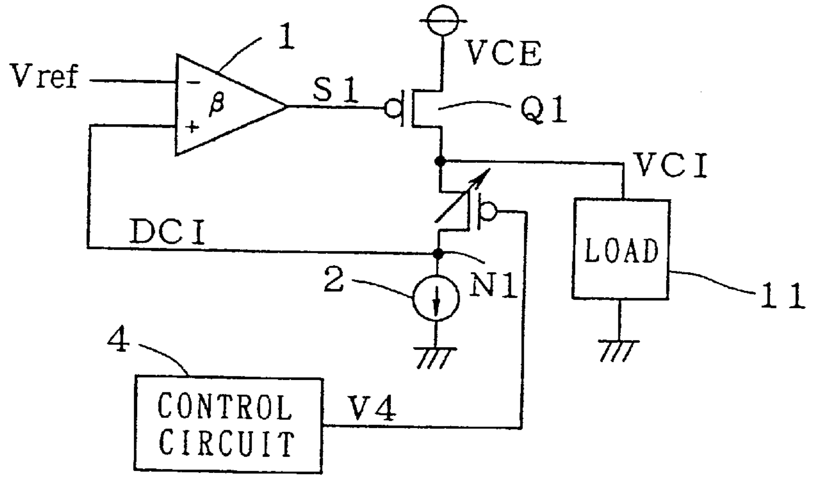
FIG. 4 is a circuit diagram of a second mode of the first preferred embodiment.

FIG. 4 is a circuit diagram of the internal power-source potential supply circuit according to a second mode of the first preferred embodiment. The second mode differs from the first mode in that a control circuit 4 for generating a control voltage V4 is substituted for the circuit including the current source 3 and the PMOS transistor Q3 for generating the fixed voltage V3. Other elements of the second mode are identical with those of the first mode.

The control circuit 4 outputs the control voltage V4 to the gate of the PMOS transistor Q2 on the basis of control parameters such as temperatures, the external power-source potential VCE, and environments.

The resistance of the PMOS transistor Q2 varies by the amount of change in control voltage V4 to vary the divided internal power-source potential DCI. In this arrangement, since the PMOS transistor Q2 is used as a resistive element, an increase in the control voltage V4 increases the voltage-dividing resistance of the PMOS transistor Q2, providing an increasing potential difference between the internal power-source potential VCI and the divided internal power-source potential DCI. With the reference potential Vref held constant, an increase in the control voltage V4 raises the internal power-source potential VCI from its original level, and a decrease in the control voltage V4 lowers the internal power-source potential VCI.

Figure 5:
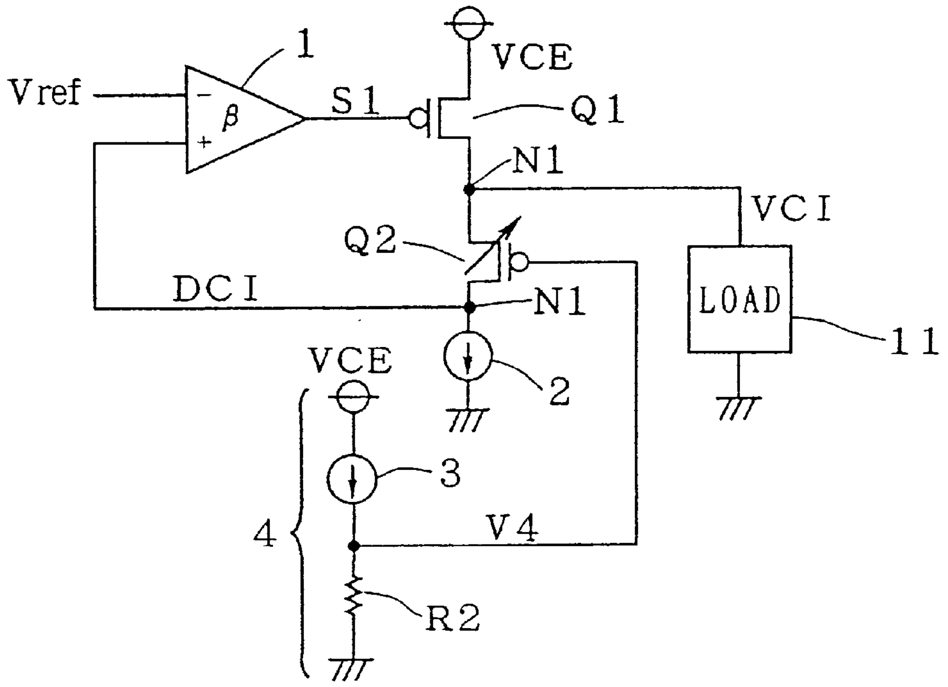
FIG. 5 is a circuit diagram illustrating a specific form of a control circuit shown in FIG. 4.

FIG. 5 is a circuit diagram showing a specific form of the control circuit 4. As shown in FIG. 5, the control circuit 4 comprises the current source 3 and a resistor R2 connected between the external power-source potential VCE and the ground. A potential provided at the node N2 between the current source 3 and the resistor R2 functions as the control voltage V4. The resistor R2 has a temperature-dependent resistance which increases as the temperature rises.

In this arrangement, current from the current source 3 flows into the resistor R2 having the temperature-dependent resistance to generate the control voltage V4 of the control circuit 4 which in turn is applied to the PMOS transistor Q2.

Figure 6:
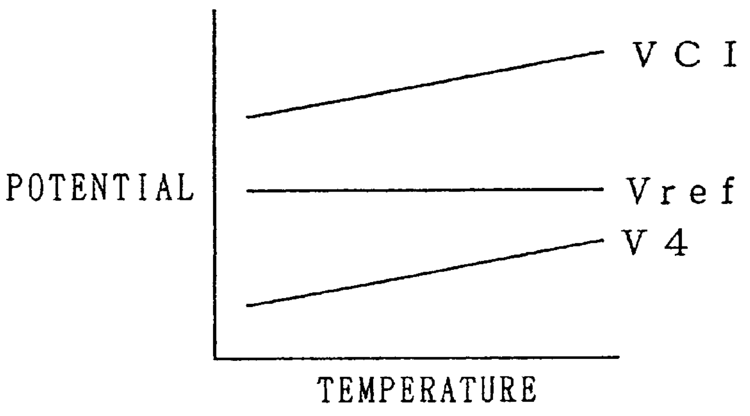
FIG. 6 is a graph showing the operation of the circuit of FIG. 5.

As the temperature rises, the gate potential of the PMOS transistor Q2 rises as shown in FIG. 6 and the ON-state resistance of the PMOS transistor Q2 accordingly rises. Since the current I2 from the current source 2 flows in the PMOS transistor Q2, the potential difference between the internal power-source potential VCI and the divided internal power-source potential DCI increases. Then, if the reference potential Vref is constant, the internal power-source potential VCI rises as shown in FIG. 6.

This action is used for delay compensation of the internal circuit operation at high temperatures. At high temperatures, the performance of transistors decreases to generally lower the circuit operation speeds. For recovery from the lowered operation speeds, the internal power-source potential VCI may be increased to increase the performance of the transistor (in the load 11) operated in response to the internal power-source potential VCI, preventing the increase in operation delay.

<Third Mode>

Figure 7:
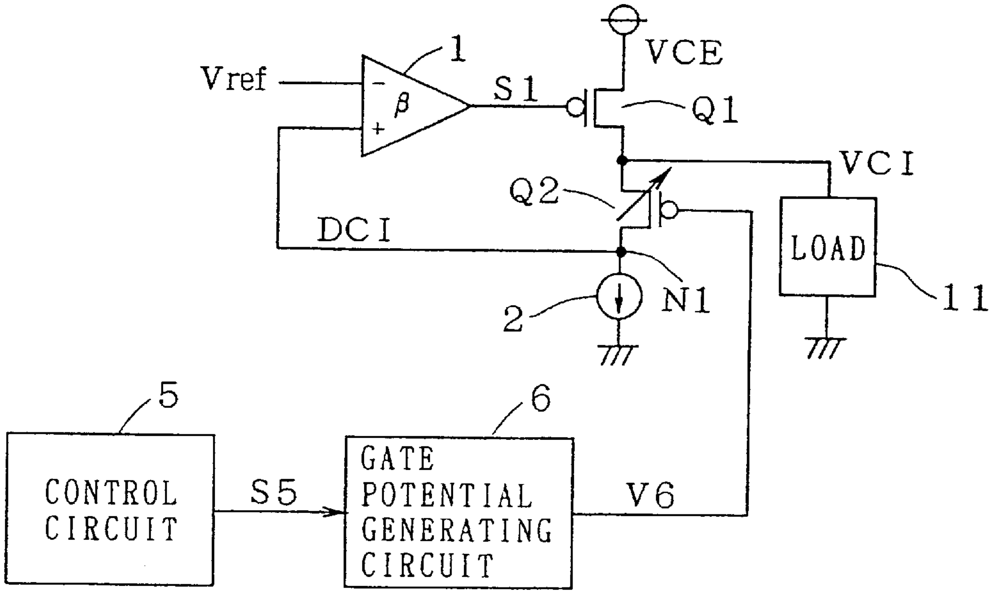
FIG. 7 is a circuit diagram of a third mode of the first preferred embodiment.

FIG. 7 is a circuit diagram of a third mode of the first preferred embodiment. The third mode differs from the first mode in that a gate potential generating circuit 6 for generating a control voltage V6 and a control circuit 5 are provided in place of the circuit including the current source 3 and the PMOS transistor Q3 for generating the fixed voltage V3. Other elements of the third mode are identical with those of the first preferred embodiment.

The gate potential generating circuit 6 outputs the control voltage V6 as a gate potential of the PMOS transistor Q2 in response to a control signal S5 from the control circuit 5. Thus, the third mode, similar to the second mode, may vary the internal power-source potential VCI by using the control voltage V6 when the reference potential Vref is constant.

Figure 8:
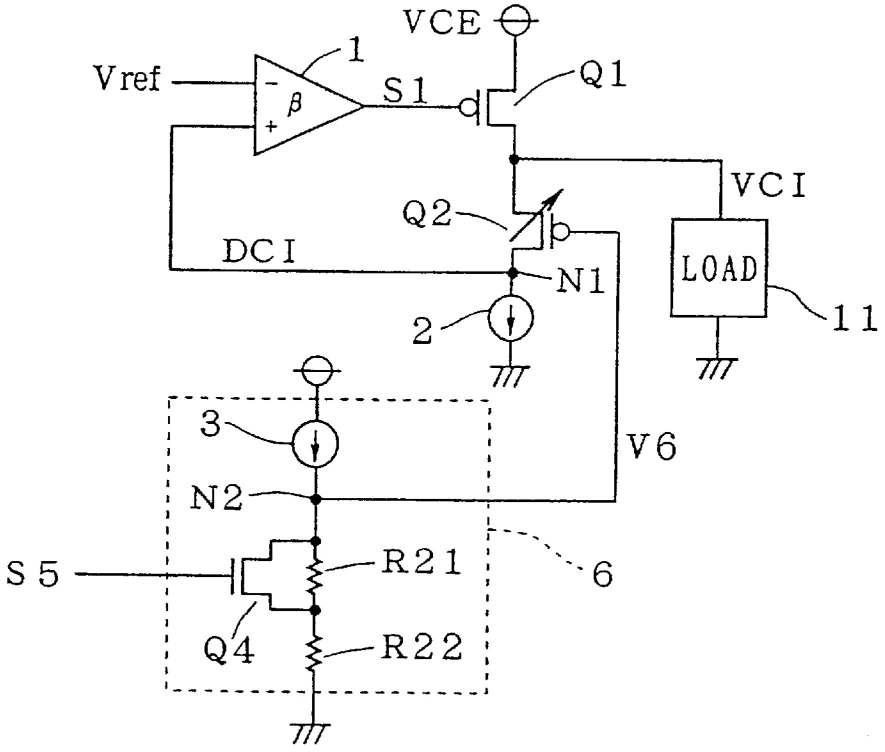
FIG. 8 is a circuit diagram illustrating a specific form of a gate potential generating circuit shown in FIG. 7.

FIG. 8 is a circuit diagram showing a specific form of the gate potential generating circuit 6. As shown in FIG. 8, the gate potential generating circuit 6 comprises the current source 3, a resistor R21 and a resistor R22 which are connected in series between the external power-source potential VCE and the ground. An NMOS transistor Q4 is connected to first and second ends of the resistor R21, and has a gate receiving the control signal S5.

Figure 9:
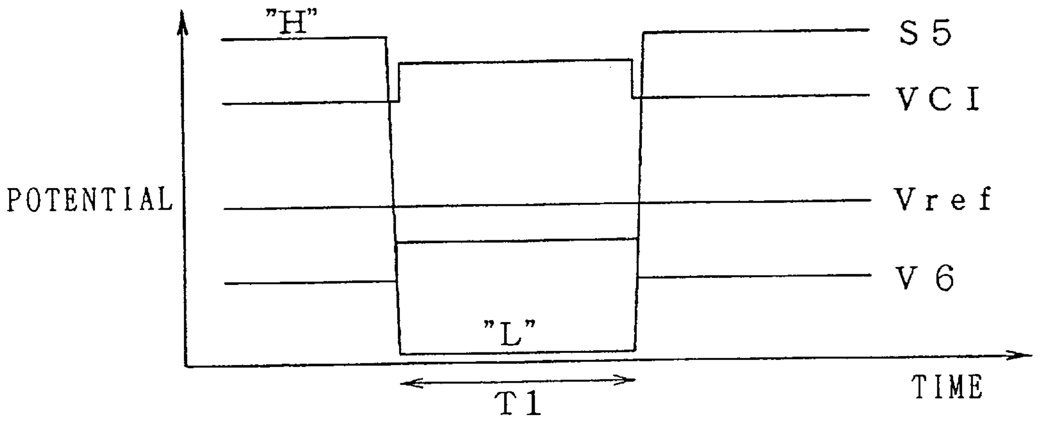
FIG. 9 is a timing chart showing the operation of the circuit of FIG. 8.

FIG. 9 is a timing chart showing the operation of the circuit of FIG. 8. During normal time periods other than a time period T1, the control signal S5 is set to "H" to turn on the NMOS transistor Q4, thereby disabling the resistor R21 and setting the internal power-source potential VCI by using the control voltage V6 during normal operation. During the time period T1, the control signal S5 is set to "L" to turn off the NMOS transistor Q4, enabling the resistor R21. This increases the control voltage V6 to increase the internal power-source potential VCI. The reference potential Vref is constant as shown in FIG. 9.

This action is used for delay compensation of the internal circuit operation at high speeds. The high-speed operation increases the operating current of the internal circuit (of the load 11) operated in response to the internal power-source potential VCI and accordingly causes a temporary drop in the internal power-source potential VCI. This decreases the performance of the transistor of the internal circuit to generally lower the circuit operation speeds.

For recovery from the lower circuit operation speeds, the internal power-source potential VCI may be raised to increase the performance of the transistor of the internal circuit, preventing the operation delay of the internal circuit. The circuit of FIG. 8 is adapted to set the control signal S5 to the "L" level during a period over which the high-speed operation is required to provide a high-speed mode, thereby increasing the gate potential of the PMOS transistor Q2 and, accordingly, the internal power-source potential VCI.

Second Preferred Embodiment

Figure 10:
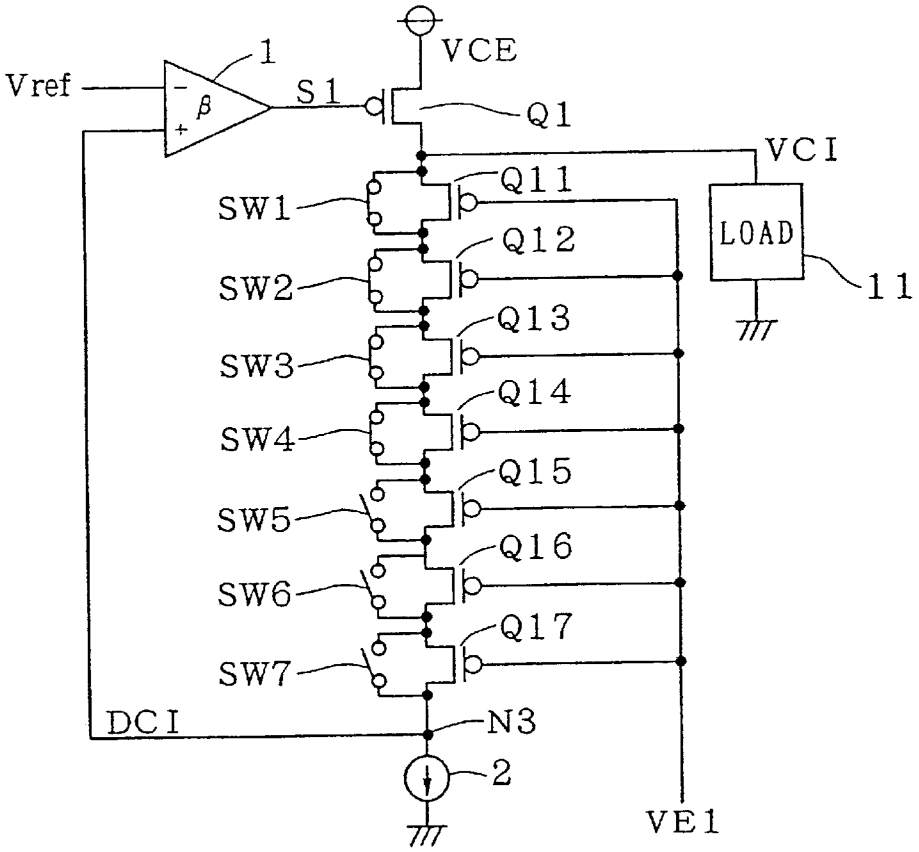
FIG. 10 is a circuit diagram of the internal power-source potential supply circuit according to a second preferred embodiment of the present invention.

FIG. 10 is a circuit diagram of the internal power-source potential supply circuit according to a second preferred embodiment of the present invention. As shown in FIG. 10, the external power-source potential VCE is connected to the source of the PMOS transistor Q1, and the internal power-source potential VCI is applied to the load 11 from the drain of the PMOS transistor Q1. The control signal S1 is applied to the gate of the PMOS transistor Q1 from the comparator 1. The comparator 1 has the negative input receiving the reference potential Vref and the positive input receiving the divided internal power-source potential DCI as the feedback signal, and outputs the control signal S1 on the basis of the result of comparison between the reference potential Vref and the divided internal power-source potential DCI.

Seven PMOS transistors Q11 to Q17 are connected in series between the drain of the PMOS transistor Q1 and the current source 2 for supplying the current I2. Switches SW1 to SW7 are connected between the source and drain of the PMOS transistors Q11 to Q17, respectively. A fixed voltage VE1 is applied to the gate of the PMOS transistors Q11 to Q17. The fixed voltage VE1 may be at the ground level or an intermediate potential between the external power-source potential VCE and the ground level. Each of the switches SW1 to SW7, when in the ON position, establishes a short circuit between the source and drain of the associated transistor to disable the associated transistor and, when in the OFF position, enables the associated transistor. The second end of the current source 2 is connected to the ground.

A potential provided at a node N3 between the drain of the PMOS transistor Q17 and the first end of the current source 2 is applied as the divided internal power-source potential DCI to the positive input of the comparator 1.

In the internal power-source potential supply circuit of the second preferred embodiment as above constructed, the number of switches to be turned on among the switches SW1 to SW7 determines the number of PMOS transistors to be enabled among the PMOS transistors Q11 to Q17. Thus, current flows through the enabled PMOS transistors as resistive elements to cause a potential drop. The divided internal power-source potential DCI is lower than the internal power-source potential VCI by the amount of the potential drop.

In the arrangement of FIG. 10, the four switches SW1 to SW4 are in the ON position to establish a short circuit between the source and drain of the PMOS transistors Q11 to Q14 as the resistive elements, disabling the PMOS transistors Q11 to Q14 and preventing them from acting as resistors. The three switches SW5 to SW7 are in the OFF position to enable the PMOS transistors Q15 to Q17 as the resistive elements.

An increase in the number of switches to be turned off among the switches SW1 to SW7 increases the number of PMOS transistors to be enabled to accordingly increase the resistance thereof, raising the internal power-source potential VCI. Conversely, an increase in the number of switches to be turned on among the switches SW1 to SW7 decreases the number of PMOS transistors to be enabled to decrease the resistance thereof, reducing the internal power-source potential VCI. In this fashion, the total resistance of the PMOS transistors Q11 to Q17 serving as the resistive elements may be variably set depending on the ON/OFF position of the switches SW1 to SW7, varying the internal power-source potential VCI freely.

Figure 11:
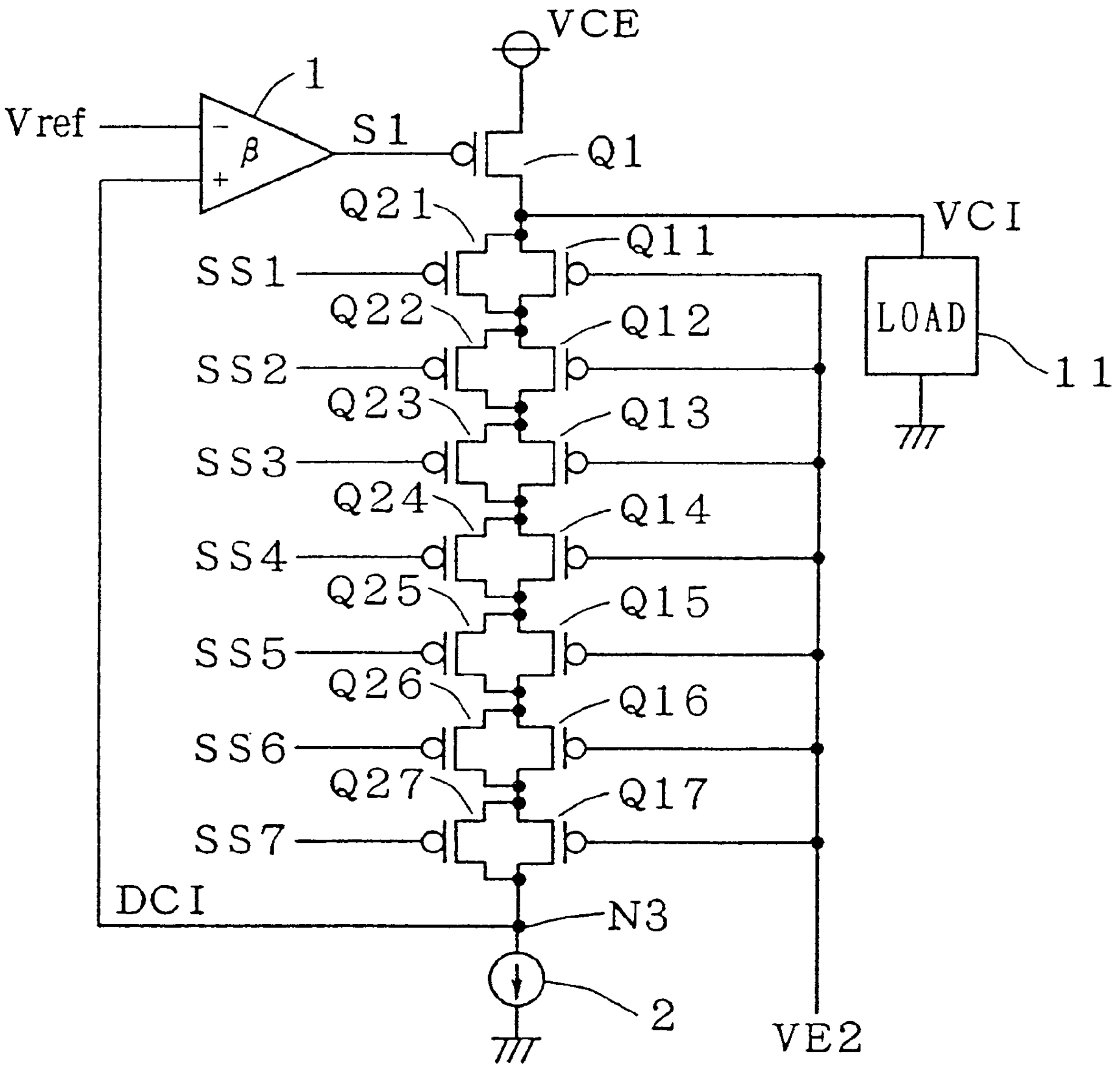
FIG. 11 is a circuit diagram illustrating a first specific form of switches in the circuit of FIG. 10.

FIG. 11 is a circuit diagram showing a first specific form of the switches SW1 to SW7 in the circuit of FIG. 10. As shown in FIG. 11, the switches SW1 to SW7 include PMOS transistors Q21 to Q27, respectively.

The PMOS transistors Q21 to Q27 receive switch signals SS1 to SS7 at their gate, respectively. The PMOS transistors Q21 to Q27 are connected in parallel with the PMOS transistors Q11 to Q17, respectively.

The switch signals SS1 to SS7 are fixed signals like DC signals. When the switch signal SSi (i=1 to 7) is "H", the PMOS transistor Q2*i* is in the OFF position to enable the corresponding PMOS transistor Q1*i*. When the switch signal SSi is "L", the PMOS transistor Q2*i* is in the ON position to disable the corresponding PMOS transistor Q1*i*.

Figure 12:
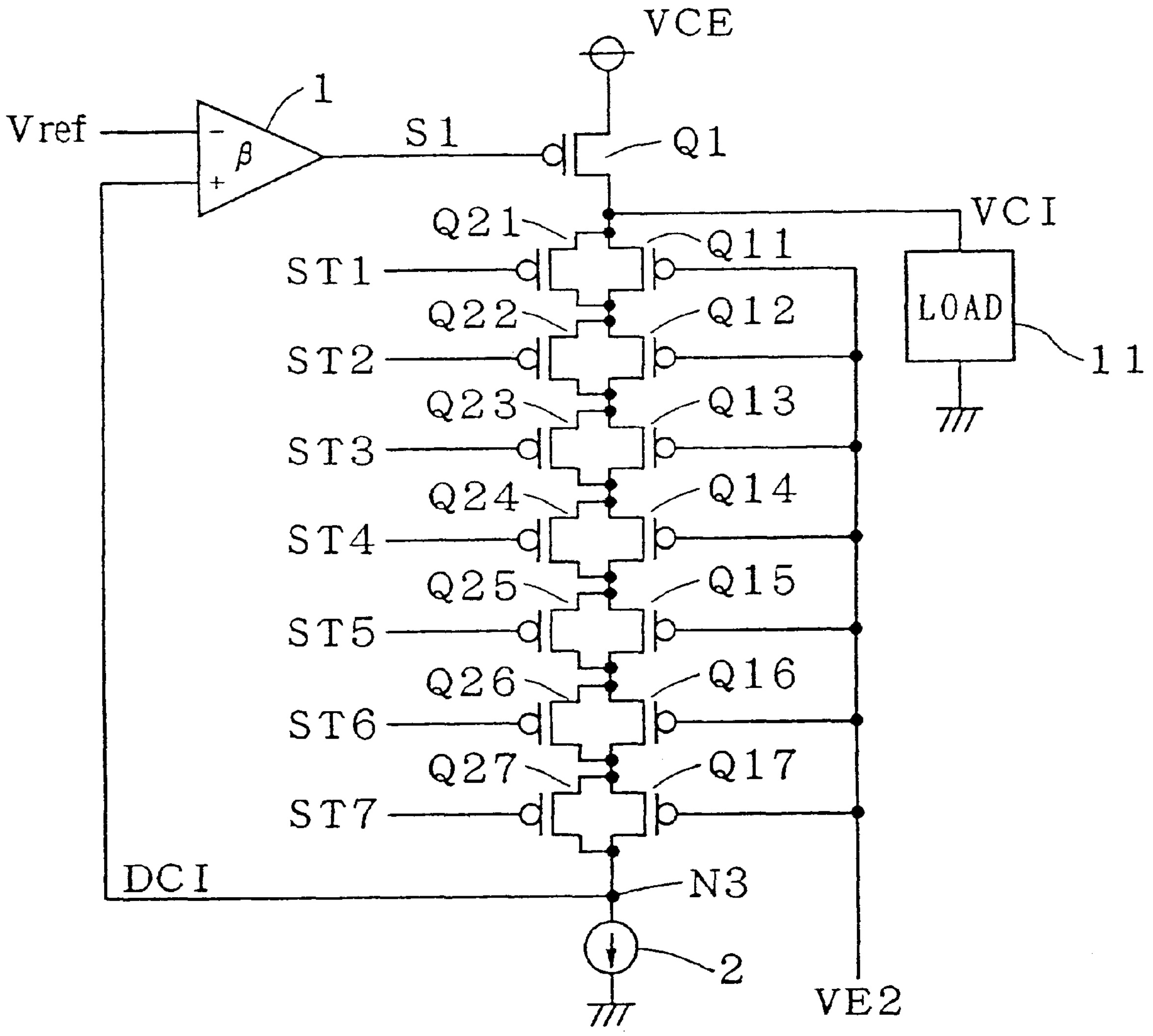
FIG. 12 is a circuit diagram illustrating a second specific form of the switches in the circuit of FIG. 10.

FIG. 12 is a circuit diagram showing a second specific form of the switches SW1 to SW7 in the circuit of FIG. 10. As shown in FIG. 12, the switches SW1 to SW7 include the PMOS transistors Q21 to Q27, respectively.

The PMOS transistors Q21 to Q27 receive chronological signals ST1 to ST7 at their gate, respectively. The PMOS transistors Q21 to Q27 are connected in parallel with the PMOS transistors Q11 to Q17, respectively.

The chronological signals ST1 to ST7 vary with time. When the chronological signal STi (i=1 to 7) is "H", the PMOS transistor Q2*i* is in the OFF position to enable the corresponding PMOS transistor Q1*i*. When the chronological signal STi is "L", the PMOS transistor Q2*i* is in the ON position to disable the corresponding PMOS transistor Q1*i*.

Third Preferred Embodiment

Figure 13:
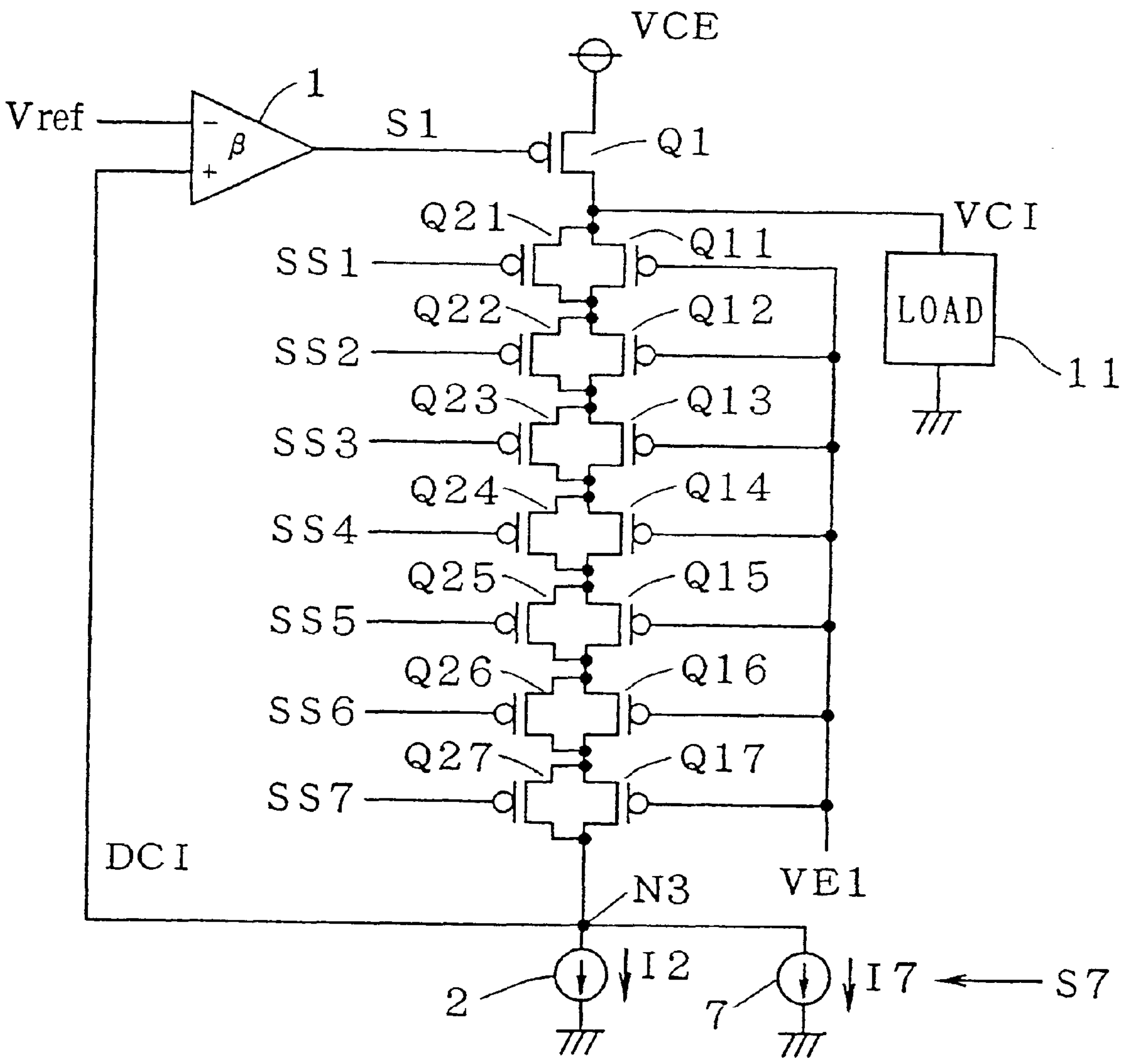
FIG. 13 is a circuit diagram of the internal power-source potential supply circuit according to a third preferred embodiment of the present invention.

FIG. 13 is a circuit diagram of the internal power-source potential supply circuit according to a third preferred embodiment of the present invention. As shown in FIG. 13, another current source 7 is connected between the node N3 and the ground in addition to the current source 2. The current source 7 is active/inactive in response to a control signal S7, and supplies a current I7 from the node N3 to the ground when it is active. Other elements of FIG. 13 are identical with those of the first specific form of the second preferred embodiment.

In such an arrangement, as in the first specific form of the second preferred embodiment, the switch signals SS1 to SS7 determine the resistance between the drain of the PMOS transistor Q1 and the node N3.

The control signal S7 controls the active/inactive state of the current source 7 to determine the amount of current flowing through the PMOS transistors Q11 to Q17. If the current source 7 is active, the amount of current equals the sum of the current I2 and current I7. If the current source 7 is inactive, the amount of current equals the current I2.

This arrangement is adapted to change the amount of current flowing through the PMOS transistors Q11 to Q17 serving as the resistive elements in order to vary the potential drop between the divided internal power-source potential DCI and the internal power-source potential VCI. If the switch signals SS1 to SS7 and the voltage 1 are fixed voltages and the resistive elements having the same resistance carry varied current, the potential difference (VCI−DCI) across the group of resistive elements is varied. Then, if the fixed reference potential Vref is applied to the comparator 1, the internal power-source potential VCI rises as the amount of current flowing through the PMOS transistors Q11 to Q17 serving as the resistive elements increases.

In this manner, the internal power-source potential supply circuit of the third preferred embodiment varies the internal power-source potential VCI by variable control of the amount of current flowing through the resistive elements. The control signal S7 for controlling the active/inactive state of the current source 7 may be a DC signal or a chronological signal.

The current source 7 may be normally inactive and made active in a particular case, and vice versa. If the current source 7 is normally active and made inactive in a particular case, the amount of drawn current in the particular case is lower than that under normal conditions, reducing the internal power-source potential VCI. This operation is effective, for example, when it is desired to reduce the internal power-source potential VCI for operation in an operation mode which does not require high speeds such as a self-refresh mode in a DRAM. The operation with the lower internal power-source potential VCI allows reduction in current consumption.

Potential control by increasing or decreasing the reference current flowing through the resistive elements may be applied to other systems, for example, operation control for DRAM substrate potential generation. Specifically, this operation control is such that a comparison is made between a substrate potential and the reference potential Vref and the substrate potential, if deviated from a set value, is caused to provide access to the set value. In this case, the reference potential Vref or the reference current flowing through the resistive elements may be varied to change the set potential in DC form or temporarily.

This operation may improve the retention characteristics of memory cells by setting a shallow substrate potential during the DRAM self-refresh operation to prolong a refresh period, decreasing current consumption during the self-refresh mode operation, for example. This operation is practicable since the self-refresh operation which causes less noise and is more stable than the normal operation presents no problems if the substrate potential is shallow.

It is sometimes desired to make the substrate potential deep. Such is the case in testing a DRAM for memory cell retention characteristics wherein it is desired to make the substrate potential deeper than usual so that the retention characteristics are prone to deteriorate to shorten the test time.

Fourth Preferred Embodiment

Figure 14:
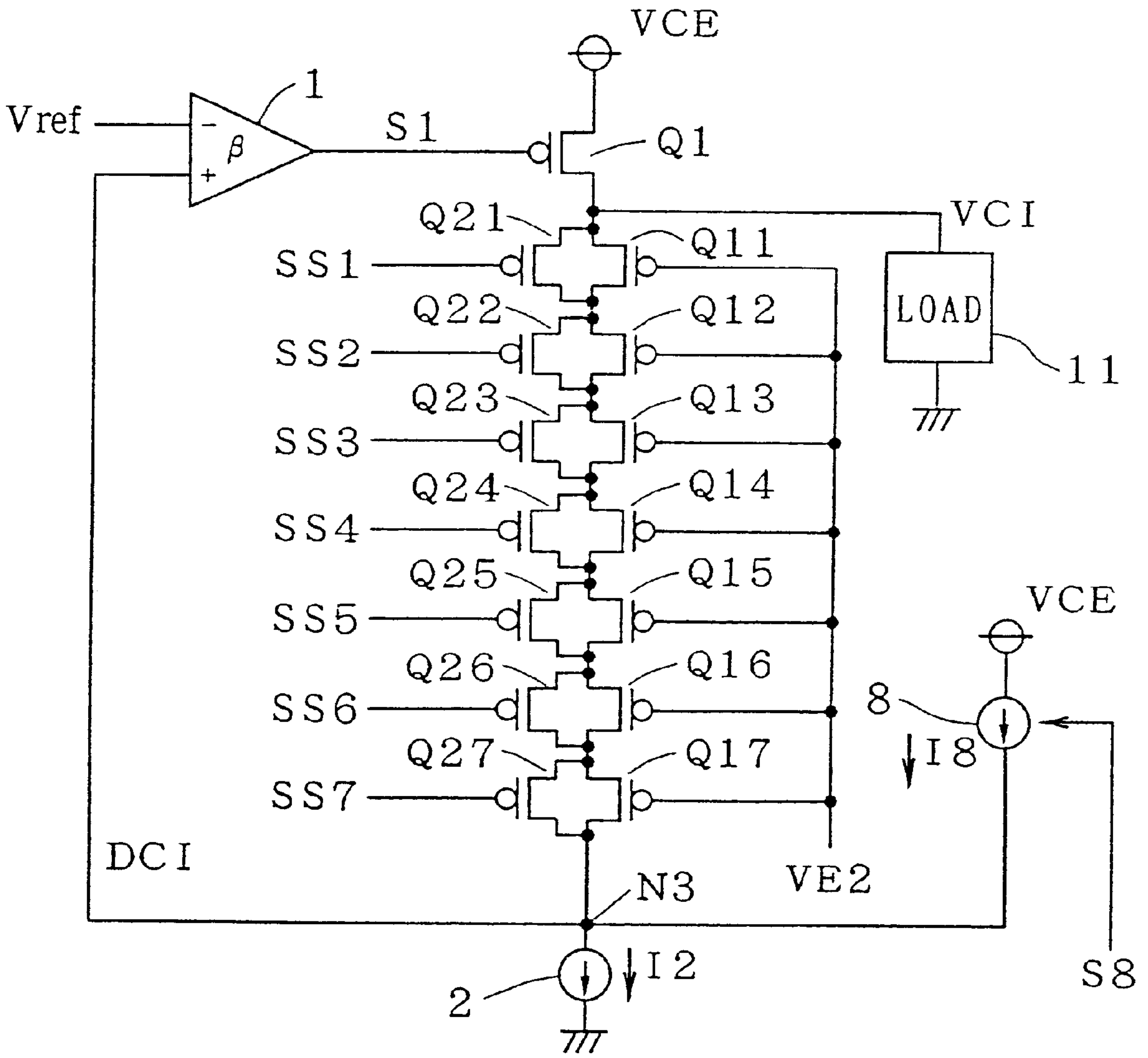
FIG. 14 is a circuit diagram of the internal power-source potential supply circuit according to a fourth preferred embodiment of the present invention.

FIG. 14 is a circuit diagram of the internal power-source potential supply circuit according to a fourth preferred embodiment of the present invention. As shown in FIG. 14, another current source 8 is connected between the external power-source potential VCE and the node N3 in addition to the current source 2. The current source 8 is active/inactive in response to a control signal S8, and supplies a current I8 from the external power-source potential VCE to the node N3 when it is active. Other elements of FIG. 14 are identical with those of the first specific form of the second preferred embodiment shown in FIG. 11.

In this arrangement, as in the first specific form of the second preferred embodiment, the switch signals SS1 to SS7 determine the resistance between the drain of the PMOS transistor Q1 and the node N3.

The control signal S8 controls the active/inactive state of the current source 8 to determine the amount of current flowing through the PMOS transistors Q11 to Q17. Specifically, if the current source 8 is active, the amount of current equals the current I2 minus the current I8. If the current source 8 is inactive, the amount of current equals the current I2.

The fourth preferred embodiment, like the third preferred embodiment, changes the amount of current flowing through the PMOS transistors Q11 to Q17 serving as the resistive elements in order to vary the potential drop between the divided internal power-source potential DCI and the internal power-source potential VCI. If the switch signals SS1 to SS7 and the voltage VE1 are fixed voltages and the resistive elements having the same resistance carry varied current, the potential difference (VCI–DCI) across the group of resistive elements is varied. Then, if the fixed reference potential Vref is applied to the comparator 1, the internal power-source potential VCI decreases as the amount of current flowing through the PMOS transistors Q11 to Q17 serving as the resistive elements decreases.

In this manner, the internal power-source potential supply circuit of the fourth preferred embodiment varies the internal power-source potential VCI by variable control of the amount of current flowing through the resistive elements. The control signal S8 for controlling the active/inactive state of the current source 8 may be a DC signal or a chronological signal.

Fifth Preferred Embodiment

Figure 15:
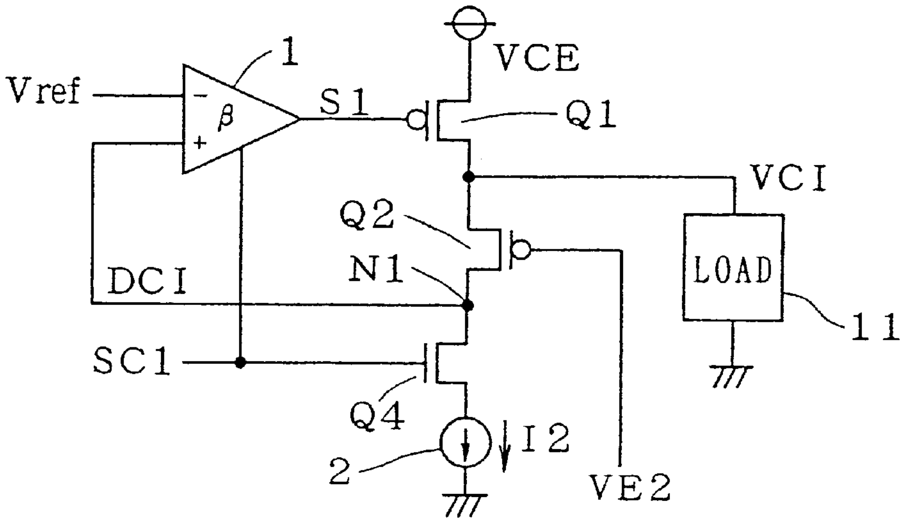
FIG. 15 is a circuit diagram of the internal power-source potential supply circuit according to a fifth preferred embodiment of the present invention.

FIG. 15 is a circuit diagram of the internal power-source potential supply circuit according to a fifth preferred embodiment of the present invention. As shown in FIG. 15, the external power-source potential VCE is connected to the source of the PMOS transistor Q1, and the internal power-source potential VCI is applied to the load 11 from the drain of the PMOS transistor Q1. The control signal S1 is applied to the gate of the PMOS transistor Q1 from the comparator 1. The comparator 1 has the negative input receiving the reference potential Vref and the positive input receiving the divided internal power-source potential DCI as the feedback signal, and outputs the control signal S1 on the basis of the result of comparison between the reference potential Vref and the divided internal power-source potential DCI when it is active. The comparator 1 receives a control signal SC1. If the control signal SC1 is "H" to indicate an active state, the comparator 1 is active. If the control signal SC1 is "L" to indicate an inactive state, the comparator is inactive to stop outputting the control signal S1.

The drain of the PMOS transistor Q1 is connected to the source of the PMOS transistor Q2. The drain of the NMOS transistor Q4 is connected to the drain of the PMOS transistor Q2. The source of the NMOS transistor Q4 is grounded through the current source 2 for supplying the current I2. A voltage provided at the node N1 between the drain of the PMOS transistor Q2 and the drain of the NMOS transistor Q4 is applied as the divided internal power-source potential DCI to the positive input of the comparator 1. The gate of the PMOS transistor Q2 receives a fixed voltage VE2.

The NMOS transistor Q4 is in the ON position when the control signal SCI is "H" and is in the OFF position when the control signal SCI is "L". The ON-state resistance while the NMOS transistor Q4 is in the ON position is at a negligible level.

In this structure, when the control signal SCI is "H", the divided internal power-source potential DCI is lower than the internal power-source potential VCI by the amount of potential determined by the current I2 from the current source 2 and the ON-state resistance of the PMOS transistor Q2. Thus, while the current source 2 always draws the fixed current I2, the potential difference between the internal power-source potential VCI and the divided internal power-source potential DCI is fixed at all times, and the internal power-source potential VCI is not dependent upon the external power-source potential VCE.

When the control signal SCI is "L", the comparator 1 is inactive to stop the operation of the internal power-source potential supply circuit. Then, the NMOS transistor Q4 is in the OFF position to disconnect the external power-source potential VCE form the ground. This prevents a short circuit current and decreases current consumption. The current consumption of the comparator 1 itself, when it is inactive, may be reduced.

Sixth Preferred Embodiment

Figure 16:
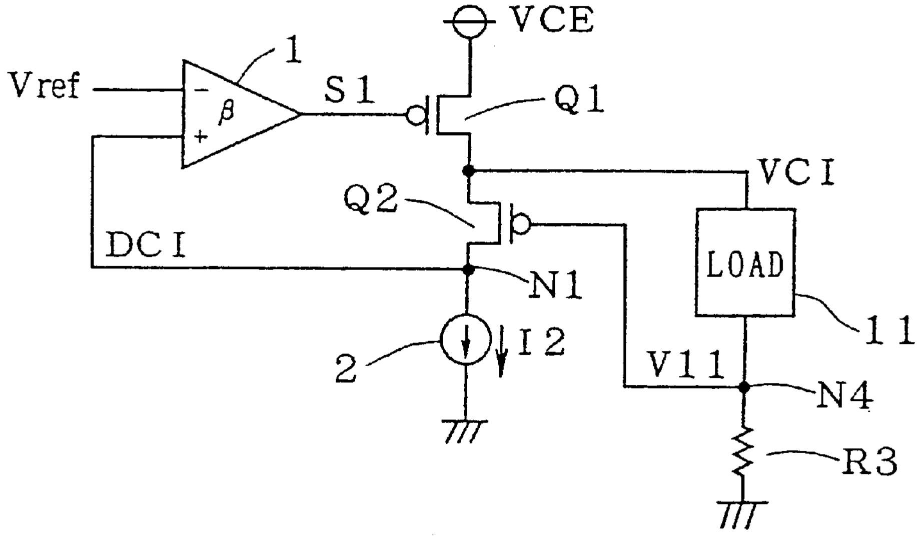
FIG. 16 is a circuit diagram of the internal power-source potential supply circuit according to a sixth preferred embodiment of the present invention.

FIG. 16 is a circuit diagram of the internal power-source potential supply circuit according to a sixth preferred embodiment of the present invention. As shown in FIG. 16, the external power-source potential VCE is applied as the internal power-source potential VCI to the load 11 through the PMOS transistor Q1. The comparator 1 has the negative input receiving the reference potential Vref and the positive input receiving the divided internal power-source potential DCI as the feedback signal.

The drain of the PMOS transistor Q1 is connected to the source of the PMOS transistor Q2. The drain of the PMOS transistor Q2 is grounded through the current source 2 for supplying the current I2. A voltage provided at the node N1 between the drain of the PMOS transistor Q2 and the current source 2 is applied as the divided internal power-source potential DCI to the positive input of the comparator 1.

The load 11 receiving the internal power-source potential VCI is connected to a first end of a wiring resistor R3 having a grounded second end. A potential V11 provided at a node N4 serving as the second end of the wiring resistor R3 is applied to the gate of the PMOS transistor Q2.

In the structure of the sixth preferred embodiment, the ON-state resistance of the PMOS transistor Q2 serving as the resistive element may be changed by the potential V11 from the load 11, that is, by using the wiring resistor R3 on the power line of the load 11.

When the load 11 is operated to cause a current flow, the current temporarily raises the ground level. This is a potential difference generated by a current flow into the wiring resistor R3 at the ground level. This potential difference is applied as the potential V11 to the gate of the PMOS transistor Q2. Thus, the more the current consumed by the load 11, the higher the potential V11.

The internal power-source potential supply circuit according to the sixth preferred embodiment is designed to use the potential V11 from the wiring resistor R3 as the gate potential of the PMOS transistor Q2 serving as the resistive element.

Therefore, the internal power-source potential supply circuit of the sixth preferred embodiment allows the potential V11 to automatically rise if the load 11 consumes a large amount of current to increase the resistance of the resistive elements. This forces the internal power-source potential VCI to rise to suppress the operation delay of the internal circuit in the load 11. The wiring resistor R3 may be a parasitic power line resistor or a resistive element.

Seventh Preferred Embodiment

Figure 17:
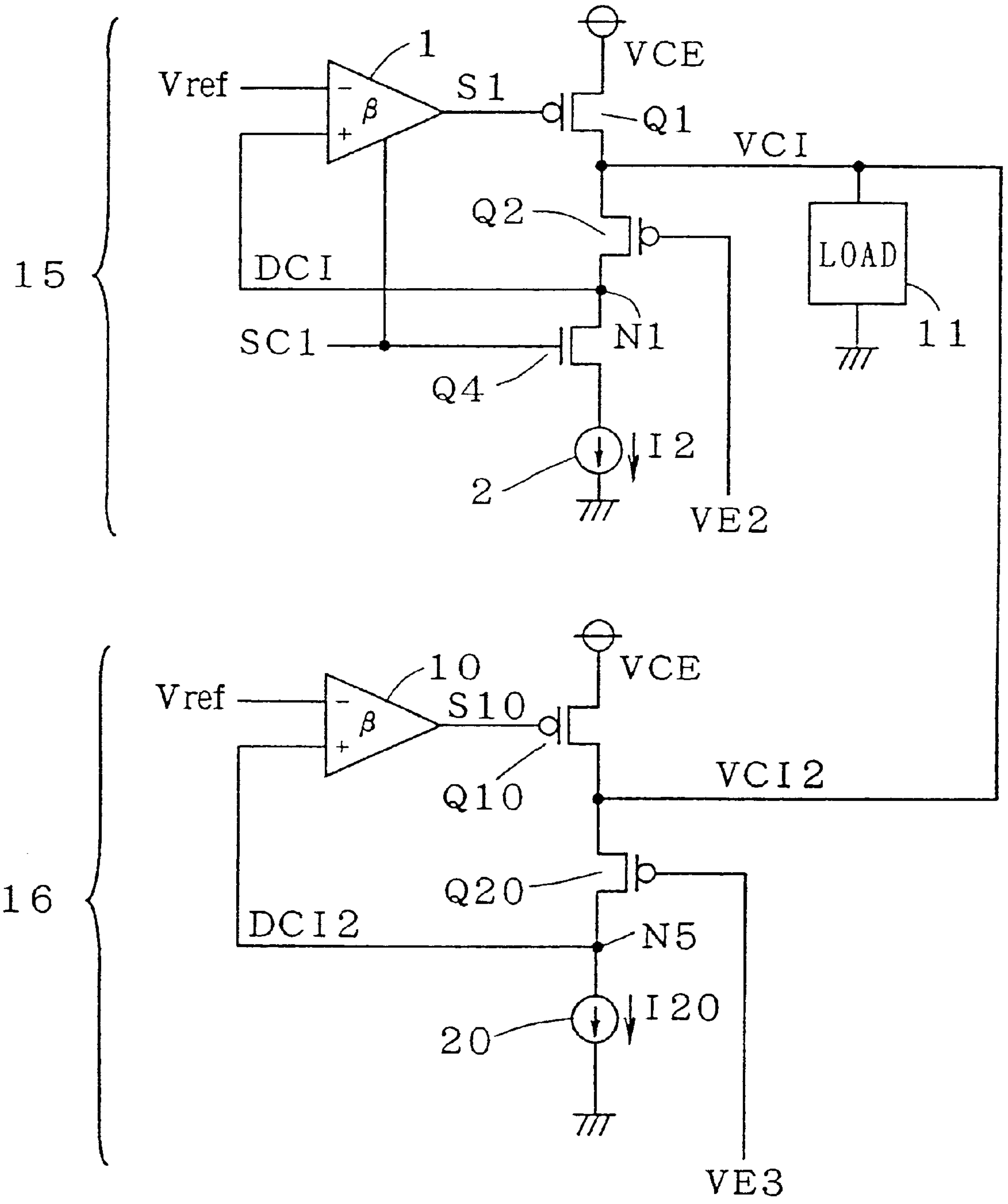
FIG. 17 is a circuit diagram of the internal power-source potential supply, circuit according to a seventh preferred embodiment of the present invention.

FIG. 17 is a circuit diagram of the internal power-source potential supply circuit according to a seventh preferred embodiment of the present invention. As shown in FIG. 17, the internal power-source potential supply circuit of the seventh preferred embodiment comprises a first internal power-source potential supply circuit 15 and a second internal power-source potential supply circuit 16. The first internal power-source potential supply circuit 15 is similar in internal construction to the internal power-source potential supply circuit of the fifth preferred embodiment shown in FIG. 15, and the description thereof is dispensed with.

The second internal power-source potential supply circuit 16 comprises a comparator 10, a PMOS transistor Q10, a PMOS transistor Q20, and a current source 20. The external power-source potential VCE is connected to the source of the PMOS transistor Q10, and an internal power-source potential VC12 is applied to the load 11 from the drain of the PMOS transistor Q10. The comparator 10 applies a control signal S10 to the gate of the PMOS transistor Q10. The comparator 10 has a negative input receiving the reference potential Vref and a positive input receiving a divided internal power-source potential DCI2 as a feedback signal, and outputs the control signal S10 on the basis of the result of comparison between the reference potential Vref and the divided internal power-source potential DCI2.

The drain of the PMOS transistor Q10 is connected to the source of the PMOS transistor Q20, and the drain of the PMOS transistor Q20 is grounded through the current source 20 for supplying a current I20. A voltage provided at a node N5 serving as the drain of the PMOS transistor Q20 is applied as the divided internal power-source potential DCI2 to the positive input of the comparator 10. A fixed voltage VE3 is applied to the gate of the PMOS transistor Q20.

The size of the PMOS transistor Q10 of the second internal power-source potential supply circuit 16 is several tens of times to a hundred times smaller than that of the PMOS transistor Q1. The current I20 supplied from the current source 20 is sufficiently smaller than the current I2 supplied from the current source 2.

Thus, the first internal power-source potential supply circuit 15 under operating (active) conditions consumes a relatively large amount of current and supplies a large amount of current for the internal power-source potential VCI. The second internal power-source potential supply circuit 16 under operating conditions consumes a relatively small amount of current and supplies a small amount of current for the internal power-source potential VCI2.

In this arrangement, when a chip having the load 11 is inactive or does not perform a normal operation, the control signal SC1 is "L" to inactivate the first internal power-source potential supply circuit 15, and only the internal power-source potential VCI2 supplied from the second internal power-source potential supply circuit 16 is applied to the load 11. A sufficient amount of current to he supplied is provided by the internal power-source potential VCI2 supplied from the second internal power-source potential supply circuit 16 when the chip is inactive.

Then, the first internal power-source potential supply circuit 15 may disconnect the external power-source potential VCE from the ground to prevent a short circuit current, reducing current consumption. The comparator 1 itself is inactive to reduce current consumption. This achieves operation with low power consumption.

When the chip is active or performs the normal operation, the control signal SC1 is "H" to apply to the load 11 a potential synthesized from the internal power-source potentials VCI and VCI2 supplied respectively from the first and second internal power-source potential supply circuits 15 and 16. When the chip is active, the load 11 consumes a large amount of current, and a sufficient amount of current to be supplied is not reached by the current for the internal power-source potential VCI2 of the second internal power-source potential supply circuit 16. Thus, the first internal power-source potential supply circuit 15 is activated to provide a sufficient amount of current for the internal power-source potential VCI.

In this manner, depending on the conditions of the chip, the first internal power-source potential supply circuit 15 may be inactivated so that only the second internal power-source potential supply circuit 16 supplies the internal power-source potential VCI2 or may be activated so that the first and second internal power-source potential supply circuits 15 and 16 supply the potential synthesized from the internal power-source potentials VCI and VCI2.

Eighth Preferred Embodiment

Figure 18:
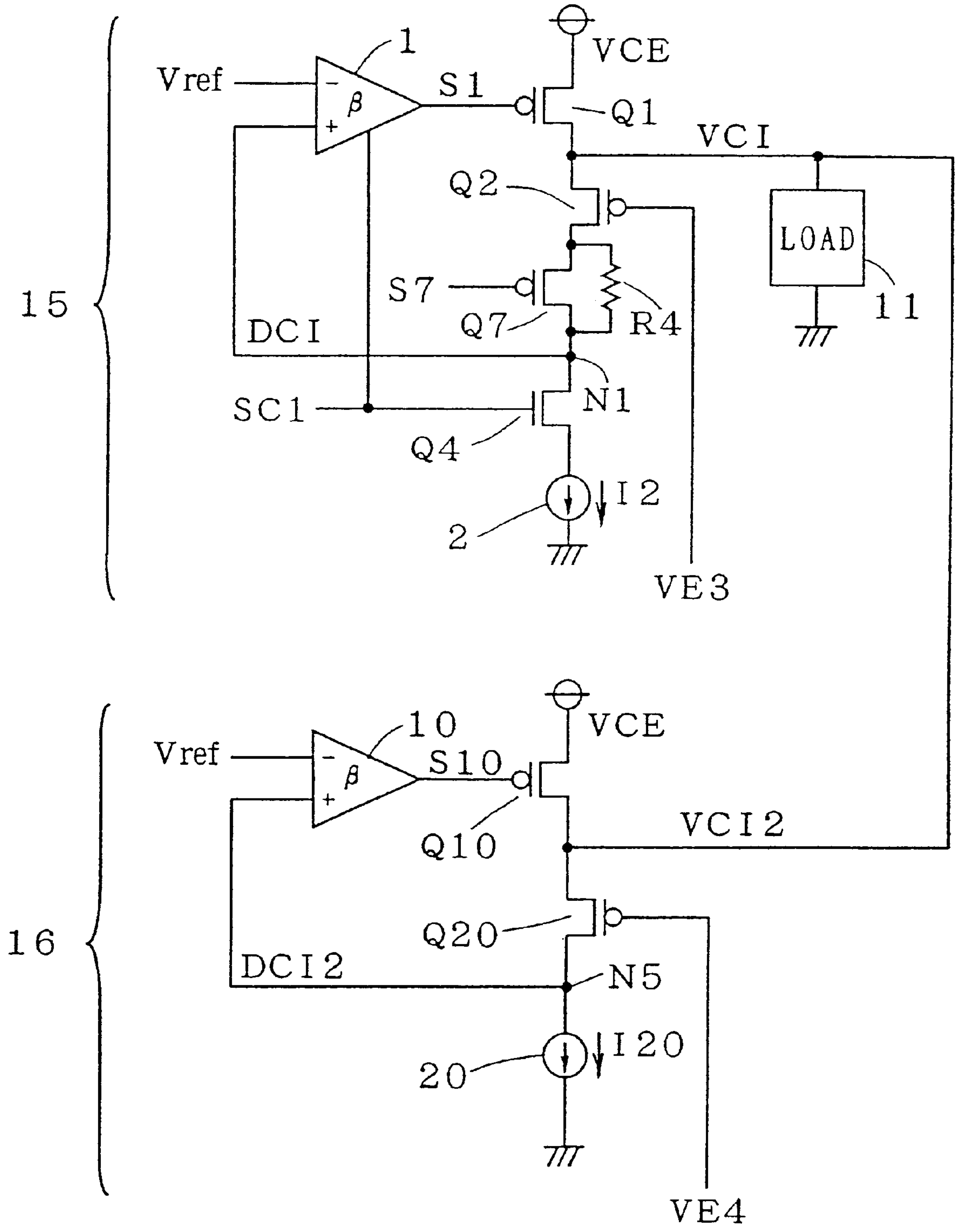
FIG. 18 is a circuit diagram of the internal power-source potential supply circuit according to an eighth preferred embodiment of the present invention.

FIG. 18 is a circuit diagram of the internal power-source potential supply circuit according to an eighth preferred embodiment of the present invention. As shown in FIG. 18, a PMOS transistor Q7 and a resistor R4 are connected in parallel between the drain of the PMOS transistor Q2 and the node N1 in the first internal power-source potential supply circuit 15. The PMOS transistor Q7 has a gate receiving a control signal S7. Other elements of FIG. 18 are identical with those of the seventh preferred embodiment shown in FIG. 17.

The internal power-source potential supply circuit of the eighth preferred embodiment is basically similar in operation to the seventh preferred embodiment. Additionally, the PMOS transistor Q7 in the first internal power-source potential supply circuit 15 may be turned on/off in response to the control signal S7 to disable/enable the resistor R4, changing the resistance of the resistive element. When the PMOS transistor Q7 is in the ON position, only the PMOS transistor Q1 is the resistive element and the ON-state resistance of the PMOS transistor Q1 is the resistance of the resistive element. When the PMOS transistor Q7 is in the OFF position, the resistance of the resistor R4 added to the ON-state resistance of the PMOS transistor Q1 is the resistance of the resistive elements.

If the chip is active under the operating conditions and a large amount of current is consumed, the internal power-source potential VCI is lowered to increase the operation delay of the internal circuit of the load 11. To prevent such a condition, the control signal S7 is set to "H" to enable the resistor R4 serving as a backup resistive element, increasing the total resistance of the resistive elements and raising the internal power-source potential VCI.

Ninth Preferred Embodiment

Figure 19:
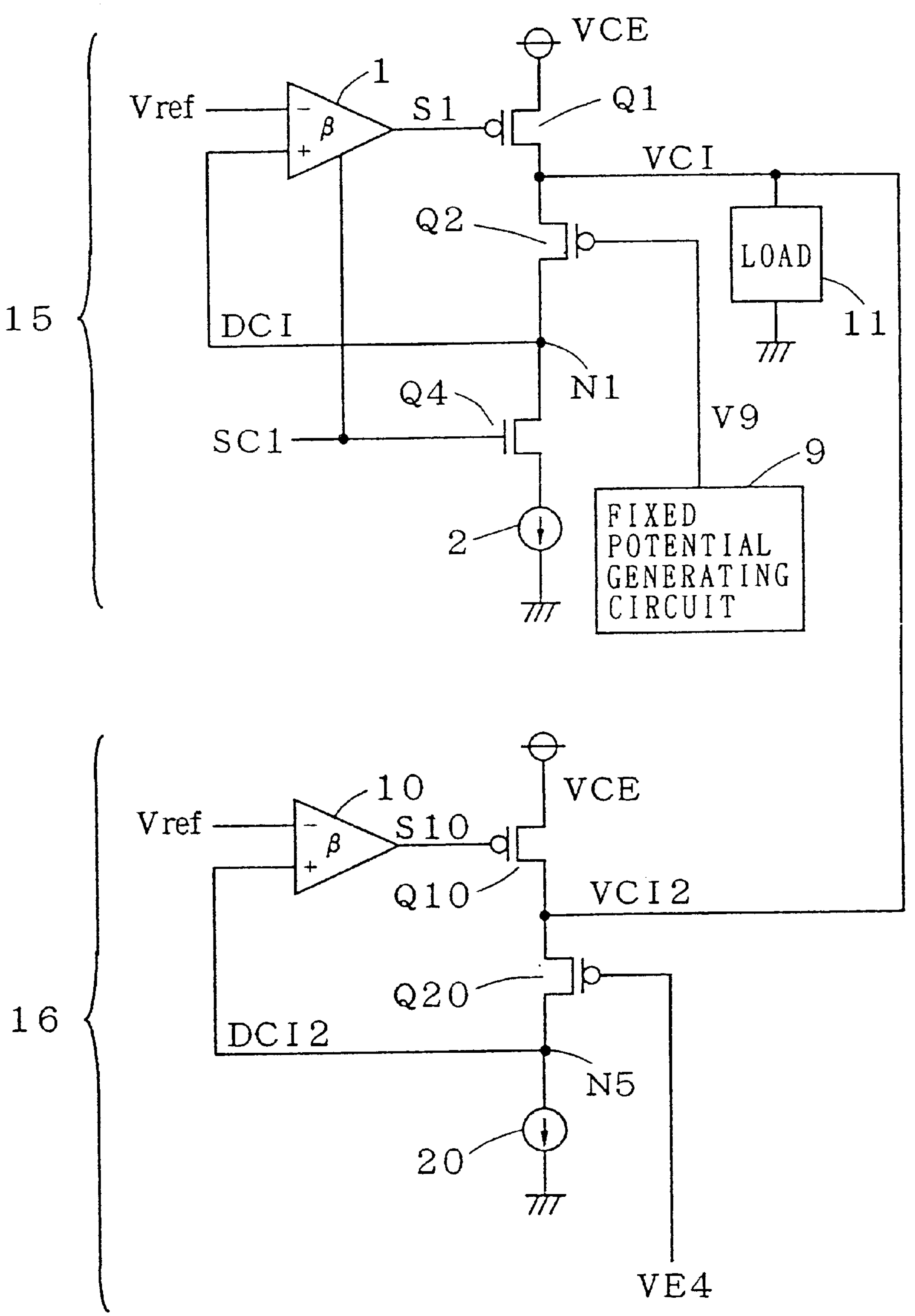
FIG. 19 is a circuit diagram of the internal power-source potential supply circuit according to a ninth preferred embodiment of the present invention.

FIG. 19 is a circuit diagram of the internal power-source potential supply circuit according to a ninth preferred embodiment of the present invention. As shown in FIG. 19, a fixed potential V9 generated from a fixed potential generating circuit 9 is applied to the gate of the PMOS transistor Q2. Other elements of FIG. 19 are identical with those of the seventh preferred embodiment shown in FIG. 17.

The internal power-source potential supply circuit of the ninth preferred embodiment is basically similar in operation to the seventh preferred embodiment. The ON-state resistance of the PMOS transistor Q2 serving as the resistive element may be changed by the fixed potential V9 generated from the fixed potential generating circuit 9 in the first internal power-source potential supply circuit 15, thereby varying the internal power-source potential VCI. The specific form of the fixed potential generating circuit 9 may be, for example, the internal construction of the gate potential generating circuit 6 illustrated in FIG. 8.

Tenth Preferred Embodiment

Figure 20:
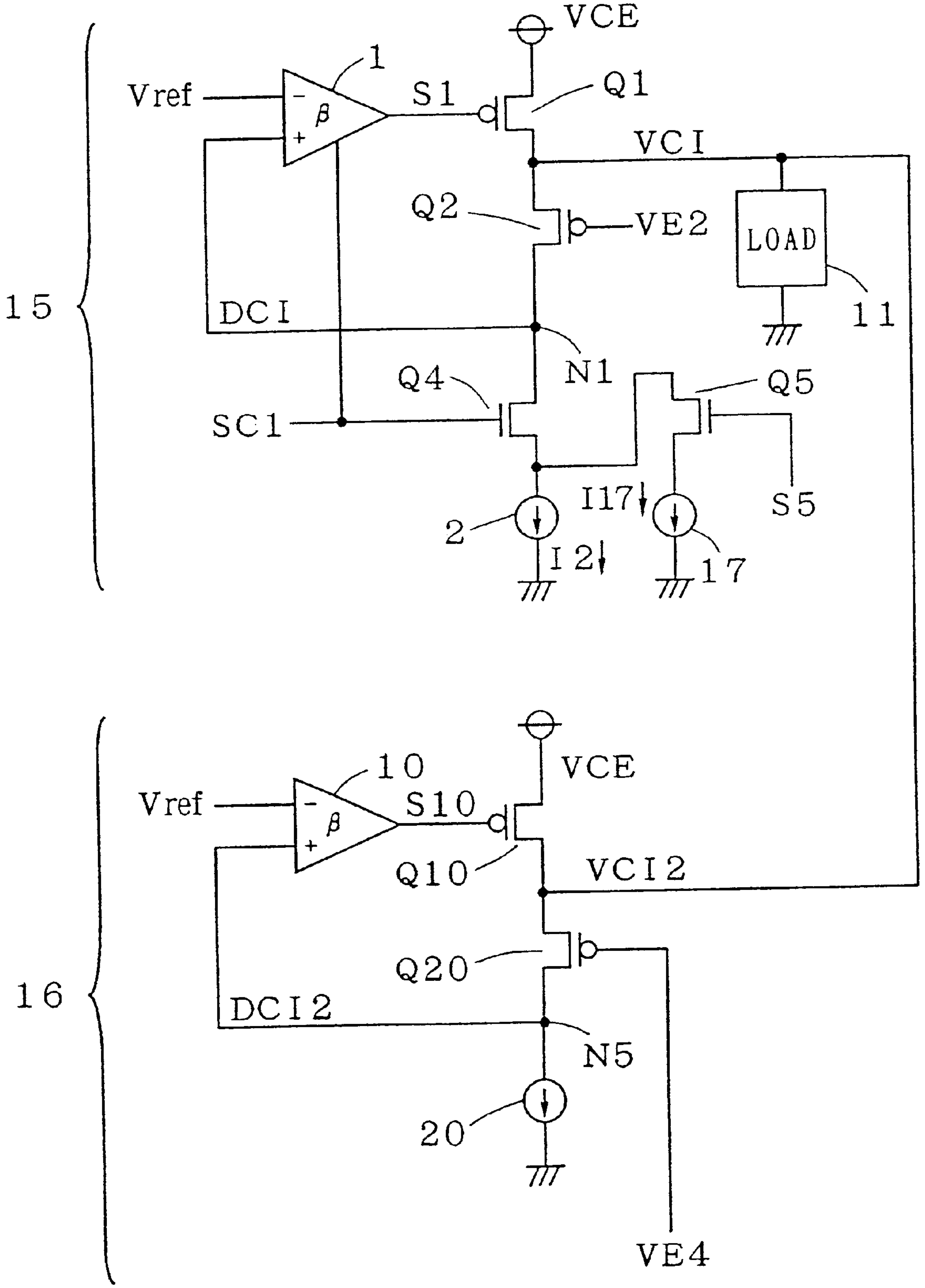
FIG. 20 is a circuit diagram of the internal power-source potential supply circuit according to a tenth preferred embodiment of the present invention.

FIG. 20 is a circuit diagram of the internal power-source potential supply circuit according to a tenth preferred embodiment of the present invention. As shown in FIG. 20, an NMOS transistor Q5 and a current source 17 are connected between the source of the NMOS transistor Q4 and the ground. Other elements of FIG. 20 are identical with those of the seventh preferred embodiment shown in FIG. 17.

The drain of the NMOS transistor Q5 is connected to the source of the NMOS transistor Q4, and the source of the NMOS transistor Q5 is grounded through the current source 17. The current source 17 supplies a current I17 in parallel with the current I2 between the node N1 and the ground. The NMOS transistor Q5 is turned on/off in response to the control signal S5.

The internal power-source potential supply circuit of the tenth preferred embodiment is basically similar in operation to the seventh preferred embodiment. Additionally, the amount of current flowing through the PMOS transistor Q2 is switched between the sum of the current I2 and current I7 and only the current I2 by using "H" and "L" of the control signal S5 in the first internal power-source potential supply circuit 15.

Figure 21:
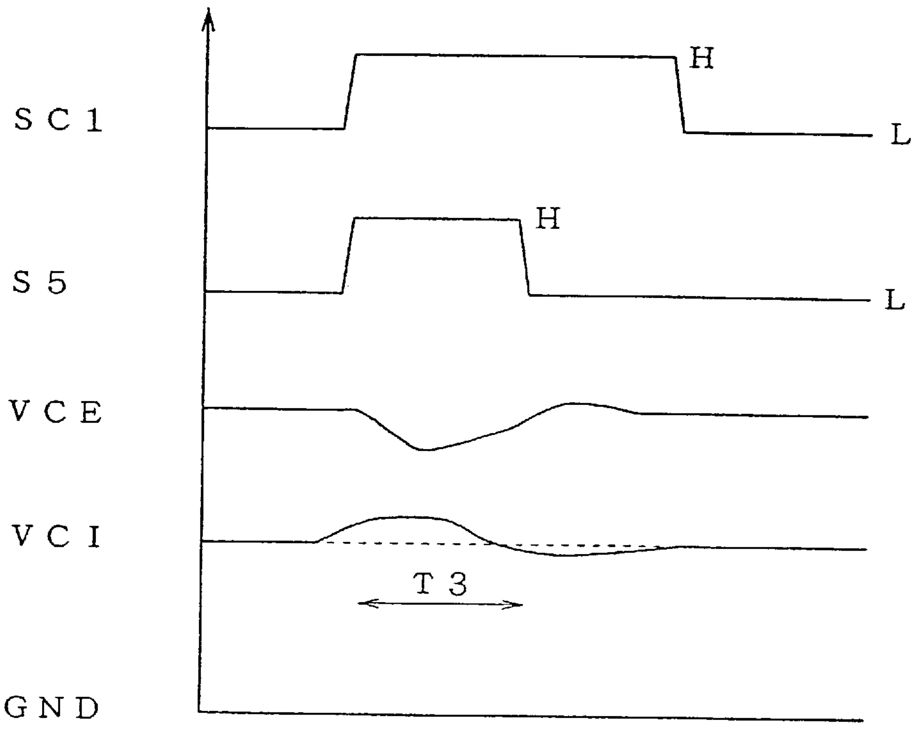
FIG. 21 is a graph showing an internal power-source potential VCI during operation in the arrangement of the tenth preferred embodiment.

FIG. 21 is a graph showing the internal power-source potential VCI under operating conditions in the arrangement of the tenth preferred embodiment. During a time period T3 over which the first internal power-source potential supply circuit 15 is active, the control signal S5 is set to "H" to set the amount of current flowing through the PMOS transistor Q2 to the sum of the current I2 and current I7, raising the internal power-source potential VCI.

For example, the chip may consume a large amount of current to temporarily drop the internal power-source potential VCI. The temporarily dropped internal power-source potential VCI influences other circuit operation and is one of the factors which lower the circuit operation speed. If such a condition occurs, the control signal S5 is set to "H" to increase the drawn current flowing through the PMOS transistor Q2, raising the internal power-source potential VCI. The amount of increase may compensate for the amount of drop in internal power-source potential during the circuit operation. This achieves stable circuit operation of the internal circuit of the load 11.

Eleventh Preferred Embodiment

Figure 22:
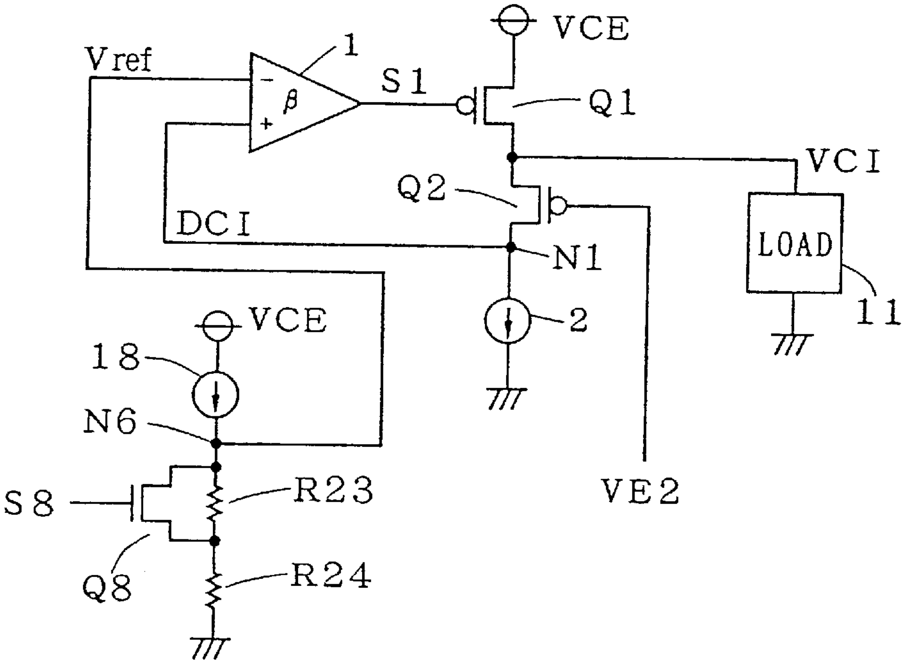
FIG. 22 is a circuit diagram of the internal power-source potential supply circuit according to an eleventh preferred embodiment of the present invention.

FIG. 22 is a circuit diagram of the internal power-source potential supply circuit according to an eleventh preferred embodiment of the present invention. As shown in FIG. 22, the external power-source potential VCE is connected to the source of the PMOS transistor Q1, and the internal power-source potential VCI is applied to the load 11 from the drain of the PMOS transistor Q1. The control signal S1 is applied to the gate of the PMOS transistor Q1 from the comparator 1. The comparator 1 has the negative input receiving the reference potential Vref and the positive input receiving the divided internal power-source potential DCI as the feedback signal, and outputs the control signal S1 on the basis of the result of comparison between the reference potential Vref and the divided internal power-source potential DCI.

The drain of the PMOS transistor Q1 is connected to the source of the PMOS transistor Q2, and the drain of the NMOS transistor Q4 is connected to the drain of the PMOS transistor Q2. The source of the NMOS transistor Q4 is grounded through the current source 2 for supplying the current I2. A voltage provided at the node N1 between the drain of the PMOS transistor Q2 and the drain of the NMOS transistor Q4 is applied as the divided internal power-source potential DCI to the positive input of the comparator 1. The fixed voltage VE2 is applied to the gate of the PMOS transistor Q2.

A current source 18 and resistors R23 and R24 are connected between the external power-source potential VCE and the ground. The drain and source of the NMOS transistor Q8 are connected across the resistor R23. The control signal S8 is applied to the gate of the NMOS transistor Q8. A potential provided at a node N6 between the current source 18 and the resistor R23 is the reference potential Vref. If the control signal S8 is "H", the NMOS transistor Q8 is in the ON position and the resistance between the node N5 and ground is determined by only the resistor R24. If the control signal S8 is "L", the NMOS transistor Q8 is in the OFF position and the resistance between the node N5 and ground is determined by the sum of the resistance of the resistor R23 and the resistance of the resistor R24.

The internal power-source potential supply circuit of the eleventh preferred embodiment as above constructed may vary the reference potential Vref chronologically. Variations in the reference potential Vref may vary the internal power-source potential VCI. For example, the chip may consume a large amount of current to temporarily drop the internal power-source potential VCI, influencing the operation of the internal circuit within the load 11 receiving the temporarily dropped internal power-source potential VCI. This is one of the factors which lower the operating speed of the internal circuit.

Figure 23:
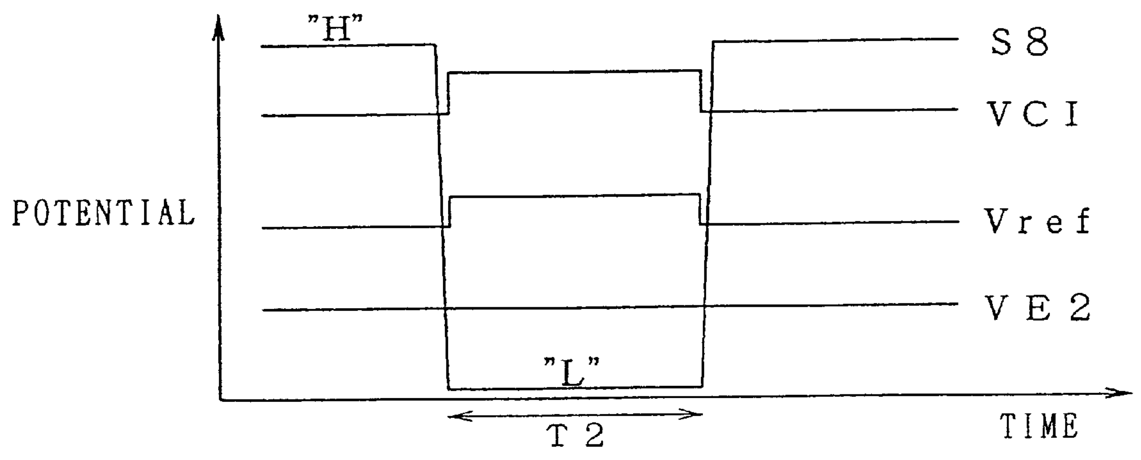
FIG. 23 is a timing chart showing the operation of the eleventh preferred embodiment.

If such a condition occurs, the control signal S8 is set to "L" as indicated with the time period T2 in FIG. 23 to increase the resistance between the node N6 and the ground, raising the reference potential Vref. The amount of increase may compensate for the amount of drop in internal power-source potential during the circuit operation. This achieves stable circuit operation.

Twelfth Preferred Embodiment

Figure 24:
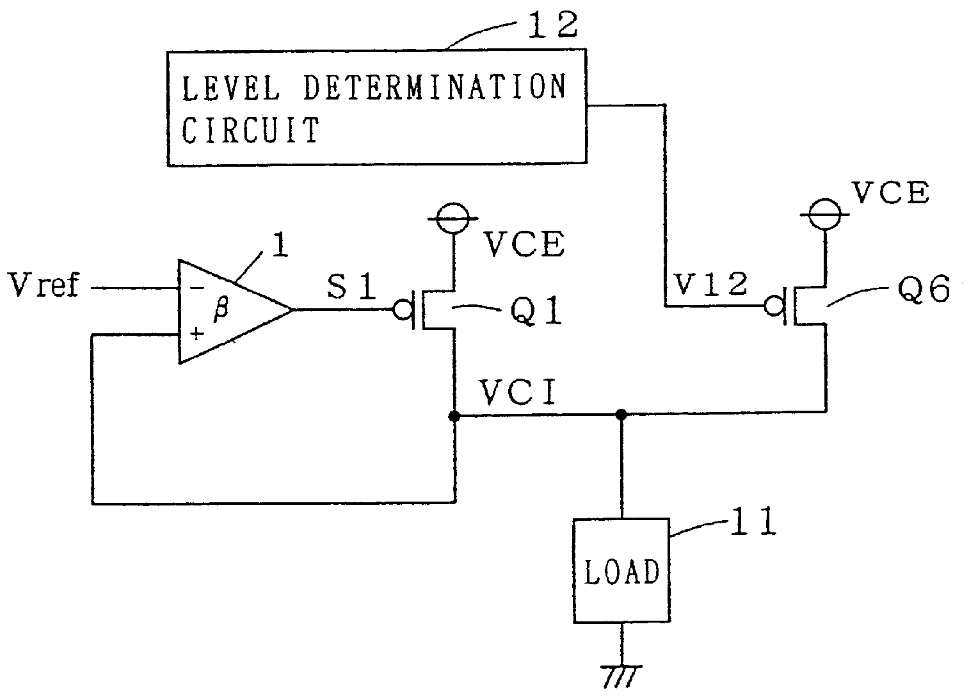
FIG. 24 is a circuit diagram of the internal power-source potential supply circuit according to a twelfth preferred embodiment of the present invention.

FIG. 24 is a circuit diagram of the internal power-source potential supply circuit according to a twelfth preferred embodiment of the present invention. As shown in FIG. 24, the external power-source potential VCE is connected to the source of the PMOS transistor Q1, and the internal power-source potential VCI is applied to the load 11 from the drain of the PMOS transistor Q1. The control signal S1 is applied to the gate of the PMOS transistor Q1 from the comparator 1. The comparator 1 has the negative input receiving the reference potential Vref and the positive input receiving the internal power-source potential VCI as the feedback signal, and outputs the control signal S1 on the basis of the result of comparison between the reference potential Vref and the internal power-source potential VCI.

A PMOS transistor Q6 is connected between the external power-source potential VCE and the internal power-source potential VCI. A control potential V12 from a level determination circuit 12 is applied to the gate of the PMOS transistor Q6.

The level determination circuit 12 detects fluctuations in external power-source potential VCE. If the external power-source potential VCE is lower than a predetermined potential, the level determination circuit 12 outputs the control potential V12 which is "L" to cause the PMOS transistor Q6 to conduct heavily so that the internal power-source potential VCI equals the external power-source potential VCE.

Figure 25:
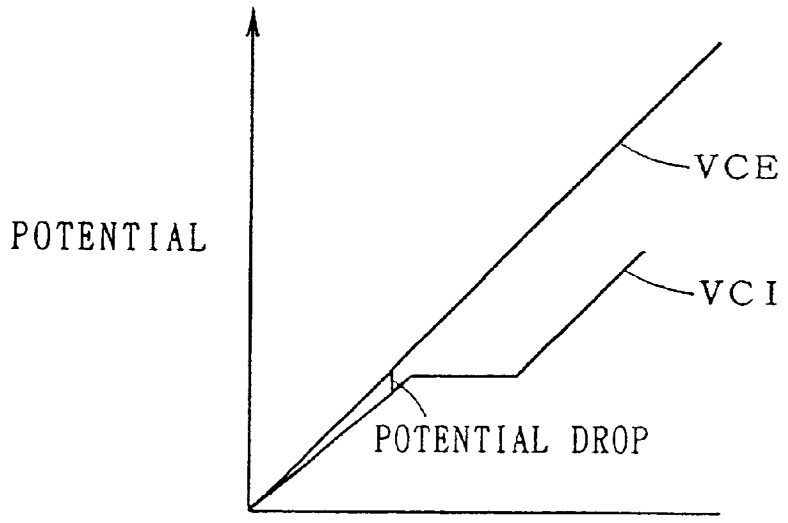
FIGS. 25 and 26 are graphs showing the operation of the twelfth preferred embodiment.

When the external power-source potential VCE decreases until the reference potential Vref always exceeds the internal power-source potential VCI, the comparator 1 performs switching control so that the driver transistor Q1 is constantly in the ON position. However, the output from the comparator 1 does not fully swing to "L" but varies in an analog fashion. If the chip having the load 11 consumes a large amount of current, the internal power-source potential VCI temporarily drops to cause a potential drop ΔVD as shown in FIG. 25. The temporarily dropped internal power-source potential VCI influences the operation of the internal circuit receiving the internal power-source potential VCI and is one of the factors which lower the operating speed of the internal circuit. If such a condition occurs, the level determination circuit 12 immediately turns on the PMOS transistor Q6 serving as the driver transistor.

Figure 26:
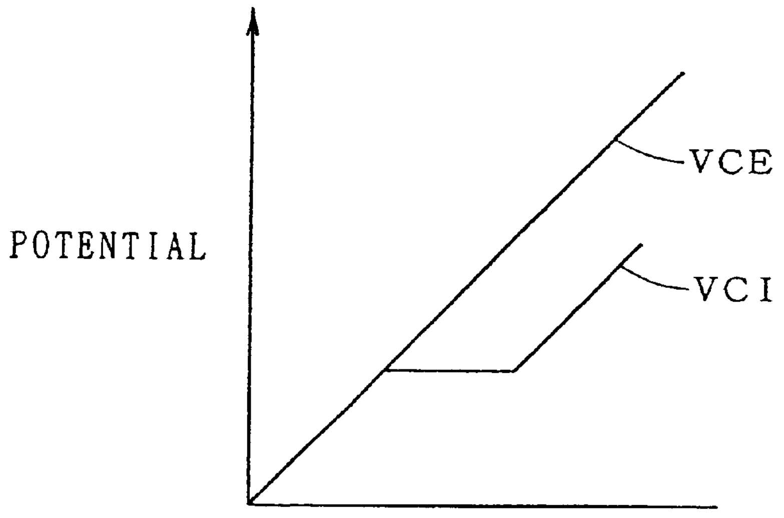

Consequently, the internal power-source potential VCI may be forcibly provided as the external power-source potential VCE which might be low as shown in FIG. 26.

Figure 27:
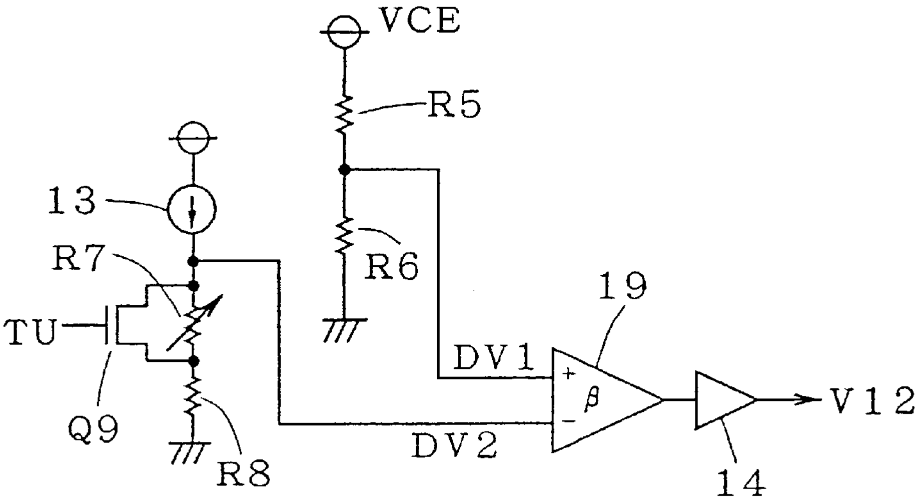
FIG. 27 is a circuit diagram showing an exemplary internal construction of a level determination circuit shown in FIG. 24.

FIG. 27 is a circuit diagram of an example of the internal structure of the level determination circuit 12. As shown in FIG. 27, a resistor R5 and a resistor R6 are connected between the external power-source potential VCE and the ground. A divided potential DV1 between the resistors R5 and R6 is applied to a positive input of a comparator 19. A current source 13, a variable resistor R7 and a resistor R8 are connected between the external power-source potential VCE and the ground. The drain and source of an NMOS transistor Q9 are connected across the variable resistor R7, and a tuning signal TN is applied to the gate of the NMOS transistor Q9. A potential between the current source 13 and the variable resistor R7 is applied as a divided potential DV2 to a negative input of the comparator 19.

The divided potential DV2 may be variable by ON/OFF control of the NMOS transistor Q9 in response to the tuning signal TN or by varying the resistance of the variable resistor R7. The divided potential DV2 is set so that DV1>DV2 is satisfied when the external power-source potential VCE is higher than a predetermined potential.

The output from the comparator 19 is applied to the gate of the PMOS transistor Q6 (FIG. 24) through a buffer 14 as the control potential V12 of the level determination circuit 12.

In the level determination circuit 12 as above constructed, while the external power-source potential VCE is held above the predetermined potential, the divided potential DV1 is higher than the divided potential DV2 and the output from the comparator 19 is higher than a logic threshold of the buffer 14. Then the buffer 14 outputs a signal which fully swings to "H" as the control potential V12. When the external power-source potential VCE decreases until the divided potential DV1 is lower than the divided potential DV2, the output from the comparator 19 is lower than the logic threshold of the buffer 14, and the buffer 14 outputs a signal which fully swings to "L" as the control potential V12.

Figure 28:
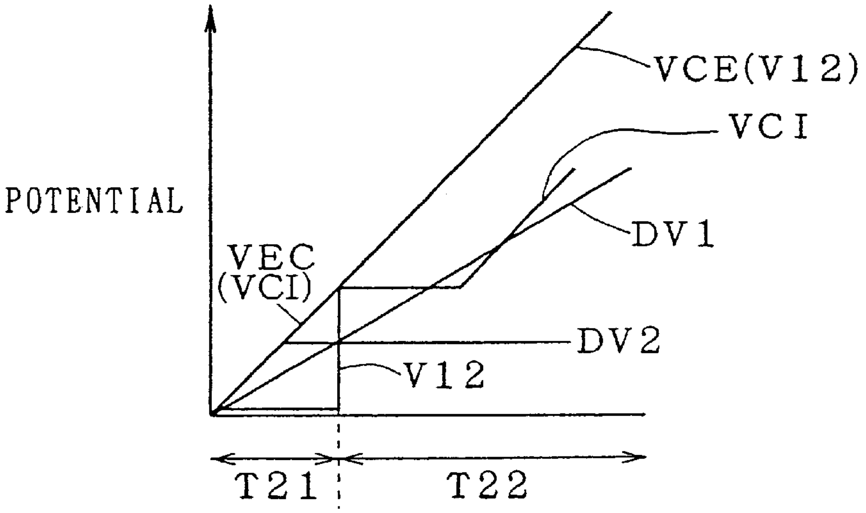
FIG. 28 is a graph showing the operation of the level determination circuit of FIG. 27.

FIG. 28 is a timing chart illustrating the operation of the twelfth preferred embodiment wherein variations in internal potentials are shown in this arrangement. During a time period T21 over which the external power-source potential VCE is lower than a predetermined potential VR, DV1<DV2 and the control potential V12 is "L". Then, the internal power-source potential VCI completely equals the external power-source potential VCE. During a time period T22 over which the external power-source potential VCE is higher than the predetermined potential VR, VD1 >DV2 and the control potential V12 is "H" (external power-source potential VCE). Then, the comparator 1 controls the internal power-source potential VCI.

Thirteenth Preferred Embodiment

<First mode>

Figure 29:
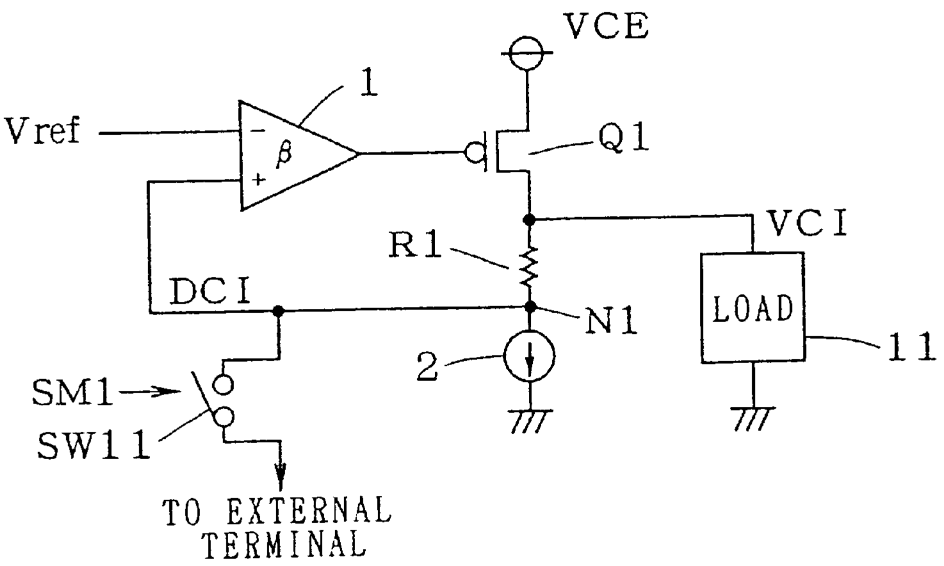
FIG. 29 is a circuit diagram of the internal power-source potential supply circuit according to a first mode of a thirteenth preferred embodiment of the present invention.

FIG. 29 is a circuit diagram of the internal power-source potential supply circuit according to a first mode of a thirteenth preferred embodiment of the present invention. As shown in FIG. 29, the node N1 is connected to a first end of a switch SW11 having a second end connected to an external terminal. The switch SW11 turns on/off in response to a selection signal SM1. Other elements of FIG. 29 are identical with those of the basic construction of the first preferred embodiment shown in FIG. 1.

In this arrangement, when the switch SW11 is turned on in response to the selection signal SM1, the divided internal power-source potential DCI may be monitored from the exterior through the external terminal. A specific process for monitoring the divided internal power-source potential DCI from the exterior may includes connecting the external terminal to the exterior through a bonding pad. The switch SW11 may be comprised of an MOS transistor.

<Second Mode>

Figure 30:
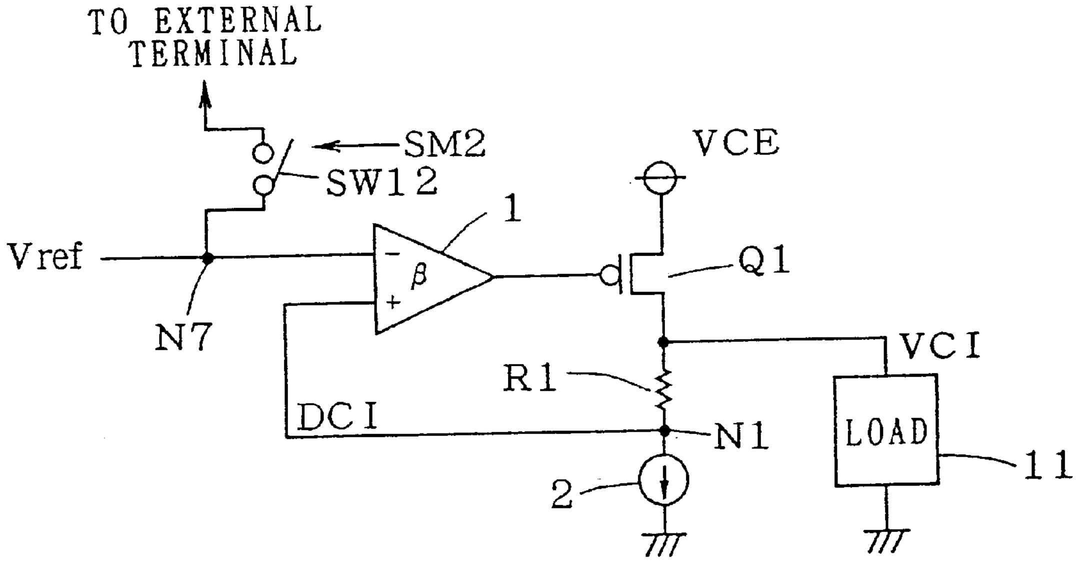
FIG. 30 is a circuit diagram of a second mode of the thirteenth preferred embodiment.

FIG. 30 is a circuit diagram of the internal power-source potential supply circuit according to a second mode of the thirteenth preferred embodiment of the present invention. As shown in FIG. 30, a node N7 between the reference potential Vref and the negative input of the comparator 1 is connected to a first end of a switch SW12 having a second end connected to an external terminal. The switch SW12 turns on/off in response to a selection signal SM2. Other elements of FIG. 30 are identical with those of the basic construction of the first preferred embodiment shown in FIG. 1.

In this arrangement, when the switch SW12 is turned on in response to the selection signal SM2, the reference potential Vref may be monitored from the exterior through the external terminal. The switch SW12 may be comprised of an MOS transistor.

<Third Mode>

Figure 31:
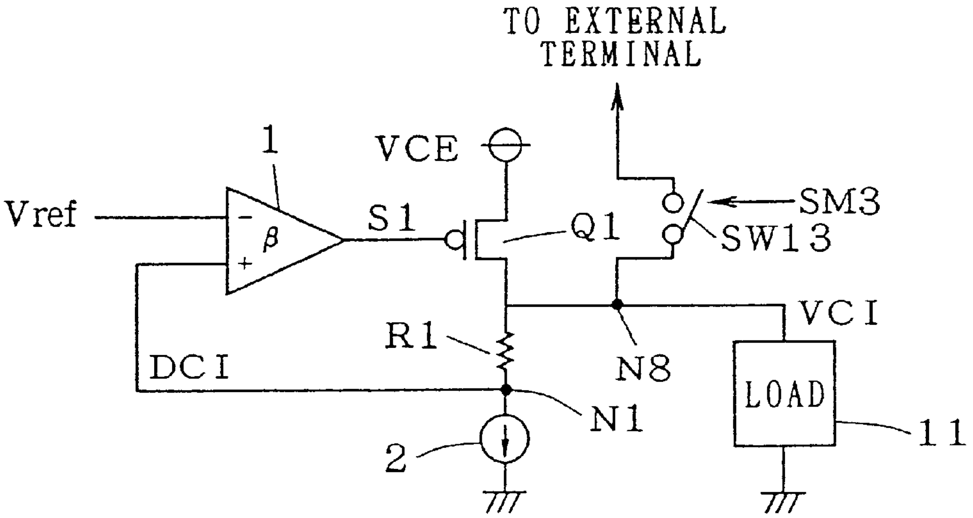
FIG. 31 is a circuit diagram of a third mode of the thirteenth preferred embodiment.

FIG. 31 is a circuit diagram of the internal power-source potential supply circuit according to a third mode of the thirteenth preferred embodiment of the present invention. As shown in FIG. 31, a node N8 receiving the internal power-source potential VCI is connected to a first end of a switch SW13 having a second end connected to an external terminal. The switch SW13 turns on/off in response to a selection signal SM3. Other elements of FIG. 31 are identical with those of the basic construction of the first preferred embodiment shown in FIG. 1.

In this arrangement, when the switch SW13 is turned on in response to the selection signal SM3, the internal power-source potential VCI may be monitored form the exterior through the external terminal. The switch SW13 may be comprised of an MOS transistor.

<Fourth Mode>

Figure 32:
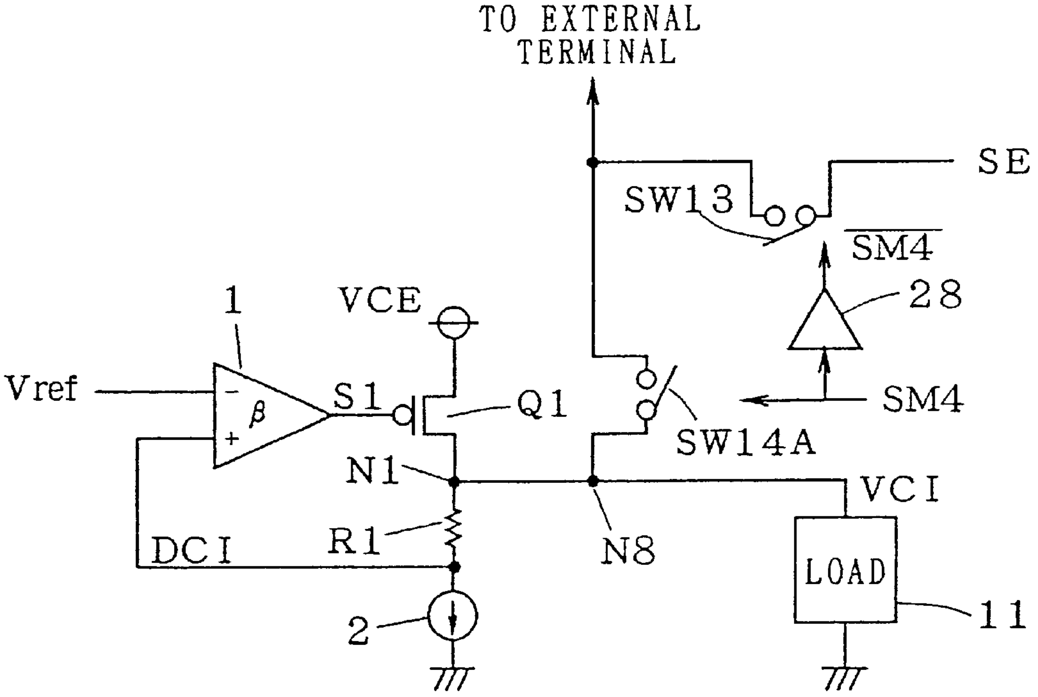
FIG. 32 is a circuit diagram of a fourth mode of the thirteenth preferred embodiment.

FIG. 32 is a circuit diagram of the internal power-source potential supply circuit according to a fourth mode of the thirteenth preferred embodiment of the present invention. As shown in FIG. 32, the node N8 receiving the internal power-source potential VCI is connected to a first end of a switch SW14A having a second end connected to an external terminal. A switch SW14B has a first end receiving another signal SE within the chip and a second end connected to the external terminal.

The switch SW14A turns on/off in response to a selection signal SM4. The switch SW14B turns on/off in response to an inverted selection signal $\overline{SM4}$. An inverter 28 receives the selection signal SM4 to output the inverted selection signal $\overline{SM4}$. The switches SW14A and SW14B perform a switching operation so that one is in the ON position while the other is in the OFF position Other elements of FIG. 32 are identical with those of the basic structure of the first preferred embodiment shown in FIG. 1.

In such an arrangement. when the selection signal SM4 turns on the switch SW14A and turns off the switch SW14B, the internal power-source potential VCI may be monitored from the exterior through the external terminal. When the selection signal SM4 turns on the switch SW14B and turns off the switch SW14A, the signal SE may be outputted at the external terminal.

<Fifth Mode>

Figure 33:
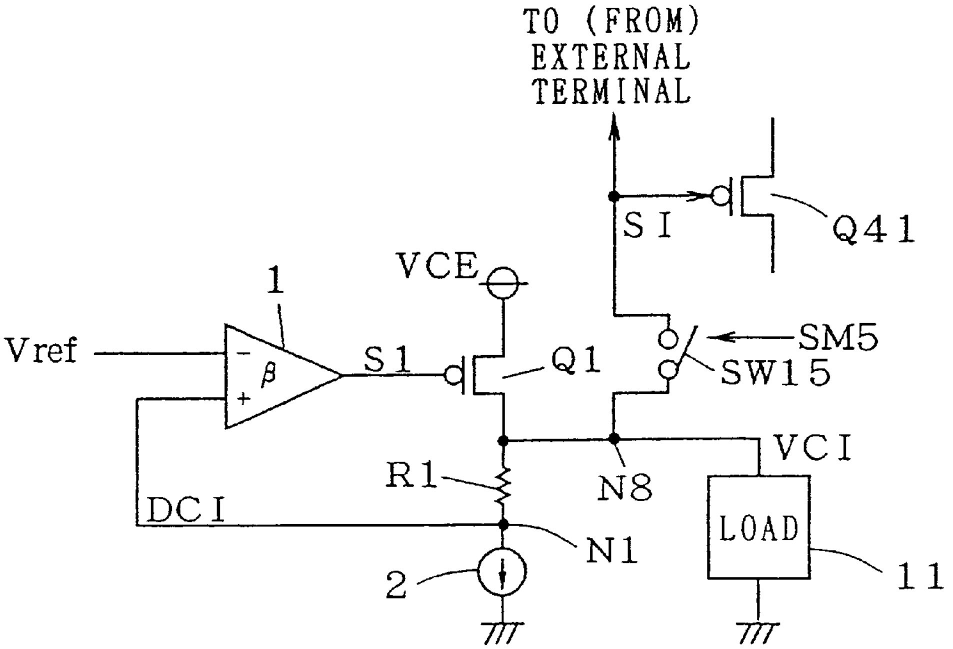
FIG. 33 is a circuit diagram of a fifth mode of the thirteenth preferred embodiment.

FIG. 33 is a circuit diagram of the internal power-source potential supply circuit according to a fifth mode of the thirteenth preferred embodiment of the present invention. As shown in FIG. 33, the node N8 receiving the internal power-source potential VCI is connected to a first end of a switch SW15 having a second end connected to an external terminal. The switch SW15 turns on/off in response to a selection signal SM5. The external terminal is also connected to the gate of a PMOS transistor Q41 serving as an input portion of another circuit. Other elements of FIG. 33 are identical with those of the basic construction of the first preferred embodiment shown in FIG. 1.

In such an arrangement, when the selection signal SM5 turns on the switch SW15, the internal power-source potential VCI may be monitored from the exterior through the external terminal. When the selection signal SM5 turns off the switch SW15, an external input signal may be applied to the gate of the PMOS transistor Q41 through the external terminal.

In the fifth mode of the thirteenth preferred embodiment, the external terminal used to input the external signal is connected to the second end of the switch SW15 in normal conditions, and is used as a monitor terminal for the internal power-source potential VCI, as required.

Fourteenth Preferred Embodiment

Figure 34:
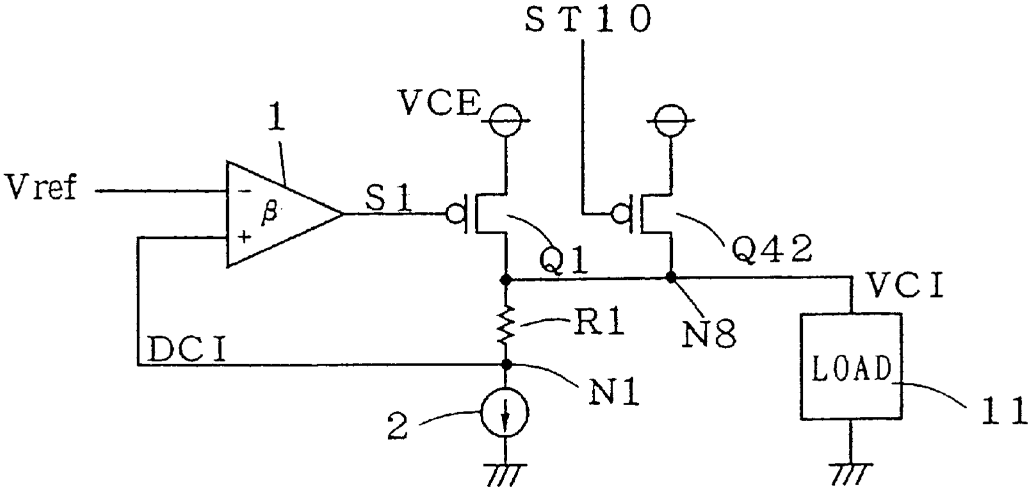
FIG. 34 is a circuit diagram of the internal power-source potential supply circuit according to a fourteenth preferred embodiment of the present invention.

FIG. 34 is a circuit diagram of the internal power-source potential supply circuit according to a fourteenth preferred embodiment of the present invention. As shown in FIG. 34, a PMOS transistor Q42 is connected between the node N8 receiving the internal power-source potential VCI and the external power-source potential VCE. A chronological signal ST10 is applied to the gate of the PMOS transistor Q42. Other elements of FIG. 34 are identical with those of the basic construction of the first preferred embodiment shown in FIG. 1.

Figure 35:
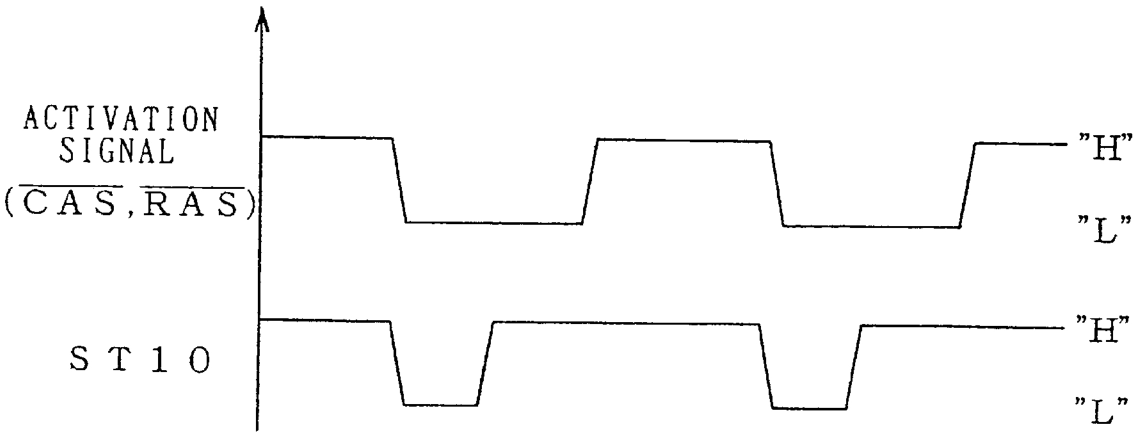
FIG. 35 is a timing chart showing the operation of the fourteenth preferred embodiment.

FIG. 35 is a timing chart showing the operation of the fourteenth preferred embodiment. Referring to FIG. 35, only during a predetermine time period over which activation signals such as a row address strobe signal RAS and a column address strobe signal $\overline{\text{CAS}}$ are active ("L" active), the chronological signal ST10 is made to fall to "L" to turn on the, PMOS transistor Q42. Then, the external power-source potential VCE is used as the internal power-source potential VCI to increase the amount of current fed to the load 11, feeding a sufficient amount of current consumed by the internal circuit of the load 11.

Fifteenth Preferred Embodiment

Figure 36:
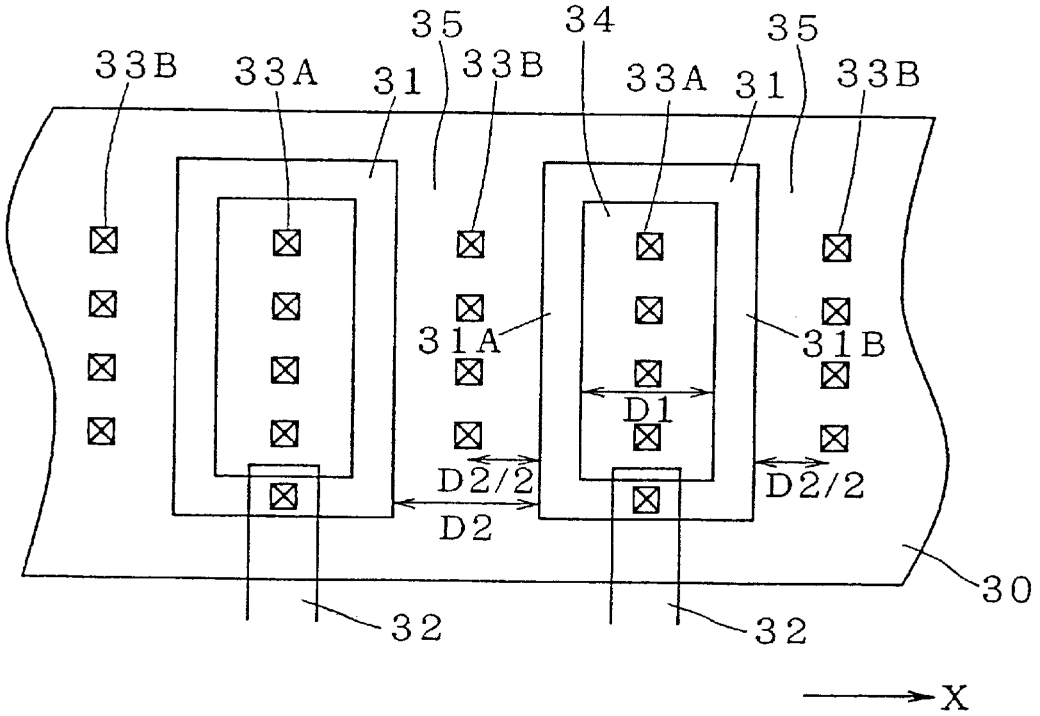
FIG. 36 is a plan view showing a layout of transistors forming a comparator of the internal power-source potential supply circuit according to a fifteenth preferred embodiment of the present invention.

FIG. 36 is a plan view showing a layout of transistors forming the comparator 1 of the internal power-source potential supply circuit according to a fifteenth preferred embodiment of the present invention.

The comparator 1 is so sensitive that a slight change in layout places the comparator 1 into an unbalanced condition. To prevent the unbalanced condition, the layout as shown in FIG. 30 is considered. On an active region 30 are formed rectangular gate electrode regions 31 each having two partial gate electrode regions 31A and 31B spaced a distance D1 apart from each other in the X direction of FIG. 36. The gate electrode regions 31 are spaced a distance D2 apart from each other.

A part of the active region 30 between the partial gate electrode regions 31A and 31B of the gate electrode region 31 is defined as a drain region 34 on which drain contacts 33A are formed. Parts of the active region 30 which are located on the opposite side of the partial gate electrode regions 31A and 31B from the drain region 34 are defined respectively as first and second source regions on which common source contacts 33B are formed. The reference numeral 32 designates a wiring region.

The gate electrode region 31, the drain region 34 inside the partial gate electrode regions 31A and 31B, and the source regions 35 on opposite sides of the gate electrode region 31 form one transistor. This transistor is equivalent to an in series connection of a first partial transistor including the partial gate electrode region 31A, the drain region 34, and the source region 35 adjacent the partial gate electrode region 31A, and a second partial transistor including the partial gate electrode region 31B, the drain region 34, and the source region 35 adjacent the partial gate electrode region 31B, with the gate shared between the first and second partial transistors.

Such a layout permits the constant distance D1 between the gate electrode region 31 and the drain contacts 33A (the sum of the distance between the partial gate electrode region 31A and the drain contacts 33A and the distance between the partial gate electrode region 31B and the drain contacts 33A) and the constant distance D2 between the gate electrode region 31 and the source contacts 33B (the sum of the distance between the partial gate electrode region 31A and the source contacts 33B and the distance between the partial gate electrode region 31B and the source contact 33B) in one transistor if the position of the contacts 33A, 33B may slightly deviate in the X direction relative to the gate electrode region 31.

Specifically, if the positions of the drain and source contacts 33A and 33B may deviate in the X direction relative to the drain region 34 and the source regions 35 due to mask misalignment or the like, the deviation is cancelled between the first and second partial transistors, causing no changes in performance of the transistor.

In this manner, a slight deviation of the positions of the contacts 33A and 33B in the X direction relative to the gate electrode region 31 due to mask misalignment or the like does not change the transistor performance. This achieves the formation of a high-accuracy transistor.

Figure 37:
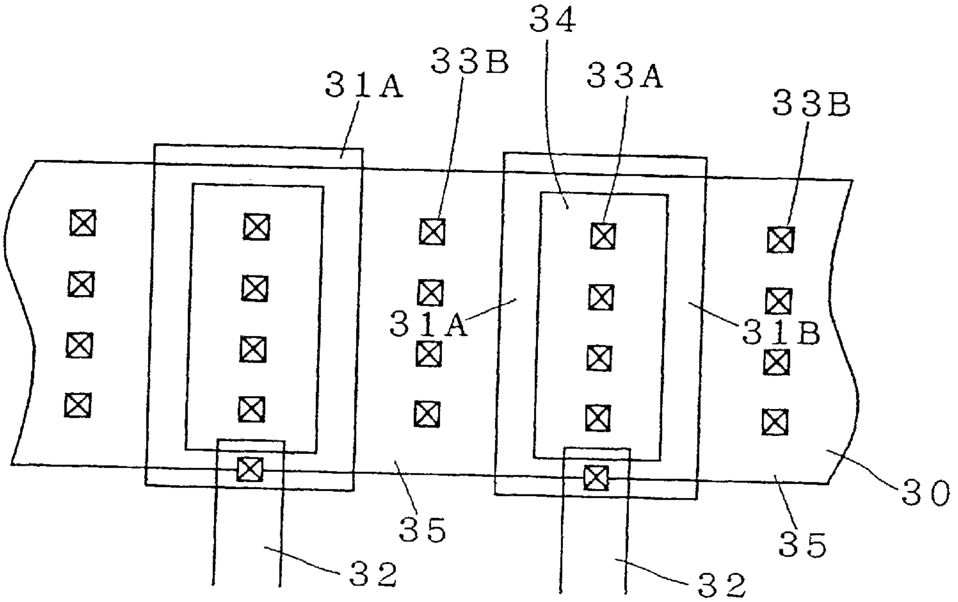
FIGS. 37 and 38 are plan views showing other layouts of the fifteenth preferred embodiment.
Figure 38:
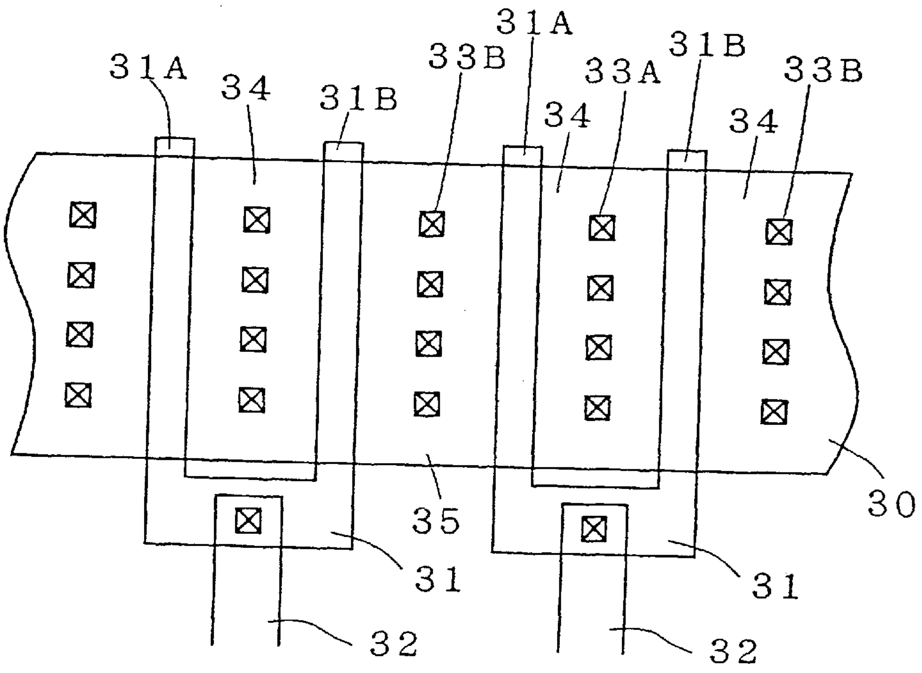

Referring to FIG. 37, parts of the gate electrode region 31 may be formed on the boundaries of the active region 30. As illustrated in FIG. 38, the gate electrode region 31 may be partially cut to provide a non-rectangular shape.

Sixteenth Preferred Embodiment

Figure 39:
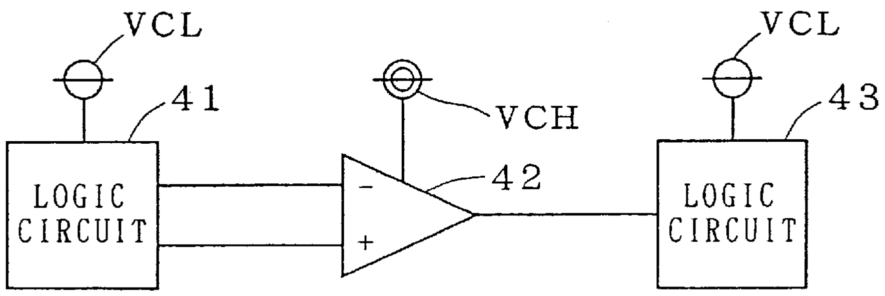
FIG. 39 illustrates the principle of a sixteenth preferred embodiment according to the present invention.

FIG. 39 illustrates the principle of how the comparator of the internal power-source potential supply circuit draws its power according to a sixteenth preferred embodiment of the present invention.

A logic circuit 41 and a logic circuit 43 may often be formed using CMOS logic. The power-source potential to be fed to such a circuit may be a relatively low power-source potential such as the internal power-source potential VCI.

This is effective in terms of reduction in power consumption. It is hence sufficient that the power-source potential for the logic circuits 41 and 43 is the internal power-source potential VCI.

An analog circuit 42 such as a comparator might be much lowered in operating speed or perform faulty operation when the power-source potential is low. It is hence desirable to set the power-source potential for the analog circuit 42 at a higher potential for speeding up the operation. Therefore, the power-source potential for the analog circuit 42 is preferably the external power-source potential VCE, or a high potential VCH such as a step-up potential VP.

<First Mode>

Figure 40:
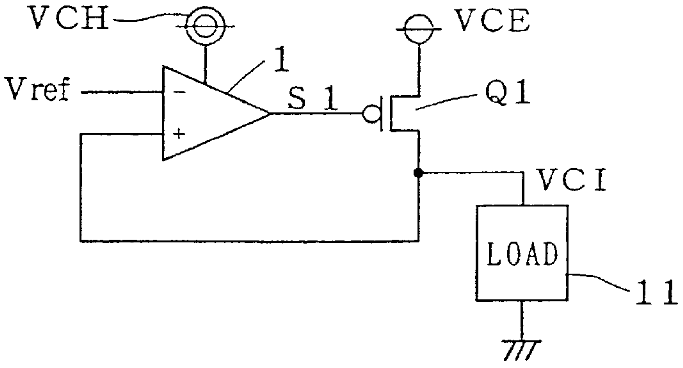
FIG. 40 is a circuit diagram of a first mode of the sixteenth preferred embodiment.

Application of the principle to the internal power-source potential supply circuit involves the need for the power source of the PMOS transistor Q1 serving as a driver transistor to provide a large amount of current as shown in FIG. 40. Thus, the power-source potential for the PMOS transistor Q1 should be the external power-source potential VCE. The comparator 1 need not particularly receive a large amount of current therethrough, and the power-source potential for the comparator 1 is desirably the high potential VCH higher than the external power-source potential VCE and providing a smaller amount of current in order to enhance the operating speed thereof.

Figure 42:
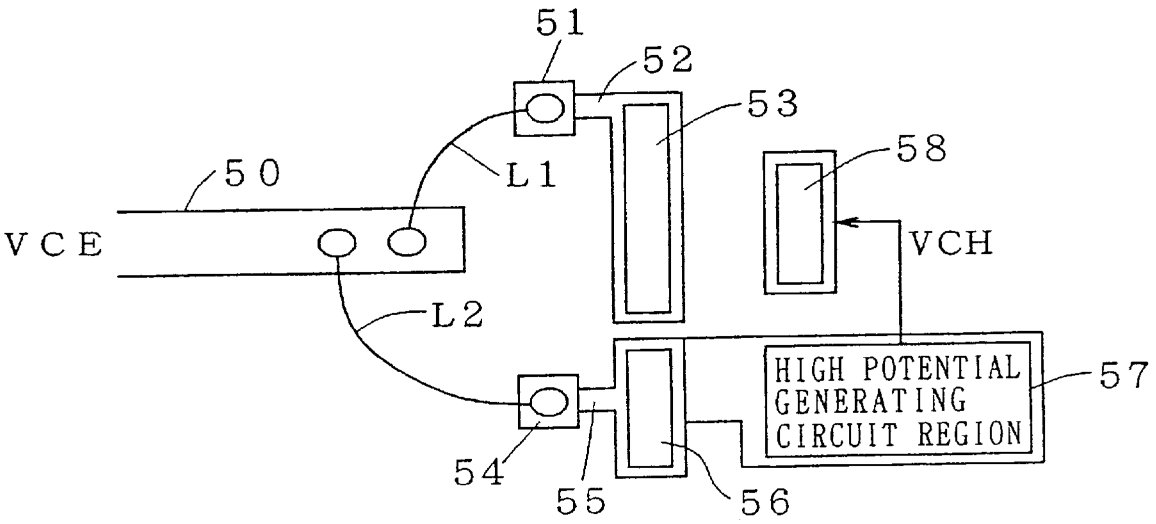
FIG. 42 is a plan view showing a specific form of the first mode of the sixteenth preferred embodiment.

An arrangement as shown in FIG. 42 may be considered, for example. In the arrangement of FIG. 42, the external power-source potential VCE is applied from a frame 50 receiving the same through a wire L1, a pad 51, a power source interconnecting line 52 to a driver transistor region 53. The frame 50 is connected to a high potential generating circuit region 57 through a wire L2, a pad 54, a power source interconnecting line 55, and another circuit region 56. The high potential VCH is applied from the high potential generating circuit region 57 to a comparator region 58.

<Second Mode>

Figure 41:
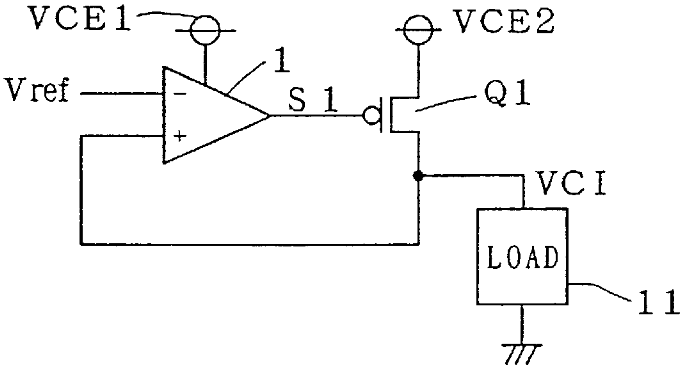
FIG. 41 is a circuit diagram of a second mode of the sixteenth preferred embodiment.

Referring to FIG. 41, external power-source potentials VCE1 and VCE2 which are equal in level but independent may be supplied to the comparator 1 and the PMOS transistor Q1, respectively. Such an arrangement prevents the comparator 1 from being affected by the PMOS transistor Q1.

Figure 43:
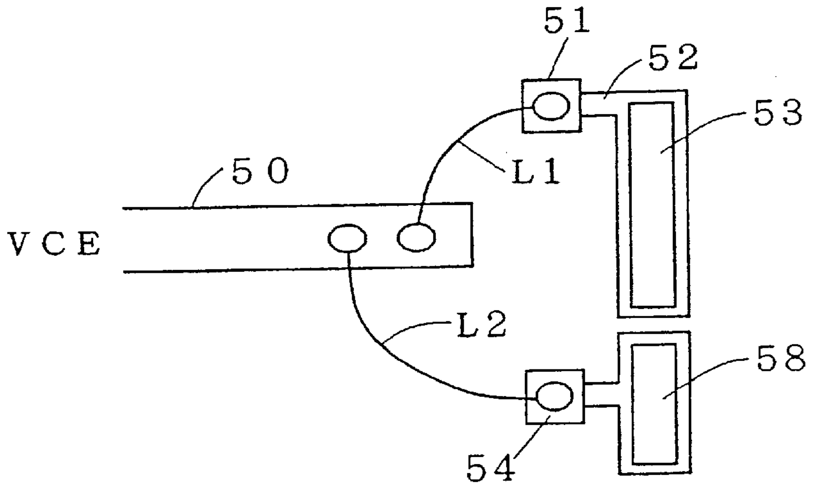
FIG. 43 is a plan view showing a specific, form of the second mode of the sixteenth preferred embodiment.

An arrangement as shown in FIG. 43 may be considered, for example. In the arrangement of FIG. 43, the external power-source potential VCE is applied from the frame 50 receiving the same through the wire L1, the pad 51, and the power source interconnecting line 52 to the driver transistor region 53. The wire L2 independent of the wire L1 is connected to the frame 50, and the external power-source potential VCE is applied to the comparator region 58 through the wire L2, the pad 54, and the power source interconnecting line 55.

Seventeenth Preferred Embodiment

Figure 44:
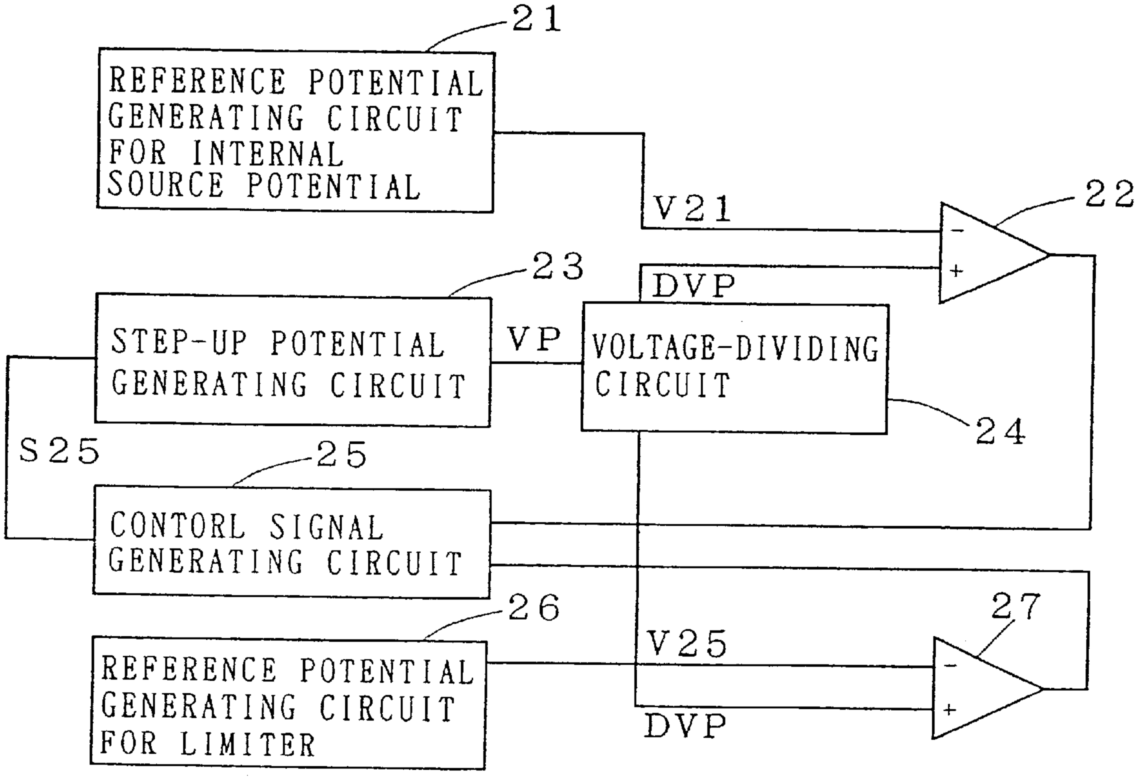
FIG. 44 is a block diagram of a step-up potential generating system according to a seventeenth preferred embodiment of the present invention.

FIG. 44 is a block diagram of a step-up potential generating system in accordance with a seventeenth preferred embodiment of the present invention. As shown in FIG. 44, a reference potential V21 from a reference potential generating circuit 21 for internal power-source potential is applied to a positive input of a comparator 22. The reference potential V21 varies in direct proportion to the internal power-source potential VCI outputted from the internal power-source potential supply circuit of the construction described in the first to fourteenth preferred embodiments.

A step-up potential generating circuit 23 outputs the step-up potential VP to a voltage-dividing circuit 24 in response to a control signal S25. The voltage-dividing circuit 24 divides the step-up potential VP to provide a divided step-up potential DVP to a negative input of the comparator 22.

The voltage-dividing circuit 24 also applies the divided step-up potential DVP to a negative input of a comparator 27. A reference potential generating circuit 26 for limiter applies a limit voltage V26 to a positive input of the comparator 27. The limit voltage V26 is not set at a level higher than the divided step-up potential DVP until the step-up potential VP is higher than a predetermined high potential, and is not affected by variations in the internal power-source potential VCI.

A control signal generating circuit 25 receives the output from the comparator 22 and the output from the comparator 27 to output the control signal S25 to the step-up potential generating circuit 23 in response to the outputs from the comparators 22 and 27. The control signal generating circuit 25 outputs the output from the comparator 22 as the control signal S25 if the output from the comparator 27 is at a logic level "H", and outputs the output from the comparator 27 as the control signal S25 if the output from the comparator 27 is at a logic level "L".

Figure 45:
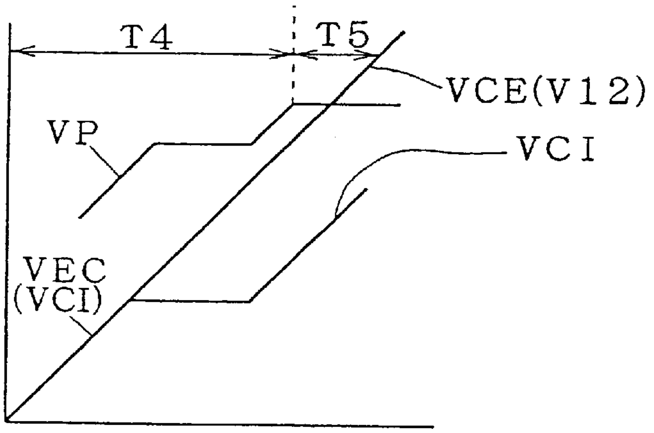
FIG. 45 is a graph showing the operation of the seventeenth preferred embodiment.

In such an arrangement, during a time period T4 over which the limit voltage V26 is higher than the divided step-up potential DVP as shown in FIG. 45, the output from the comparator 27 is at the logic level "H". Then the output from the comparator 22 is applied as the control signal S25 to the step-up potential generating circuit 23. This permits the step-up potential VP to be higher than the internal power-source potential VCI by the amount of the predetermined potential under the control of the comparator 22.

During a time period T5 over which the divided step-up potential DVP is higher than the limit voltage V26, the output from the comparator 27 is at the logic level "L". Then the output from the comparator 27 is applied as the control signal S25 to the step-up potential generating circuit 23. This permits the step-up potential VP to be held at the predetermined high potential under the control of the comparator 27.

A primary object of the step-up potential generating system of the seventeenth preferred embodiment is to vary the step-up potential to be used for level setting of word lines in accordance with variations in the internal power-source potential VCI. The step-up potential VP varies, with a predetermined potential difference held from the internal power-source potential VCI (during the time period T4 of FIG. 45). As the external power-source potential VCE becomes higher than necessary and the internal power-source potential VCI accordingly rises, the step-up potential VP may be limited so as not to becomes higher than the predetermined high potential (during the time period T5 of FIG. 45). Consequently, device breakdown because of an increase in the external power-source potential VCE may be prevented.

Eighteenth Preferred Embodiment

<First Mode>

Figure 46:
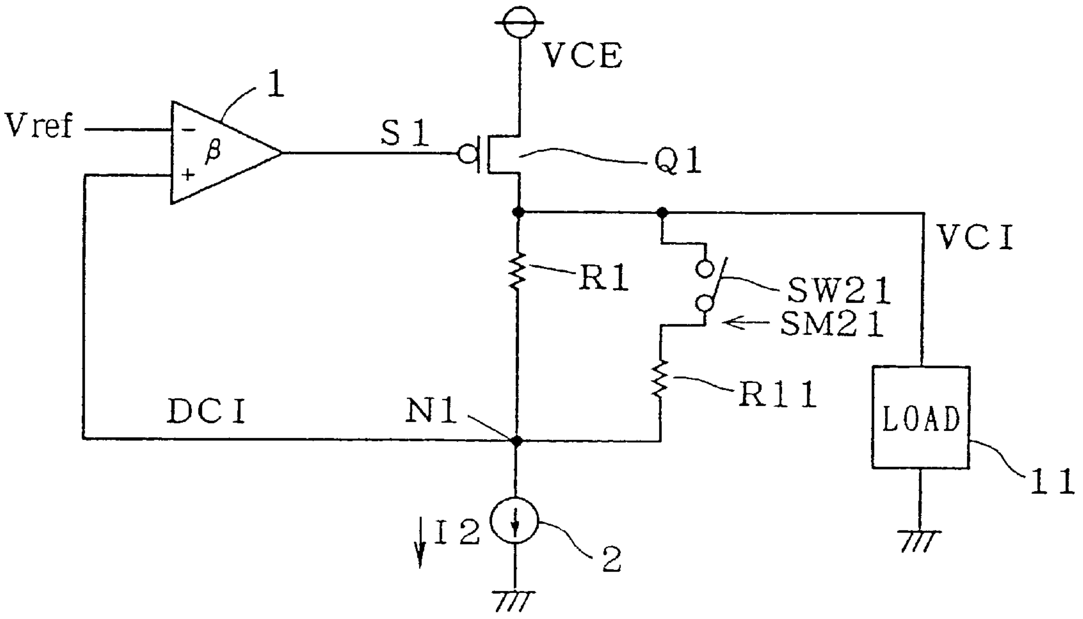
FIG. 46 is a circuit diagram of the internal power-source potential supply circuit according to a first mode of an eighteenth preferred embodiment of the present invention.

FIG. 46 is a circuit diagram of the internal power-source potential supply circuit according to a first mode of an eighteenth preferred embodiment of the present invention. As shown, the external power-source potential VCE is connected to the source of the PMOS transistor Q1, and the internal power-source potential VCI is applied to the load 11 from the drain of the PMOS transistor Q1. The comparator 1 provides the control signal S1 to the gate of the PMOS transistor Q1. The comparator 1 has the negative input receiving the reference potential Vref and the positive input receiving the divided internal power-source potential DCI as the feedback signal, and outputs the control signal S1 on the basis of the result of comparison between the reference potential Vref and the divided internal power-source potential DCI.

The drain of the PMOS transistor Q1 is connected to the first end of the resistor R1. The current source 2 is connected between the second end of the resistor R1 and the ground. A voltage provided at the node N1 serving as the second end of the resistor R1 is applied as the divided internal power-source potential DCI to the positive input of the comparator 1. A switch SW21 turns on/off in response to a selection signal SM21.

The drain of the PMOS transistor Q1 is connected to a first end of a resistor R11 through the switch SW21, and a second end of the resistor R11 is connected to the node N1.

Figure 47:
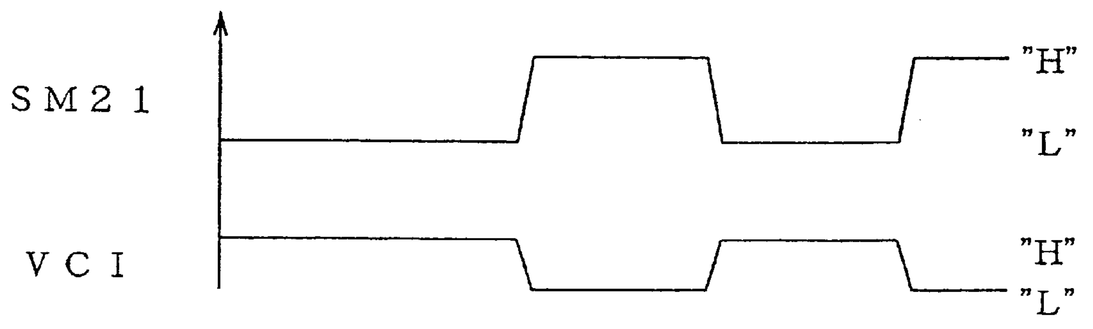
FIG. 47 is a timing chart showing the operation of the first mode of the eighteenth preferred embodiment.

FIG. 47 is a timing chart showing the operation of the first mode of the eighteenth preferred embodiment. As shown in FIG. 47, when the selection signal SM21 is "L", the switch SW21 is in the OFF position, and the potential difference between the internal power-source potential VCI and the divided internal power-source potential DCI is determined by the resistance of the resistor R1. When the selection signal SM21 is "H", the switch SW21 is in the ON position, and the potential difference between the internal power-source potential VCI and the divided internal power-source potential DCI is determined by the parallel combined resistance of the resistors R1 and R11. Thus, the resistance between the internal power-source potential VCI and the divided internal power-source potential DCI while the selection signal SM21 is "H" is lower than the resistance between the internal power-source potential VCI and the divided internal power-source potential DCI while the selection signal SM21 is "L", and the internal power-source potential VCI decreases.

In this manner, the first mode of the eighteenth preferred embodiment may vary the total resistance of the resistors R1 and R11 by turning on/off the switch SW21 in accordance with the applications such as a chip test, a data retention mode, and a sleep mode, to variably set the internal power-source potential VCI.

<Second Mode>

Figure 48:
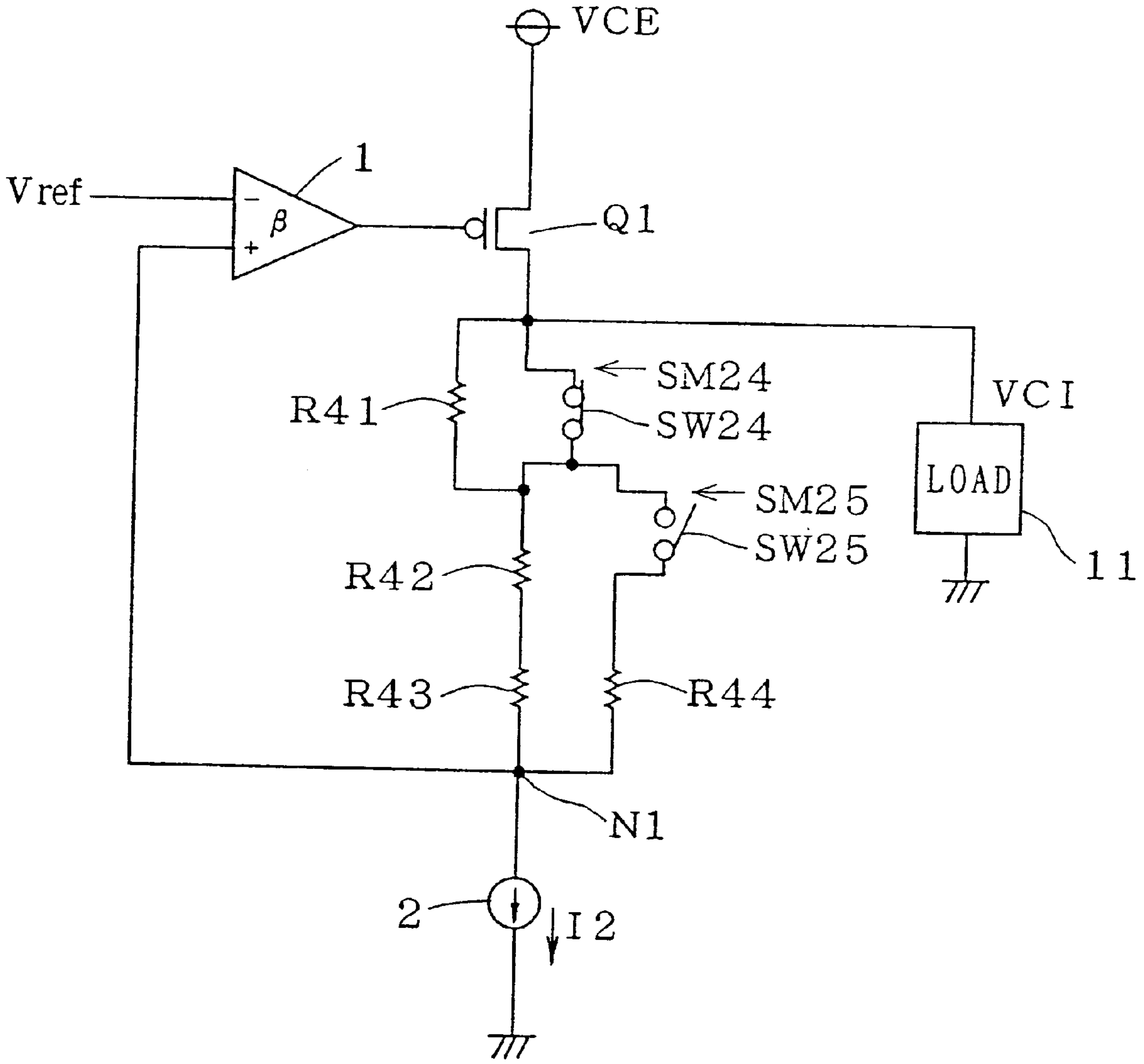
FIG. 48 is a circuit diagram of the internal power-source potential supply circuit according to a second mode of the eighteenth preferred embodiment of the present invention.

FIG. 48 is a circuit diagram of the internal power-source potential supply circuit according to a second mode of the eighteenth preferred embodiment of the present invention. As shown in FIG. 48, the drain of the PMOS transistor Q1 is connected to a first end of a resistor R41 and is connected to a second end of the resistor R41 through a switch SW24.

In-series connected resistors R42 and R43 and in-series connected switch SW25 and resistor R44 are connected in parallel between the second end of the resistor R41 and the node N1. The switches SW24 and SW25 turn on/off in response to selection signals SM24 and SM25, respectively. Other constructions of the second mode are similar to those of the first mode.

In such an arrangement, the selection signal SM24 is normally fixed so as to direct the switch SW24 to be in the ON position, and the resistance of the resistor R41 does not contribute to the generation of the internal power-source potential VCI. If the selection signal SM24 is changed to direct the switch SW24 to be in the OFF position, the resistance of the resistor R41 becomes valid and the internal power-source potential VCI shifts to a higher level. Both of the switches SW24 and SW25 may be turned on to cause only the resistor R44 having a resistance lower than a resistance used for generating the internal power-source potential VCI to contribute to the generation of the internal power-source potential VCI, thereby lowering the level of the internal power-source potential VCI.

In this manner, the second mode of the eighteenth preferred embodiment may vary the total resistance of the resistors R41 to R44 by turning on/off the switches SW24 and SW25 in accordance with the applications such as the chip test, data retention mode, and sleep mode, to achieve the variable internal power-source potential VCI, with the range of variation of the second mode wider than that of the first mode.

<Third Mode>

Figure 49:
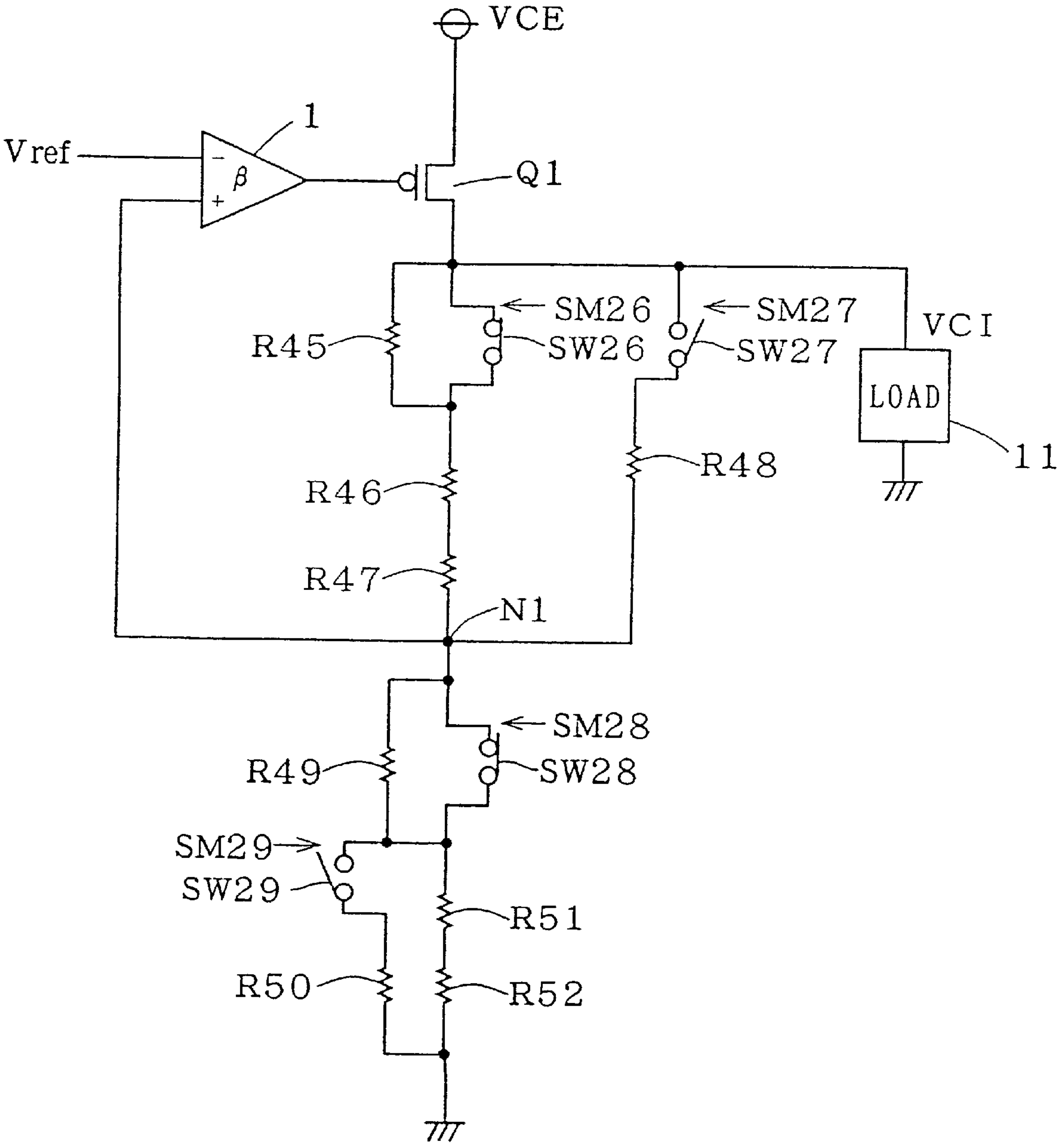
FIG. 49 is a circuit diagram of the internal power-source potential supply circuit according to a third mode of the eighteenth preferred embodiment of the present invention.

FIG. 49 is a circuit diagram of the internal power-source potential supply circuit according to a third mode of the eighteenth preferred embodiment of the present invention. As shown in FIG. 49, the drain of the PMOS transistor Q1 is connected to a first end of a resistor R45, connected to a second end of the resistor R45 through a switch SW26, and connected to a first end of a resistor R48 through a switch SW27.

The resistors R42 and R43 are connected in series between the second end of the resistor R45 and the node N1. The switches SW26 and SW27 turn on/off in response to selection signals SM26 and SM27, respectively.

Resistors R49 to R52 and switches SW28 and SW29 are connected between the node N1 and the ground in place of the current source 2. The node N1 is connected to a first end of the resistor R49 and connected to a second end of the resistor R49 through the switch SW28. The in-series connected switch SW29 and resistor R50, and the in-series connected resistors R51 and R52 are connected in parallel between the second end of the resistor R49 and the ground. The switches SW28 and SW29 turn on/off in response to selection signals SM28 and SM29, respectively. Other constructions of the third mode are similar to those of the first mode.

Between the drain of the PMOS transistor Q1 and the node N1 as above constructed, the selection signal SM26 is normally fixed so as to direct the switch SW26 to be in the ON position, and the resistance of the resistor R45 does not contribute to the generation of the internal power-source potential VCI. If the selection signal SM26 is changed to direct the switch SW26 to be in the OFF position, the resistance of the resistor R45 becomes valid, and the internal power-source potential VCI shifts to a higher level. Further, both of the switches SW26 and SW27 may be turned on to cause only the resistor R44 having a resistance lower than the resistance used to generate the internal power-source potential VCI to contribute to the generation of the internal power-source potential VCI, thereby lowering the level of the internal power-source potential VCI.

Between the node N1 and the ground, on the other hand, the selection signal SM28 is normally fixed so as to direct the switch SW28 to be in the ON position, and the resistance of the resistor R49 does not contribute to the generation of the internal power-source potential VCI. If the selection signal SM28 is changed to direct the switch SW28 to be in the OFF position, the resistance of the resistor R49 becomes valid, and the amount of current drawn from the node N1 increases. Then the internal power-source potential VCI shifts to a lower level. Further, both of the switches SW28 and SW29 may be turned on to cause only the resistor R50 to contribute to the generation of the internal power-source potential VCI This decreases the amount of current drawn from the node N1 to lower the level of the internal power-source potential VCI.

In this manner, the third mode of the eighteenth preferred embodiment may turn on/off the switches SW26 to SW29 in accordance with the applications such as the chip test, data retention mode, and sleep mode, to vary the resistance between the drain of the PMOS transistor Q1 and the node N1 and the resistance between the node N1 and the ground, achieving the variable internal power-source potential VCI, with the range of variation of the third mode wider than that of the first and second modes and with an accuracy higher than that of the first and second modes. Therefore, the internal power-source potential VCI may meet a variety of user requirements.

Nineteenth Preferred Embodiment

Figure 50:
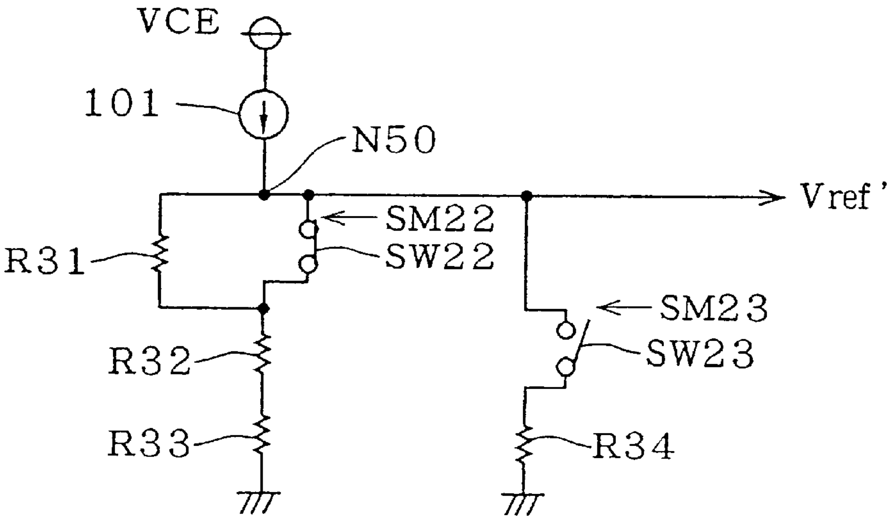
FIGS. 50 and 51 are circuit diagrams of the internal power-source potential supply circuit according to a nineteenth preferred embodiment of the present invention.
Figure 51:
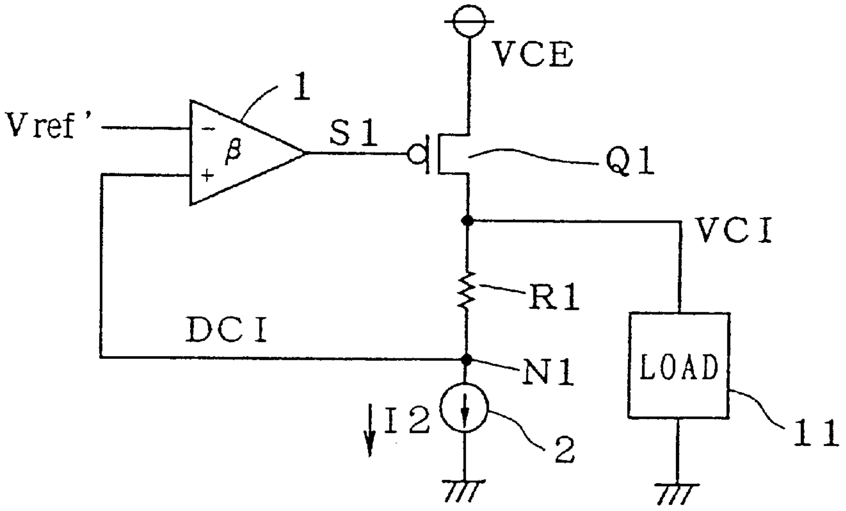

FIGS. 50 and 51 are circuit diagrams of the internal power-source potential supply circuit according to a nineteenth preferred embodiment of the present invention. As shown in FIG. 50, a current source 101 is connected between the external power-source potential VCE and a node N50. The node N50 is connected to a first end of a resistor R31 and connected to a second end of the resistor R31 through a switch SW22. The second end of the resistor R31 is grounded through resistors R32 and R33. The node N50 is grounded through a switch SW23 and a resistor R34. A voltage at the node N50 is applied as a reference potential Vref to the negative input of the comparator 1. Other constructions of the nineteenth preferred embodiment are similar to those of the first preferred embodiment shown in FIG. 1.

In such an arrangement, the selection signal SM21 is normally fixed so as to direct the switch SW21 to be in the ON position, and the resistance of the resistor R31 does not contribute to the generation of the reference potential Vref. If the selection signal SM21 is changed to direct the switch SW21 to be in the OFF position, the resistance of the resistor R31 becomes valid, and the reference potential Vref shifts to a higher level. As a result, the internal power-source potential VCI shifts to a higher level. Further, both of the switches SW21 and SW23 may be turned on to cause only the resistor R34 having a lower resistance to contribute to the generation of the reference potential Vref. This decreases the reference potential Vref to lower the level of the internal power-source potential VCI.

In this manner, the internal power-source potential supply circuit of the nineteenth preferred embodiment may vary the total resistance of the resistors R31 to R34 by turning on/off the switches SW22 and SW23 in accordance with the applications such as the chip test, data retention mode, and sleep mode, to achieve the variable internal power-source potential VCI.

Twentieth Preferred Embodiment

<First Mode>

Figure 52:
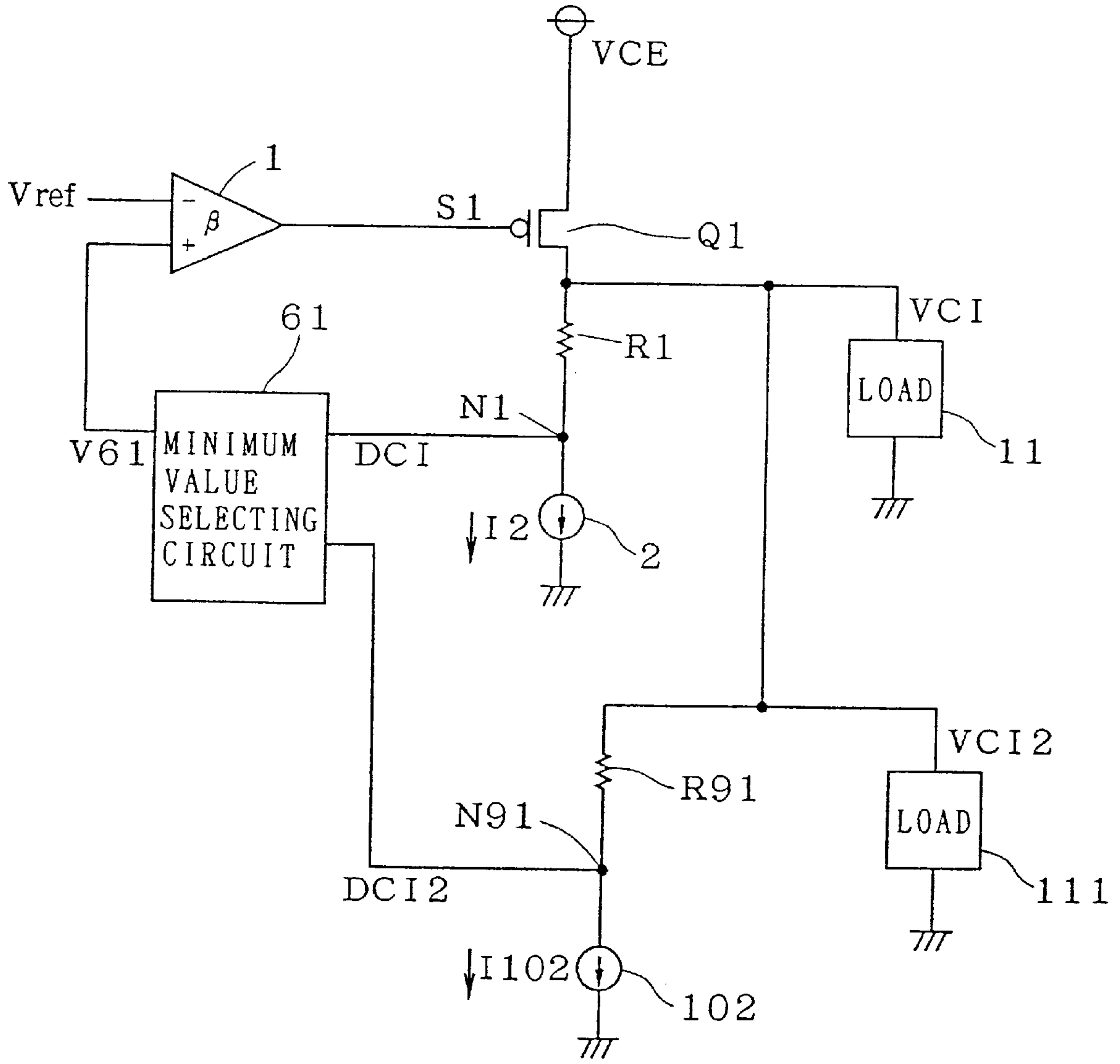
FIG. 52 is a circuit diagram of the internal power-source potential supply circuit according to a first mode of a twentieth preferred embodiment of the present invention.

FIG. 52 is a circuit diagram of the internal power-source potential supply circuit according to a first mode of a twentieth preferred embodiment of the present invention. As shown in FIG. 52, the external power-source potential VCE is connected to the source of the PMOS transistor Q1, and the drain of the PMOS transistor Q1 provides the internal power-source potential VCI and the internal power-source potential VCI2 to loads 11 and 111, respectively. The control signal S1 is applied from the comparator 1 to the gate of the PMOS transistor Q1. The comparator 1 has the negative input receiving the reference potential Vref and the positive input receiving a minimum value output voltage V61 as the feedback signal, and outputs the control signal S1 on the basis of the result of comparison between the reference potential Vref and the minimum value output voltage V61.

The drain of the PMOS transistor Q1 is connected to the first end of the resistor R1 and a first end of a resistor R91. The current source 2 is connected between the second end of the resistor R1 and the ground. A current source 102 is connected between a second end of the resistor R91 and the ground The divided internal power-source potential DCI provided at the node N1 serving as the second end of the resistor R1 and the second divided internal power-source potential DCI2 provided at a node N91 serving as the second end of the resistor R91 are applied to a minimum value selecting circuit 61. It should be noted that the resistance of the resistor R91 and a current I102 from the current source 102 are equal to the resistance of the resistor R1 and the current I2.

The minimum value selecting circuit 61 receives the divided internal power-source potential DCI and the second divided internal power-source potential DCI2 to provide the lower one of the potentials DCI and DCI2 as the minimum value output voltage V61 to the positive input of the comparator 1.

This arrangement determines the control signal S1 of the comparator 1 unfailingly on the basis of the lower one of the divided internal power-source potential DCI and the second divided internal power-source potential DCI2 to accomplish control such that the divided internal power-source potential DCI (DCI2) corresponding to one of the loads 11 and 111 which consumes more current is in a stable state.

<Second Mode>

Figure 53:
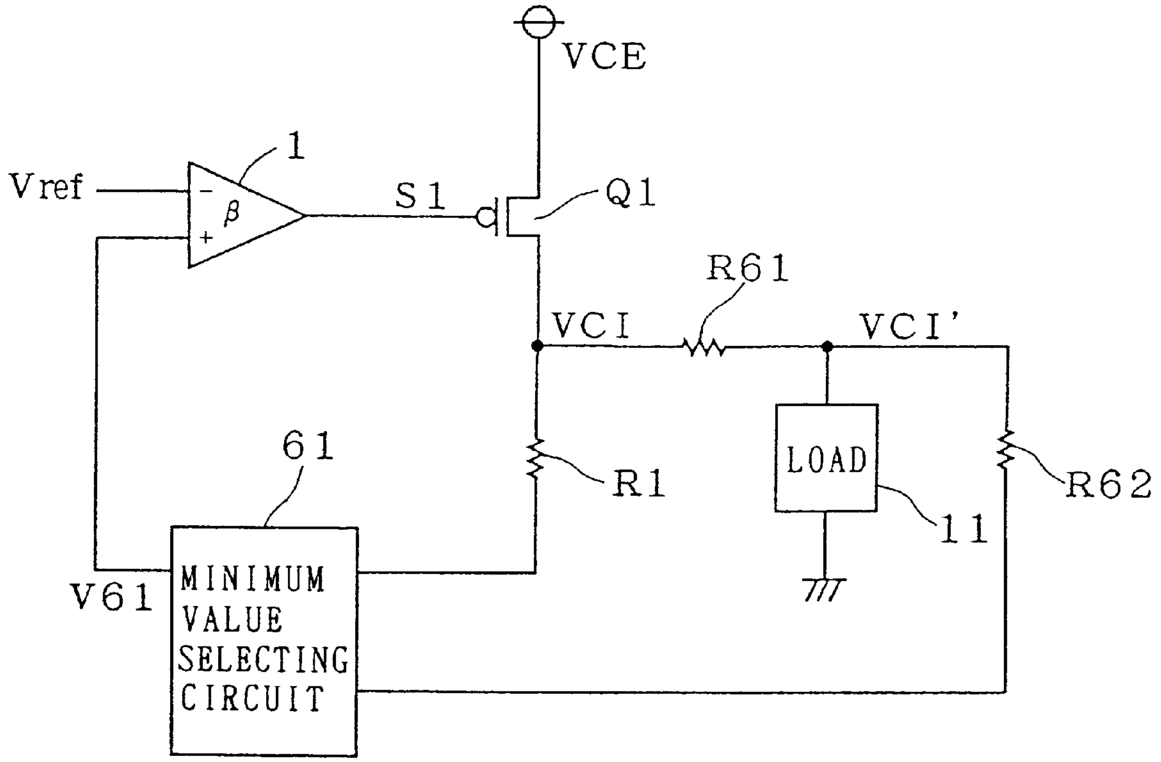
FIG. 53 is a circuit diagram of the internal power-source potential supply circuit according to a second mode of the twentieth preferred embodiment of the present invention.

FIG. 53 is a circuit diagram of the internal power-source potential supply circuit according to a second mode of the twentieth preferred embodiment of the present invention. As shown in FIG. 53, the external power-source potential VCE is connected to the source of the PMOS transistor Q1. The internal power-source potential VCI from the drain of the PMOS transistor Q1 is applied as an internal power-source potential VCI' to the load 11 through a resistor R61. Since the resistance of the resistor R61 is in a non-negligible amount, the internal power-source potential VCI practically received by the load 11 is lower than the internal power-source potential VCI.

The control signal S1 is applied from the comparator 1 to the gate of the PMOS transistor Q1. The comparator 1 has the negative input receiving the reference potential Vref and the positive input receiving the minimum value output voltage V61 as the feedback signal, and outputs the control signal S1 on the basis of the result of comparison between the reference potential Vref and the minimum value output voltage V61.

The internal power-source potential VCI from the drain of the PMOS transistor Q1 is applied to the minimum value selecting circuit 61 through the resistor R1, and the internal power-source potential VCI' is applied to the minimum value selecting circuit 61 through a resistor R62. The resistance of the resistor R62 may adjust time to charge the load 11.

The minimum value selecting circuit 61 receives the internal power-source potential VCI and the internal power-source potential VCI' to apply the lower one of the potentials VCI and VCI' as the minimum value output voltage V61 to the positive input of the comparator 1.

This arrangement determines the control signal S1 of the comparator 1 unfailingly on the basis of the lower one of the internal power-source potential VCI and the internal power-source potential VCI' to accomplish control such that the internal power-source potential VCI' is in a stable state.

For example, the influence resulting from the decrease in the external power-source potential VCE appears earlier upon the internal power-source potential VCI. Thus, the minimum value selecting circuit 61 selects the internal power-source potential VCI as the minimum value output voltage V61. If the influence of the resistor R61 and the load 11 decreases the internal power-source potential VCI' the minimum value selecting circuit 61 selects the internal power-source potential VCI' as the minimum value output voltage V61.

<Third Mode>

Figure 54:
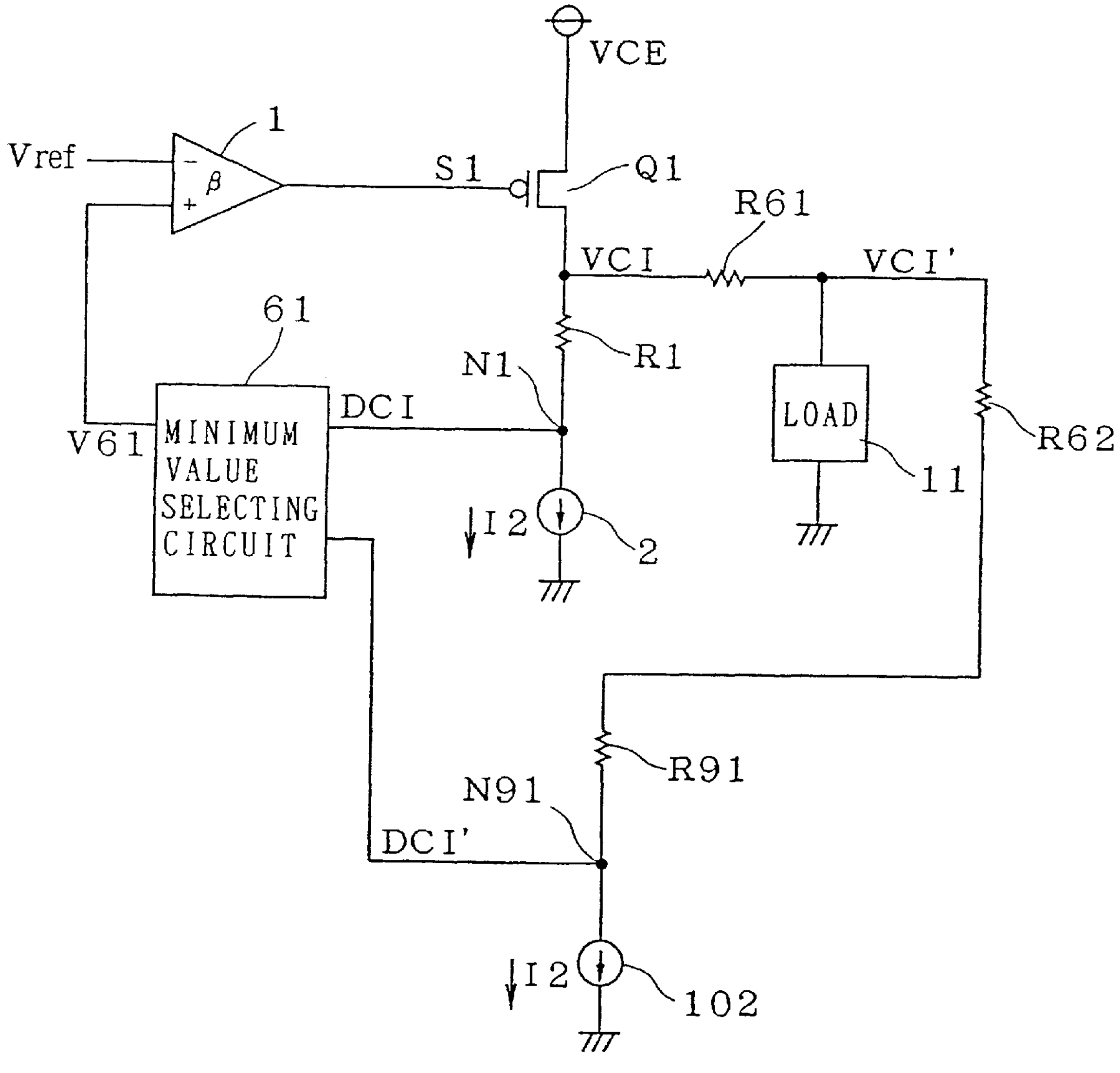
FIG. 54 is a circuit diagram of the internal power-source potential supply circuit according to a third mode of the twentieth preferred embodiment of the present invention.

FIG. 54 is a circuit diagram of the internal power-source potential supply circuit according to a third mode of the twentieth preferred embodiment of the present invention. As shown in FIG. 54, the external power-source potential VCE is connected to the source of the PMOS transistor Q1, and the internal power-source potential VCI from the drain of the PMOS transistor Q1 is applied as the internal power-source potential VCI' to the load 11 through the resistor R61. Since the resistance of the resistor R61 is in a non-negligible amount, the internal power-source potential VCI' practically received by the load 11 is lower than the internal power-source potential VCI.

The control signal S1 is applied from the comparator 1 to the gate of the PMOS transistor Q1. The comparator Q1 has the negative input receiving the reference potential Vref and the positive input receiving the minimum value output voltage V61 as the feedback signal, and outputs the control signal S1 on the basis of the result of comparison between the reference potential Vref and the minimum value output voltage V61.

The internal power-source potential VCI from the drain of the PMOS transistor Q1 is grounded through the resistor R1 and the current source 2, and the internal power-source potential VCI' is grounded through the resistor R61, the resistor R91, and the current source 102. The divided internal power-source potential DCI provided at the node N1 serving as the second end of the resistor R1 and a divided internal power-source potential DCI' provided at the node N91 serving as the second end of the resistor R91 are applied to the minimum value selecting circuit 61. It should be noted that the resistance of the resistor R91 and the current I102 from the current source 102 are equal to the resistance of the resistor R1 and the current I2. The resistance of the resistor R62 may adjust time to charge the load 11.

The minimum value selecting circuit 61 receives the divided internal power-source potential DCI and the divided internal power-source potential DCI' to apply the lower one of the potentials DCI and DCI' as the minimum value output voltage V61 to the positive input of the comparator 1.

For example, the influence resulting from the decrease in the external power-source potential VCE appears earlier upon the internal power-source potential VCI. Thus, the minimum value selecting circuit 61 selects the divided internal power-source potential DCI as the minimum value output voltage V61. If the influence of the resistor R61 and the load 11 decreases the internal power-source potential VCI', the minimum value selecting circuit 61 selects the divided internal power-source potential DCI' as the minimum value output voltage V61.

This arrangement determines the control signal S1 of the comparator 1 on the basis of the lower one of the divided internal power-source potential DCI and the divided internal power-source potential DCI' to accomplish control such that the divided internal power-source potential DCI (DCI') corresponding to one of the loads 11 and 111 which consumes more current is in a stable state.

Twenty-first Preferred Embodiment

<First Mode>

Figure 55:
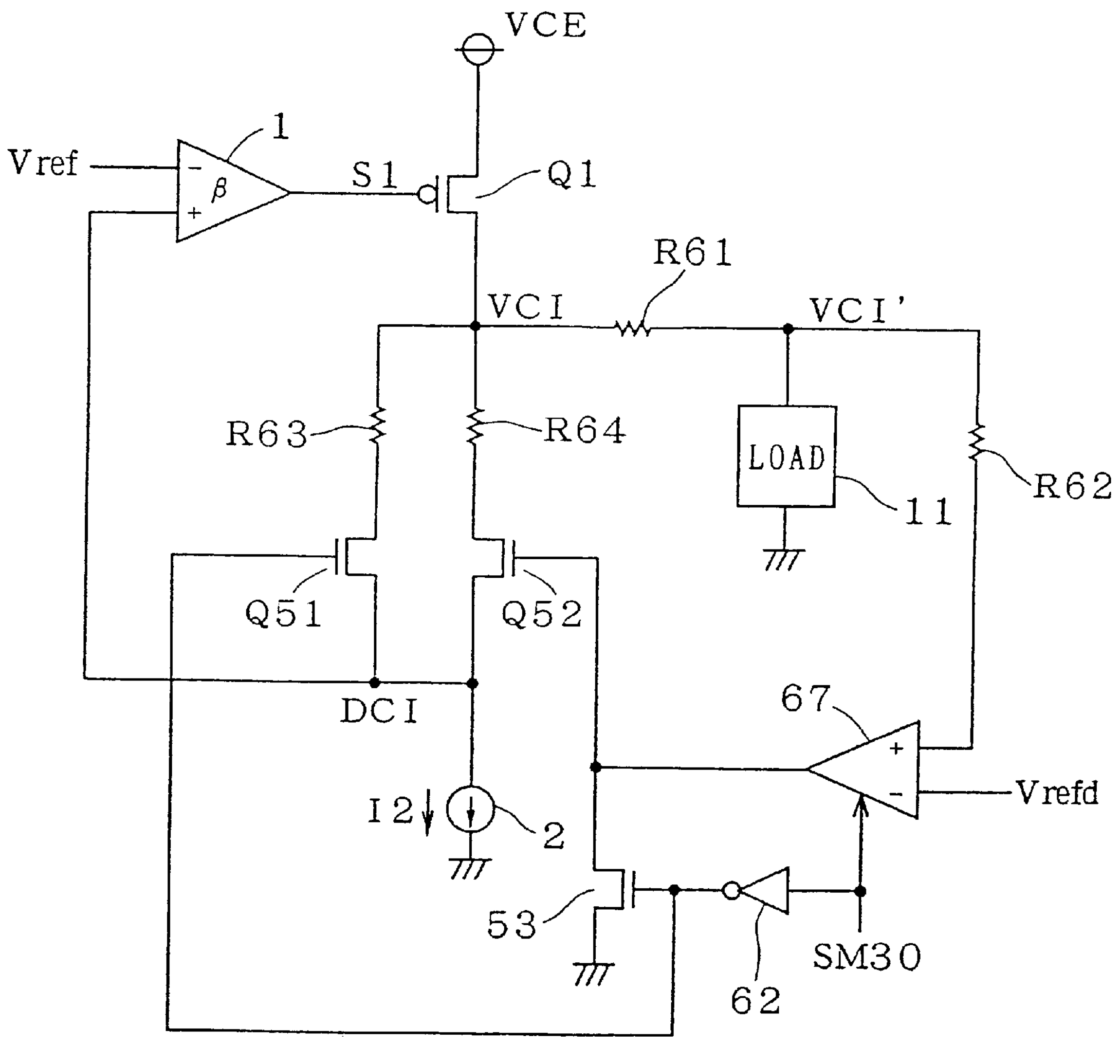
FIG. 55 is a circuit diagram of the internal power-source potential supply circuit according to a first mode of a twenty-first preferred embodiment of the present invention.

FIG. 55 is a circuit diagram of the internal power-source potential supply circuit according to a first mode of a twenty-first preferred embodiment of the present invention. As shown in FIG. 55, the external power-source potential VCE is connected to the source of the PMOS transistor Q1, and the internal power-source potential VCI from the drain of the PMOS transistor Q1 is applied as the internal power-source potential VCI' to the load 11 through the resistor R61. Since the resistance of the resistor R61 is in a non-negligible amount, the internal power-source potential VCI' practically received by the load 11 is lower than the internal power-source potential VCI.

The control signal S1 is applied from the comparator 1 to the gate of the PMOS transistor Q1. The comparator 1 has the negative input receiving the reference potential Vref and the positive input receiving the divided internal power-source potential DCI as the feedback signal, and outputs the control signal S1 on the basis of the result of comparison between the reference potential Vref and the divided internal power-source potential DCI.

The internal power-source potential VCI from the drain of the PMOS transistor Q1 is connected to the node N1 through a resistor R63 and an NMOS transistor Q51 and connected to the node N1 through a resistor R64 and an NMOS transistor Q52. The current source 2, is connected between the node N1 and the ground.

The internal power-source potential VCI' is applied to the positive input of a comparator 67 through the resistor R62. The comparator 67 has a negative input receiving a reference potential Vrefd (>Vref. The comparator 67 is controlled to be active/inactive in response to a selection signal SM30 which is "H"/"L". The output from the comparator 67 is applied to the gate of the NMOS transistor Q52.

The selection signal SM30 is applied to the gates of NMOS transistors Q51 and Q53 through an inverter 62. The NMOS transistor Q53 has a drain connected to the gate of the NMOS transistor Q52, and a source grounded.

In the first mode of the twenty-first preferred embodiment, the path for generation of the divided internal power-source potential DCI includes a first divided path comprised of the resistor R63 and the NMOS transistor Q51. and a second divided path comprised of the resistor R6 4 and the NMOS transistor R52.

In normal operation, the selection signal SM30 is set to "L" to make the comparator 67 inactive and to turn on the NMOS transistors Q51 and Q53, enabling the first divided path comprised of the resistor R63 and the NMOS transistor Q51. The result is the operation of a circuit arrangement equivalent to the first preferred embodiment.

In special operation such as a sleep mode and a high-frequency operation mode, the selection signal SM30 is set to "H" to make the comparator 67 active and to turn off the NMOS transistors Q51 and Q53, enabling the second divided path comprised of the resistor R64 and the NMOS transistor Q52.

Consequently, the comparator 67 compares the internal power-source potential VCI' with the reference potential Vrefd to feed back the output of the comparator 67 to the gate of the NMOS transistor Q52 of the second divided path. If the internal power-source potential VCI' is lower than the reference potential Vrefd, the output from the comparator 67 is low to decrease the gate potential of the NMOS transistor Q52 receiving the output from the comparator 67, increasing the channel resistance of the NMOS transistor Q52. Accordingly, a voltage drop (VCI−DCI) caused by the resistance of the second divided path increases to raise the internal power-source potential VCI of the internal power-source potential supply circuit, or the internal power-source potential VCI'.

In this manner, the internal power-source potential supply circuit of the first mode of the twenty-first preferred embodiment includes the two divided paths and selectively uses the two divided paths in accordance with applications on the basis of the selection signal SM30 to generate the internal power-source potential VCI.

<Second Mode>

Figure 56:
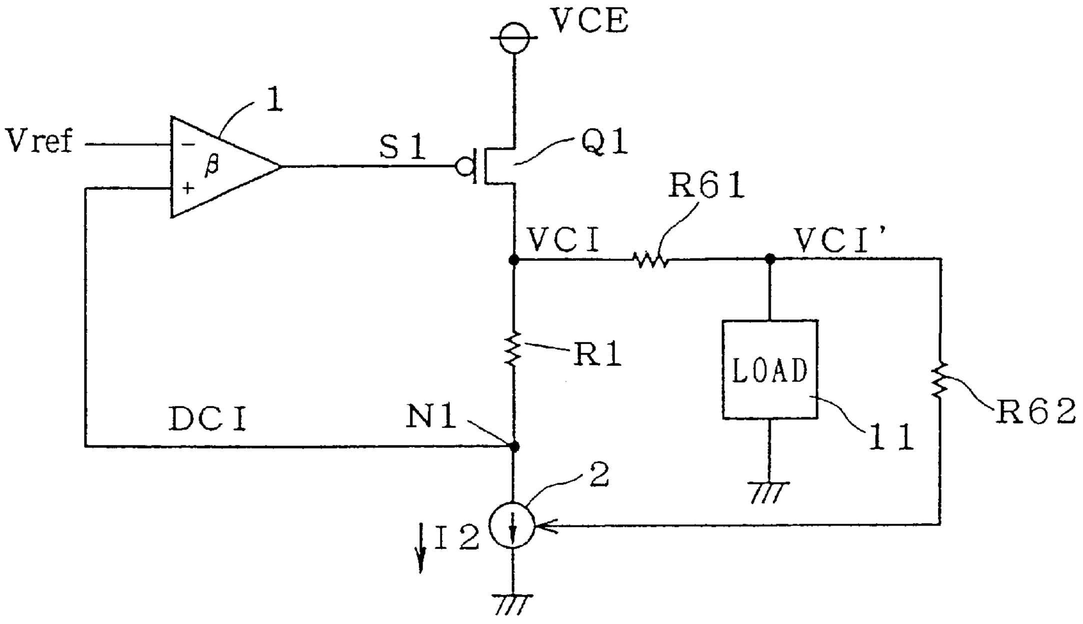
FIG. 56 is a circuit diagram of the internal power-source potential supply circuit according to a second mode of the twenty-first preferred embodiment of the present invention.

FIG. 56 is a circuit diagram of the internal power-source potential supply circuit according to a second mode of the twenty-first preferred embodiment of the present invention. As shown in FIG. 56, the external power-source potential VCE is connected to the source of the PMOS transistor Q1, and the internal power-source potential VCI from the drain of the PMOS transistor Q1 is applied as the internal power-source potential VCI' to the load 11 through the resistor R61. Since the resistance of the resistor R61 is in a non-negligible amount, the internal power-source potential VCI' practically received by the load 11 is lower than the internal power-source potential VCI.

The control signal S1 is applied from the comparator 1 to the gate of the PMOS transistor Q1. The comparator 1 has the negative input receiving the reference potential Vref and the positive input receiving the divided internal power-source potential DCI as the feedback signal, and outputs the control signal S1 on the basis of the result of comparison between the reference potential Vref and the divided internal power-source potential DCI.

The internal power-source potential VCI from the drain of the PMOS transistor Q1 is grounded through the resistor R1 and the current source 2. The internal power-source potential VCI' is applied to the current source 2 through the resistor R62 as a control signal for the current source 2.

Such an arrangement may adjust the amount of current I2 from the current source 2 on the basis of the internal power-source potential VCI' to perform control so that the internal power-source potential VCI is in a stable state.

Figure 57:
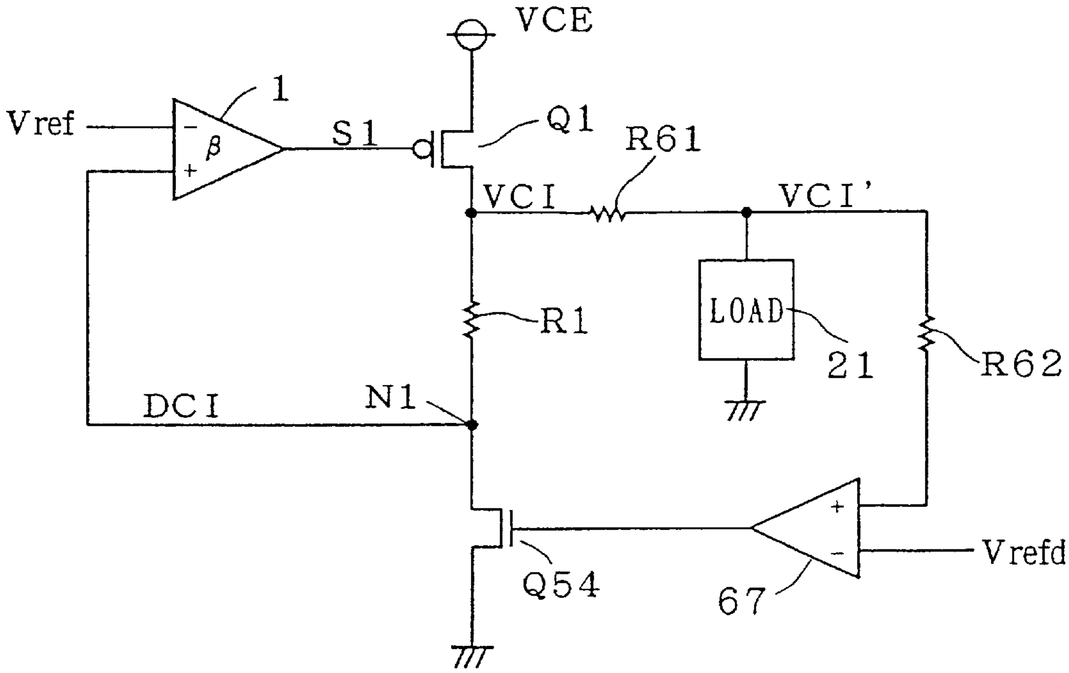
FIG. 57 is a circuit diagram of a specific form of the circuit of FIG. 56.

FIG. 57 is a circuit diagram showing a specific form of the circuit of FIG. 56. As shown in FIG. 57, an NMOS transistor Q54 is provided as the current source 2. The internal power-source potential VCI' is applied to the positive input of the comparator 67 through the resistor R62, and the reference potential Vrefd is applied to the negative input of the comparator 67. Other constructions of FIG. 57 are similar to those of FIG. 56.

In this structure, the comparator 67 compares the internal power-source potential VCI' with the reference potential Vrefd to feed back the output of the comparator 67 to the gate of the NMOS transistor Q52 serving as a variable current source. If the internal power-source potential VCI' is lower than the reference potential Vrefd, the output from the comparator 67 is high to increase the gate potential of the NMOS transistor Q54 receiving the output from the comparator 67, decreasing the channel resistance of the NMOS transistor Q54. Accordingly. the amount of current drawn from the node N1 by the NMOS transistor Q54 increases to increase a voltage drop (VCI–DCI), raising the internal power-source potential VCI of the internal power-source potential supply circuit, or the internal power-source potential VCI'.

The arrangements of the first and second modes of the twenty-first preferred embodiment allow current supply if the load performs the worst operation. The amount of current is sufficient if the operating current of the load should exceed a predicted value.

Twenty-second Preferred Embodiment

<First Mode>

Figure 58:
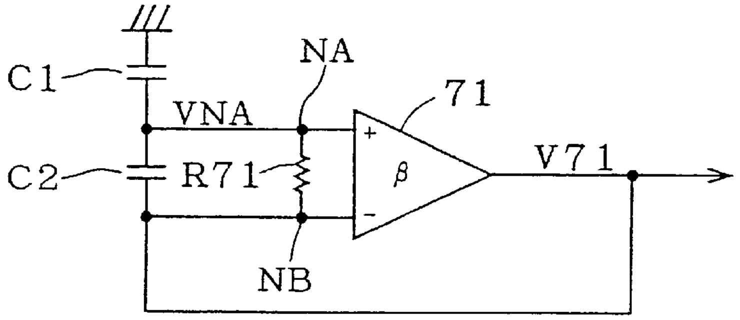
FIG. 58 is a circuit diagram of a variation detecting type internal power-source potential supply circuit according to a first mode of a twenty-second preferred embodiment of the present invention.

FIG. 58 is a circuit diagram of a variation detecting type internal power-source potential supply circuit according to a first mode of a twenty-second preferred embodiment of the present invention. As shown in FIG. 58, a resistor R71 and a capacitor C2 are connected in parallel between a node NA serving as a positive input terminal of a comparator 71 and a node NB serving as a negative input terminal thereof. A capacitor C1 is connected between the node NA and the ground. An output potential V71 from the comparator 71 is applied to the node NB as a feedback potential.

With this arrangement, when the comparator 71 is in a stable state, that is, when a potential VNA at the node NA equals the feedback potential V71 at the output node, the comparator 71 is normally established not to act upon the output node. The absolute potential of the output node of the comparator 71 at this time is set in a separate internal power-source potential generating circuit (not shown in FIG. 58) for outputting an absolute value. The internal power-source potential generating circuit for outputting the absolute value means a circuit constructed to control the output potential level in the form of the absolute value by using the reference potential Vref, such as the internal power-source potential supply circuit of the first preferred embodiment shown in FIG. 1.

If the output potential V71 of the comparator 71 varies, the capacitors C1 and C2 detect the variation to vary the potential VNA at the node NA. The output potential V71 of the output node is restored by the difference between the varied potential VNA at the node NA and the feedback potential V71 at the output node. The variation in the potential VNA at the node NA is determined by the charge distribution between the capacitor C2 formed between the node NA and the node NB serving as a feedback portion from the output node and the capacitor C1 formed between the node NA and a fixed potential (the ground level herein).

Thus, the variation in the potential VNA at the node NA is definitely less than the variation in the output potential V71. The difference between the variation in the potential VNA and the variation in the output potential V71 is transmitted to the comparator 71 serving as an amplifier. The comparator 71 operates during the presence of the potential difference and acts to restore the output node to the original potential. The time period of this operation is determined by the length of time required until the potential VNA at the node NA equals the feedback potential V71 at the output node through the resistor R71 formed between the nodes NA and NB. The time period of operation varies depending upon the capacitance of the capacitors C1 and C2 and the resistance of the resistor R71.

For example, if the output potential V71 of the comparator 71 shifts to a lower level, the potential VNA at the node NA shifts to a lower level because of a capacitor coupling of the capacitors C1 and C2 but the variation in potential VNA is less than the variation in the output potential V71. Thus, the output potential V71 is relatively lower than the potential at the node NA, and the comparator 71 receives the potential difference therebetween to operate. As a result, the comparator 71 acts to raise the output level to restore the lowered output potential V71 at the output node.

If the output potential V71 of the comparator 71 shifts to a higher level, on the other hand, the potential VNA at the node NA shifts to a higher level because of the capacitor coupling but the variation in the potential VNA is less than the variation in the feedback potential V71 at the output node. Thus, the output potential V71 is relatively higher than the potential VNA, and the comparator 71 receives the potential difference therebetween to operate. The comparator 71 acts to lower the output potential V71 to restore the raised output potential V71 at the output node.

The capacitors C1 and C2 may be dispensed with in the circuit arrangement of the first mode of the twenty-second preferred embodiment. In this case, the potential VNA at the node NA equals the output potential V71 in the stable state. However, if the output potential V71 varies, the potential VNA at the node NA varies to follow the variation in the output potential V71 after an elapse of a predetermined delay time.

While the potential VNA follows the variation in the output potential V71, a potential difference exists between the potential VNA at the node NA and the feedback potential V71 at the output node. The comparator 71 detects the potential difference to restore the potential at the output node. Thus, the time period over which the comparator 71 operates is the time period over which the potential difference exists between the potential VNA at the node NA and the feedback potential V71 at the output node. Varying the resistance of the resistor R71 may suitably change the setting of the time period of operation.

The internal power-source potential supply circuit of the twenty-second to twenty-fifth preferred embodiments shown in FIGS. 58 to 66 may be regarded as an output potential supply circuit for outputting the output potential V71 or the internal power-source potential VCI.

<Second Mode>

Figure 59:
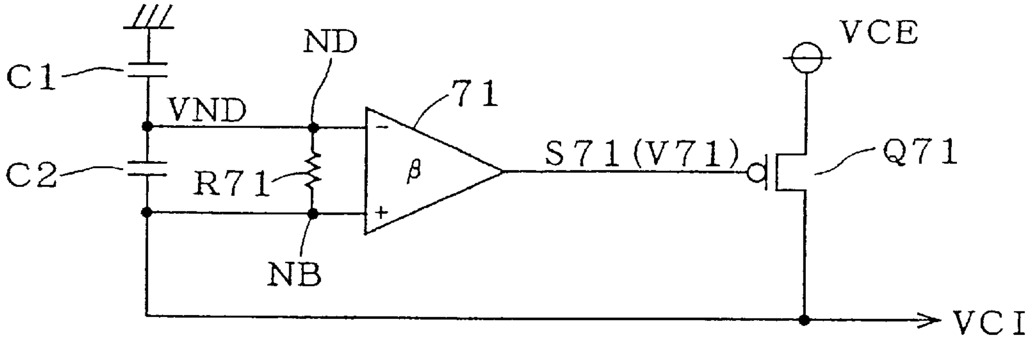
FIG. 59 is a circuit diagram of the variation detecting type internal power-source potential supply circuit according to a second mode of the twenty-second preferred embodiment of the present invention.

FIG. 59 is a circuit diagram of the variation detecting type internal power-source potential supply circuit according to a second mode of the twenty-second preferred embodiment of the present invention. As shown in FIG. 59, the resistor R71 and the capacitor C2 are connected in parallel between a node ND serving as the negative input terminal of the comparator 71 and a node NC serving as the positive input terminal thereof. The capacitor C1 is connected between the node ND and the ground. The output potential V71 from the comparator 71 is applied as a control signal S71 to the gate of a PMOS driver transistor Q71. The driver transistor Q71 has a source connected to the external power-source potential VCE and a drain for providing the internal power-source potential VCI which is a feedback potential to the node NC. With this arrangement, when the comparator 71 is in the stable state, that is, when a potential VND at the node ND equals the feedback potential VCI at the output node, the comparator 71 is normally established not to cause a current flow in the driver transistor Q71. The absolute potential of the output node of the comparator 71 at this time is set in a separate internal power-source potential generating circuit (not shown in FIG. 59) for outputting an absolute value.

If the internal power-source potential VCI varies, the capacitors C1 and C2 detect the variation to vary the potential VND at the node ND. The output node is restored by the difference between the varied potential VND and the internal power-source potential VCI. The variation in the potential VND at the node ND is determined by the charge distribution between the capacitor C2 formed between the node ND and the node NC and the capacitor C1 formed between the node ND and a fixed potential (the ground level herein). Thus, the variation in the potential VND at the node ND is definitely less than the variation in the internal power-source potential VCI. The difference between the variation in the potential VND at the node ND and the variation in the internal power-source potential VCI at this time is transmitted to the comparator 71. The comparator operates while the potential difference exists and drives the driver transistor Q71 by using the control signal S71 to restore the output node to the original potential.

The time period of this operation is determined by the length of time required until the potential VND at the node ND equals the feedback potential V71 at the output node through the resistor R71 formed between the nodes ND and NC. The time period of operation varies depending upon the capacitance of the capacitors C1 and C2 and the resistance of the resistor R71. It is significant to note that the comparator 71 operates only when the internal power-source potential VCI decreases.

If the internal power-source potential VCI shifts to a lower level, the potential VND at the node ND shifts to a lower level because of the capacitor coupling of the capacitors C1 and C2 but the variation in potential VND is less than the variation in the internal power-source potential VCI serving as the feedback potential. Thus, the internal power-source potential VCI is relatively lower than the potential VND at the node ND, and the comparator 71 receives the potential difference therebetween to operate. The comparator 71 cause the drive r transistor Q71 to conduct heavily. This cause a current flow through the driver transistor Q71 to restore the lowered internal power-source potential VCI.

If the internal power-source potential VCI shifts to a higher level, on the other hand, the potential VND at the node ND shifts to a higher level because of the capacitor coupling but the variation in the potential VND is less than the variation in the internal power-source potential VCI. Thus, the internal power-source potential VCI is relatively higher than the potential VND, and the comparator 71 receives the potential difference therebetween to operate. The comparator 71 acts to change the gate potential of the driver transistor Q71 so that the driver transistor Q71 turns off. However, if the driver transistor Q71 is in the OFF position in the stable state, no changes occur in the internal power-source potential VCI.

The capacitors C1 and C2 may be dispensed with in the circuit arrangement of the second mode of the twenty-second preferred embodiment. In this case, the potential VND at the node ND equals the internal power-source potential VCI in the stable state. However, if the internal power-source potential VCI varies, the potential VND at the node ND varies to follow the variation in the internal power-source potential VCI after an elapse of a predetermined delay time. While the potential VND follows the variation in the internal power-source potential VCI, a potential difference exists between the potential VND at the node ND and the internal power-source potential VCI. The comparator 71 detects the potential difference to restore the potential at the output node. Thus, the time period over which the comparator 71 operates is the time period over which the potential difference exists between the potential VND at the node ND and the internal power-source potential VCI. Varying, the resistance of the resistor R71 may suitably change the setting of the time period of operation.

Figure 60:
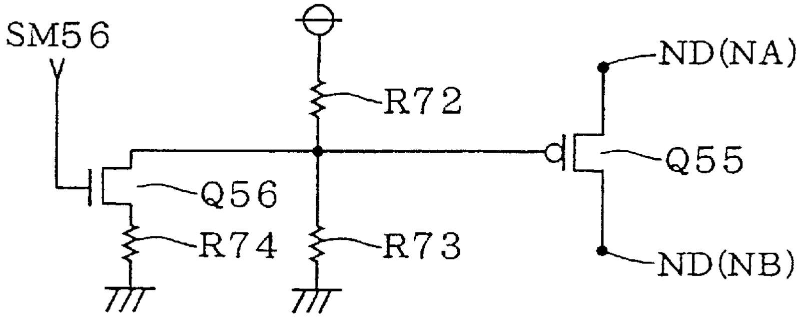
FIG. 60 is a circuit diagram of a resistance element shown in FIG. 59.

The resistor R71 may be replaced with a variable resistance element as shown in FIG. 60. As shown in FIG. 60, a PMOS transistor Q55 is connected between the node ND and the node NC. Resistors R72 and R73 are connected between a power supply and the ground. An NMOS transistor Q56 has a drain connected to a node between the resistors R71 and R72 and connected to the gate of the PMOS transistor Q55, a source grounded through a resistor R74, and a gate receiving, a selection signal SM56.

In such an arrangement, the PMOS transistor Q55 is used as a variable resistance element, and the gate potential of the PMOS transistor Q55 may be set to the selection signal SM56. In a high-speed operation mode wherein the cycle of the operation is short, it is necessary to change a delay between the nodes ND and NC by the resistance in accordance with the cycle.

For example, to decrease the amount of delay by the resistance during the high-speed operation, the gate potential of the PMOS transistor Q55 should be changed to a lower level. If the selection signal SM56 which is "H" during the high-speed operation is applied to the gate of the NMOS transistor Q56 to decrease the resistance thereof, the resistance of the PMOS transistor Q55 decreases to shorten the time period of the operation of the comparator 71.

The variable resistance element shown in FIG. 60 may be applied to the circuit of the first mode shown in FIG. 58. The variable resistance element may be formed using an NMOS transistor and a bipolar transistor as well as the structure of FIG. 60.

Twenty-third Preferred Embodiment

<First Mode>

Figure 61:
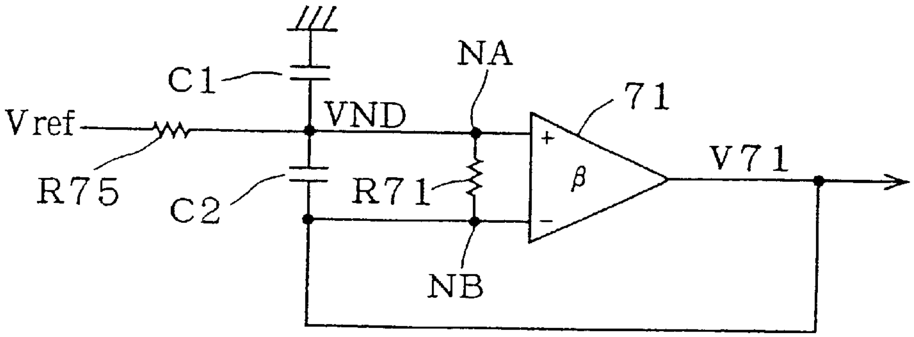
FIG. 61 is a circuit diagram of the internal power-source potential supply circuit according to a first mode of a twenty-third preferred embodiment of the present invention.

FIG. 61 is a circuit diagram of the internal power-source potential supply circuit according to a first mode of a twenty-third preferred embodiment of the present invention. As shown in FIG. 61, the resistor R71 and the capacitor C2 are connected in parallel between the node NA serving as the positive input terminal of the comparator 71 and the node NB serving as the negative input terminal thereof. The capacitor C1 is connected between the node NA and the ground. The output potential V71 from the comparator 71 is applied as the feedback potential to the node NB. The reference potential Vref is applied to the node NA through a resistor R75.

With this arrangement, when the comparator 71 is in the stable state. that is, when the potential VNA at the node NA equals the feedback potential V71 at the output node, the comparator 71 is normally established not to act upon the output node. The absolute potential of the output potential V71 at the output node of the comparator 71 at this time is specified by the reference potential since the reference potential Vref is applied to the node NA.

If the output potential V71 of the comparator 71 varies, the capacitors C1 and C2 detect the variation to vary the potential VNA at the node NA. The output potential V71 at the output node is restored by the difference between the varied potential VNA at the node NA and the feedback potential V71 at the output node. The variation in the potential VNA at the node NA is determined by the charge distribution between the capacitor C2 formed between the node NA and the node NB and the capacitor C formed between the node NA and the ground.

Thus, the variation in the potential VNA at the node NA is definitely less than the variation in the output potential V71. The difference between the variation in the potential VNA and the variation in the output potential V71 is transmitted to the comparator 71 serving as an amplifier. The comparator 71 operates while the potential difference exists and acts to restore the output node to the original potential. The time period of this operation is determined by the length of time required until the potential VNA at the node NA equals the feedback potential V71 at the output node through the resistor R71 formed between the nodes NA and NB. The time period of operation varies depending upon the capacitance of the capacitors Cl and C2 and the resistance of the resistor R71.

For example, if the output potential V71 of the comparator 71 shifts to a lower level, the potential VNA at the node NA shifts to a lower level because of the capacitor coupling of the capacitors C1 and C2 but the variation in potential VNA is less than the variation in the output potential V71. Thus, the output potential V71 is relatively lower than the potential at the node NA, and the comparator 71 receives the potential difference therebetween to operate. As a result, the comparator 71 acts to raise the output level to restore the lowered output potential V71 at the output node.

If the output potential V71 of the comparator 71 shifts to a higher level, on the other hand, the potential VNA at the node NA shifts to a higher level because of the capacitor coupling but the variation in the potential VNA is less than the variation in the feedback potential V71 at the output node. Thus, the output potential V71 is relatively higher than the potential VNA, and the comparator 71 receives the potential difference therebetween to operate. The comparator 71 acts to lower the output potential V71 to restore the raised output potential V71 at the output node.

During the high-speed operation, the reference potential Vref and the resistor R75 at the positive input of the comparator 71 allow the comparator 71 to independently execute the above operation without being influenced by the reference potential Vref.

The capacitors C1 and C2 may be dispensed with in the circuit arrangement of the first mode of the twenty-third preferred embodiment. In this case, the potential VNA at the node NA equals the output potential V71 in the stable state. However, if the output potential V71 varies, the potential VNA at the node NA varies to follow the variation in the output potential V71 after an elapse of a predetermined delay time.

While the potential VNA follows the variation in the output potential V71, a potential difference exists between the potential VNA at the node NA and the feedback potential V71 at the output node. The comparator 71 detects the potential difference to restore the potential at the output node. Thus, the time period over which the comparator 71 operates is the time period over which the potential difference exists between the potential VNA at the node NA and the feedback potential V71 at the output node. Varying the resistance of the resistor R71 may suitably change the setting of the time period of operation.

<Second Mode>

Figure 62:
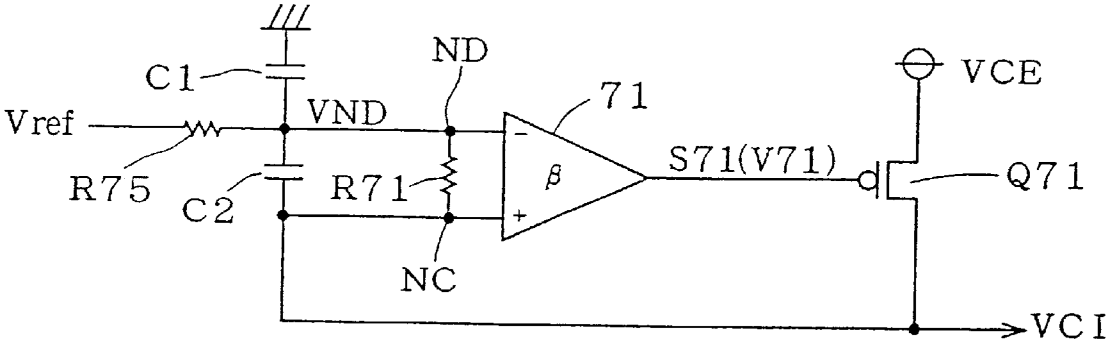
FIG. 62 is a circuit diagram of the internal power-source potential supply circuit according to a second mode of the twenty-third preferred embodiment of the present invention.

FIG. 62 is a circuit diagram of the internal power-source potential supply circuit according to a second mode of the twenty-third preferred embodiment of the present invention. As shown in FIG. 62, the resistor R71 and the capacitor C2 are connected in parallel between the node ND serving as the negative input terminal of the comparator 71 and the node NC serving as the positive input terminal thereof The capacitor C1 is connected between the node ND and the ground. The output potential V71 from the comparator 71 is applied as the control signal S71 to the gate of the PMOS driver transistor Q71. The driver transistor Q71 has the source connected to the external power-source potential VCE, and the drain for providing the internal power-source potential VCI which is the feedback potential to the node NC. The reference potential Vref is applied to the node ND through the resistor R75.

With this arrangement, when the comparator 71 is in the stable state, that is, when the potential VND at the node ND equals the feedback potential VCI at the output node, the comparator 71 is normally established not to cause a current flow in the driver transistor Q71. The absolute potential of the output potential V71 (the internal power-source potential VCI) at the output node of the comparator 71 at this time is specified by the reference potential Vref since the reference potential Vref is applied to the node NA.

If the internal power-source potential VCI varies, the capacitors C1 and C2 detect the variation to vary the potential VND at the node ND. The output node is restored by the potential difference between the varied potential VND and the internal power-source potential VCI. The variation in the potential VND of the node ND is determined by the charge distribution between the capacitor C2 formed between the node ND and the node NC and the capacitor C1 formed between the node ND and the ground. Thus, the variation in the potential VND at the node ND is definitely less than the variation in the internal power-source potential VCI. The difference between the variation in the potential VND at the node ND and the variation in the internal power-source potential VCI at this time is transmitted to the comparator 71. The comparator 71 operates while the potential difference exists and drives the driver transistor Q71 by using the control signal S71 to restore the output node to the original potential.

The time period of this operation is determined by the length of time required until the potential VND at the node ND equals the feedback potential V71 at the output node through the resistor R71 formed between the nodes ND and NC. The time period of operation varies depending upon the capacitance of the capacitors C1 and C2 and the resistance of the resistor R71. It is significant to note that the comparator 71 operates only when the internal power-source potential VCI decreases.

If the internal power-source potential VCI shifts to a lower level, the potential VND at the node ND shifts to a lower level because of the capacitor coupling of the capacitors C1 and C2 but the variation in potential VNA is less than the variation in the internal power-source potential VCI serving as the feedback potential. Thus, the internal power-source potential VCI is relatively lower than the potential VND at the node ND, and the comparator 71 receives the potential difference therebetween to operate. The comparator 71 cause the driver transistor Q71 to conduct heavily. This cause a current flow through the driver transistor Q71 to restore the lowered internal power-source potential VCI.

If the internal power-source potential VCI shifts to a higher level, on the other hand, the potential VND at the node ND shifts to a higher level because of the capacitor coupling but the variation in the potential VND is less than the variation in the internal power-source potential VCI. Thus, the internal power-source potential VCI is relatively higher than the potential VND and the comparator 71 receives the potential difference therebetween to operate. The comparator 71 acts to change the gate potential of the driver transistor Q71 so that the driver transistor Q71 turns off. However, if the driver transistor Q71 is in the OFF position in the stable state, no changes occur in the internal power-source potential VCI.

During the high-speed operation, the reference potential Vref and the resistor R75 at the positive input of the comparator 71 allow the comparator 71 to independently execute the above operation without being influenced by the reference potential Vref.

The capacitors C1 and C2 may be dispensed with in the circuit arrangement of the second mode of the twenty-third preferred embodiment. In this case, the potential VND at the node ND equals the internal power-source potential VCI in the stable state. However, if the internal power-source potential VCI varies, the potential VND at the node ND varies to follow the variation in the internal power-source potential VCI after an elapse of a predetermined delay time.

While the potential VND follows the variation in the internal power-source potential VCI, a potential difference exists between the potential VND at the node ND and the internal power-source potential VCI. The comparator 71 detects the potential difference to restore the potential at the output node. Thus, the time period over which the comparator 71 operates is the time period over which the potential difference exists between the potential VND at the node ND and the internal power-source potential VCI. Varying the resistance of the resistor R71 may suitably change the setting of the time period of operation.

The resistor R71 may be replaced with a variable resistance element as shown in FIG. 60. The PMOS transistor Q5 is used as the variable resistance element, and the gate potential thereof may be set to the selection signal SM56. In the high-speed operation mode wherein the cycle of the operation is short, it is necessary to change a delay between the nodes ND and NC by the resistance in accordance with the cycle.

For example, to decrease the amount of delay by the resistance during the high-speed operation, the gate potential of the PMOS transistor Q55 should be changed to a lower level. If the selection signal SM56 which is "H" during the high-speed operation is applied to the gate of the NMOS transistor Q56 to decrease the resistance thereof, the resistance of the PMOS transistor Q55 decreases to shorten the time period of the operation of the comparator 71.

The variable resistance element shown in FIG. 60 may be applied to the circuit of the first mode shown in FIG. 61. The variable resistance element may be formed using an NMOS transistor and a bipolar transistor as well as the structure of FIG. 60.

Twenty-fourth Preferred Embodiment

<First Mode>

Figure 63:
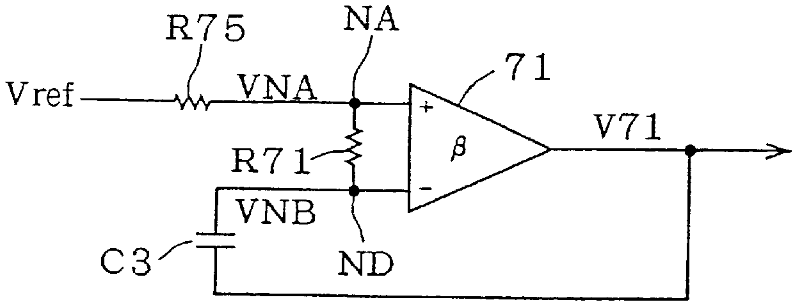
FIG. 63 is a circuit diagram of the internal power-source potential supply circuit according to a first mode of a twenty-fourth preferred embodiment of the present invention.

FIG. 63 is a circuit diagram of the internal power-source potential supply circuit according to a first mode of a twenty-fourth preferred embodiment of the present invention. As shown in FIG. 63, the resistor R71 is connected between the node NA serving as the positive input terminal and the node NB serving as the negative input terminal thereof. The output potential V71 from the comparator 71 is applied as the feedback potential to the node NB through a capacitor C3. The reference potential Vref is applied to the node NA through the resistor R75.

With this arrangement, when the comparator 71 is in the stable state, that is, when the potential VNA at the node NA equals the potential VNB (output potential V71) at the node NB, the comparator 71 is normally established not to act upon the output node. The absolute potential of the output potential at the output node of the comparator 71 at this time is specified by the reference potential Vref since the reference potential Vref is applied to the node NA.

If the output potential V71 of the comparator 71 varies, the capacitor C3 detects the variation to vary the potential VNB at the node NB. The comparator 71 varies the output potential V71 on the basis of the potential difference between the node VNA at the node NA and the potential VNB at the node NB. At this time, the potential VNB at the node NB is varied by the coupling of the capacitor C3. The potential VNA at the node NA equals the potential VNB in the stable state. However, if the output potential V71 varies, the potential VNA at the node NA varies to follow the variation in the potential VNB after an elapse of a predetermined delay time.

While the potential VNA follows the variation in the potential VNB, a potential difference exists between the potential VNA at the node NA and the feedback potential V71 at the output node. The comparator 71 detects the potential difference to restore the potential at the output node. Thus, the time period over which the comparator 71 operates is the time period over which the potential difference exists between the potential VNA at the node NA and the potential VNB. Varying the capacitance of the capacitor C3 and the resistance of the resistor R71 may suitably change the setting of the time period of operation. That is, the time period of operation varies depending upon the capacitance of the capacitor C3 and the resistance of the resistor R71.

For example, if the output potential V71 of the comparator 71 shifts to a lower level, the potential VNB at the node NB is relatively lower than the potential VNA at the node NA, and the comparator 71 receives the potential difference therebetween to operate. As a result, the comparator 71 acts to raise the output level to restore the lowered output potential V71 at the output node.

If the output potential V71 of the comparator 71 shifts to a higher level, on the other hand, the potential VNB at the node NB is relatively higher than the potential VNA at the node NA, and the comparator 71 receives the potential difference therebetween to operate. The comparator 71 acts to lower the output potential to restore the raised output potential V71 at the output node.

During the high-speed operation, the reference potential Vref and the resistor R75 at the positive input of the comparator 71 allow the comparator 71 to independently execute the above operation without being influenced by the reference potential Vref.

<Second Mode>

Figure 64:
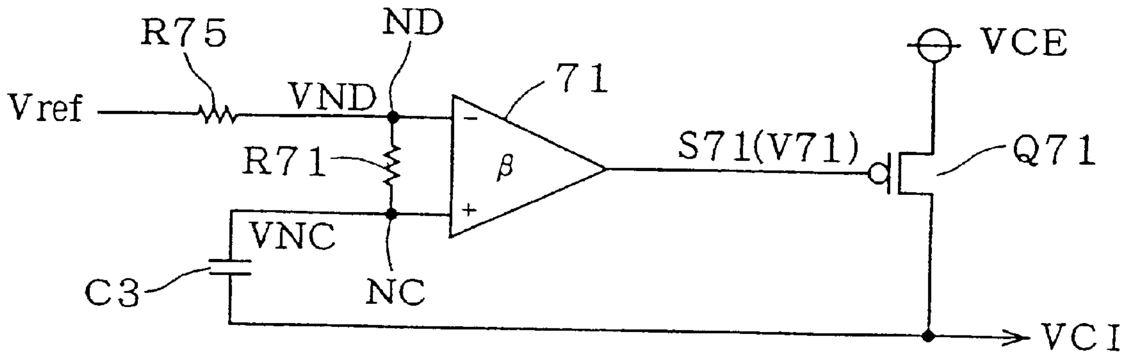
FIG. 64 is a circuit diagram of the internal power-source potential supply circuit according to a second mode of the twenty-fourth preferred embodiment of the present invention.

FIG. 64 is a circuit diagram of the internal power-source potential supply circuit according to a second mode of the twenty-fourth preferred embodiment of the present invention. As shown in FIG. 64, the resistor R71 is connected between the node ND serving as the negative input terminal of the comparator 71 and the node NC serving as the positive input terminal thereof. The output potential V71 from the comparator 71 is applied as the control signal S71 to the gate of the PMOS driver transistor Q71. The driver transistor Q71 has the source connected to the external power-source potential VCE, and the drain for providing the internal power-source potential VCI which in turn is applied as the feedback potential to the node NC through the capacitor C3. The reference potential Vref is applied to the node ND through the resistor R75. With this arrangement, when the comparator 71 is in the stable state, that is, when the potential VND at the node ND equals the potential VNC (internal power-source potential VCI) at the node NC, the comparator 71 is normally established not to cause a current flow in the driver transistor Q71. The absolute potential of the output potential V71 (the internal power-source potential VCI) at the output node of the comparator 71 at this time is specified by the reference potential Vref since the reference potential Vref is applied to the node ND.

If the internal power-source potential VCI varies, the capacitor C3 detects the variation to vary the potential VNC at the node NC. The comparator 71 varies the output potential V71 on the basis of the potential difference between the potential VND at the node ND and the potential VNC at the node NC. The potential VNC at the node NC is varied by the coupling of the capacitor C3. The potential VND at the node ND equals the potential VNC in the stable state. However, if the internal power-source potential VCI varies, the potential VND at the node ND varies to follow the variation in the potential VNC after an elapse of a predetermined delay time.

While the potential VND follows the variation in the potential VNC, a potential difference exists between the potential VND at the node ND and the internal power-source potential VCI. The comparator 71 detects the potential difference to restore the potential at the output node. Thus, the time period over which the comparator 71 operates is the time period over which the potential difference exists between the potential VND at the node ND and the potential VNC. Varying the capacitance of the capacitor C3 and the resistance of the resistor R71 may suitably change the setting of the time period of operation. That is, the time period of operation varies depending, upon the capacitance of the capacitor C3 and the resistance of the resistor R71.

For example, if the internal power-source potential VCI shifts to a lower level, the potential VNC at the node NC is relatively lower than the potential VND at the node ND, and the comparator 71 receives the potential difference therebetween to operate. The comparator 71 cause the driver transistor Q71 to conduct heavily. This cause a current flow through the driver transistor Q71 to restore the lowered internal power-source potential VCI.

If the internal power-source potential VCI shifts to a higher level, on the other hand, the potential VNC at the node NC is relatively higher than the potential VND at the node ND, and the comparator 71 receives the potential difference therebetween to operate. The comparator 71 acts to change the gate potential of the driver transistor Q71 so that the driver transistor Q71 turns off. However, if the driver transistor Q71 is in the OFF position in the stable state, no changes occur in the internal power-source potential VCI. That is, the comparator 71 performs an effective operation only when the internal power-source potential VCI decreases During the high-speed operation, the reference potential Vref and the resistor R75 at the positive input of the comparator 71 allow the comparator 71 to independently execute the above operation without being influenced by the reference pentothal Vref.

The resistor R71 may be replaced with a variable resistance element as shown in FIG. 60. The PMOS transistor Q55 is used as the variable resistance element, and the gate potential thereof may be set to the selection signal SM56. In the high-speed operation mode wherein the cycle of the operation is short, it is necessary to change a delay between the nodes ND and NC by the resistance in accordance with the cycle.

For example, to decrease the amount of delay by the resistance during the high-speed operation, the gate potential of the PMOS transistor Q55 should be changed to a lower level. If the selection signal SM56 which is "H" during the high-speed operation is applied to the gate of the NMOS transistor Q56 to decrease the resistance thereof, the resistance of the PMOS transistor Q55 decreases to shorten the time period of the operation of the comparator 71.

The variable resistance element shown in FIG. 60 may be applied to the circuit of the first mode shown in FIG. 63. The variable resistance element may be formed using an NMOS transistor and a bipolar transistor as well as the structure of FIG. 60.

Twenty-fifth Preferred Embodiment

<First Mode>

Figure 65:
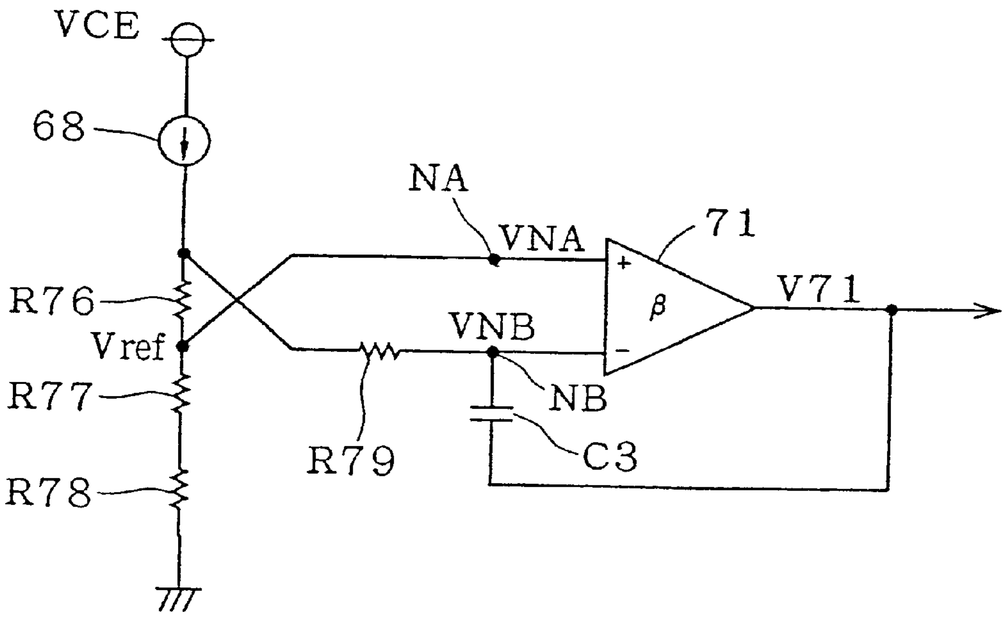
FIG. 65 is a circuit diagram of the internal power-source potential supply circuit according to a first mode of a twenty-fifth preferred embodiment of the present invention.

FIG. 65 is a circuit diagram of the internal power-source potential supply circuit according to a first mode of a twenty-fifth preferred embodiment of the present invention. As shown in FIG. 65, the output potential V71 from the comparator 71 is applied as the feedback potential to the node NB through the capacitor C3.

A current source 68 and resistors R76 to R78 are connected between the external power-source potential VCE and the ground. The potential at a node between the resistors R76 and R77 is applied as the reference potential Vref to the node NA serving as the positive input terminal of the comparator 71 in the stable state. A resistor R79 is connected between the current source 2 and the node NB serving as the negative input terminal of the comparator 71. Thus, the resistors R76 and R79 are connected between the node NA and the node NB. The amount of current supply from the current source 68 and the resistances of the resistors R76 to R78 are suitably set so that the reference potential Vref is slightly lower than the potential VNB at the node NB of the comparator 71 in the stable state. That is, an offset potential VOS is previously set between the potential VNB and the potential VNA.

If the output potential V71 of the comparator 71 varies, the capacitor C3 detects the variation to vary the potential VNB at the node NB. The comparator 71 varies the output potential V71 on the basis of the potential difference between the potential VNA at the node NA and the potential VNB at the node NB.

Thus, the time period over which the comparator 71 operates is the time period over which the potential difference exists between the potential VNA at the node NA and the potential VNB at the node NB. Varying the capacitance of the capacitor C3 and the resistance of the resistor R79 may suitably change the setting of the time period of operation. That is, the time period of operation varies depending upon the capacitance of the capacitor C3 an the resistance of the resistor R79.

For example, if the output potential V71 of the comparator 71 shifts to a lower level by the amount not less than the offset potential VOS and the potential VNB at the node NB becomes relatively lower than the potential VNA at the node NA, the comparator 71 receives the potential difference between the potential VNA and the potential VNB to operate. As a result, the comparator 71 acts to raise the output level to restore the lowered output potential V71 at the output node. The comparator 71 does not raise the output potential V71 until the potential VNB at the node NB is lower than the potential VNA at the node NA by the amount greater than the offset potential VOS. In this manner, previously setting the offset potential VOS may prevent the comparator 71 from operating in response to a relatively small variation in the output potential V71.

If the output potential V71 of the comparator 71 shifts to a higher level, on the other hand, the potential VNB at the node NB is relatively higher than the potential VNA at the node NA, and the comparator 71 receives the potential difference between the potential VNA and the potential VNB to operate. The comparator 71 acts to lower the output level to restore the raised output potential V71 at the output node.

Since the node NB receives the output potential V71 through the capacitor C3, the coupling of the capacitor C3 allows the variation in output potential V71 to be transmitted to the node NB earlier. Thus, the first mode of the twenty-fifth preferred embodiment enables control with a good response.

During the high-speed operation, the resistors R76 and R79 allow the comparator 71 to independently execute the above operation without being influenced by the external power-source potential VCE and the reference potential Vref.

<Second Mode>

Figure 66:
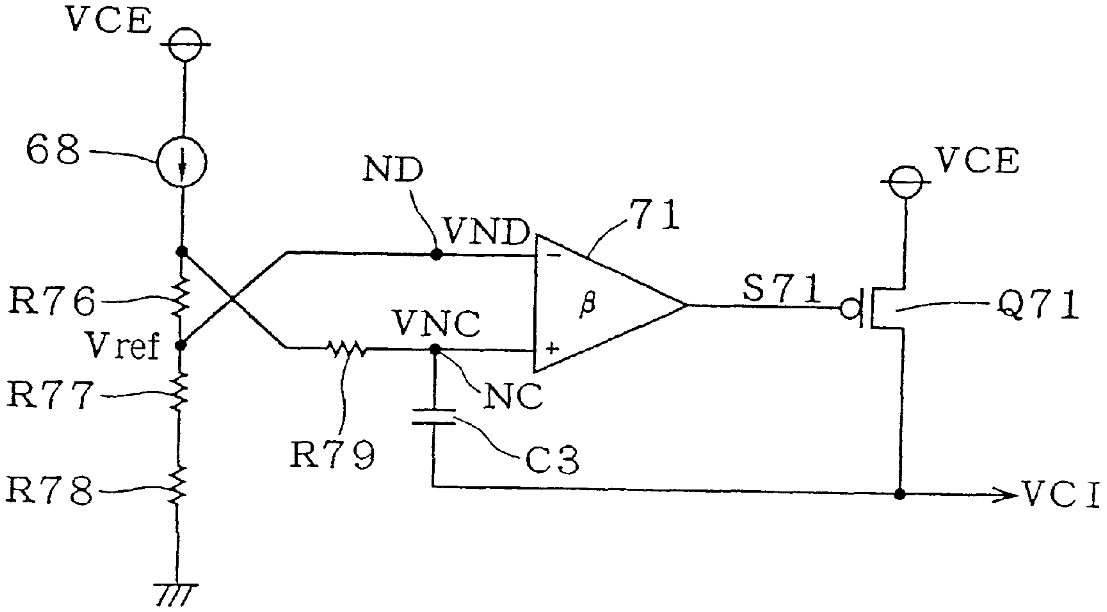
FIG. 66 is a circuit diagram of the internal power-source potential supply circuit according to a second mode of the twenty-fifth preferred embodiment of the present invention.

FIG. 66 is a circuit diagram of the internal power-source potential supply circuit according to a second mode of the twenty-fifth preferred embodiment of the present invention. As shown in FIG. 66, the current source 68 and the resistors R76 to R78 are connected between the external power-source potential VCE and the ground. The potential at the node between the resistors R76 and R77 is applied as the reference potential Vref to the node ND serving as the positive input terminal of the comparator 71 in the stable state. The resistor R79 is connected between the current source 2 and the node NC serving as the negative input terminal of the comparator 71. Thus, the resistors R76 and R79 are connected between the node ND and the node NC. The amount of current supply from the current source 68 and the resistances of the resistors R76 to R78 are suitably set so that the reference potential Vref is slightly higher than the potential VNC at the node NC in the stable state. That is, the offset potential VOS is previously set between the potential VNC and the potential VND.

The output potential V71 from the comparator 71 is applied as the control signal S71 to the gate of the PMOS driver transistor Q71. The driver transistor Q71 has the source connected to the external power-source potential VCE, and the drain for providing the internal power-source potential VCI which in turn is applied as the feedback potential to the node NC through the capacitor C3. The reference potential Vref is applied to the node ND through the resistor R75.

With this arrangement, when the comparator 71 is in the stable state, that is, when the potential VND at the node ND equals the potential VNC (internal power-source potential VCI) at the node NC, the comparator 71 is normally established not to cause a current flow in the driver transistor Q71. The absolute potential of the output potential V71 (the internal power-source potential VCI) at the output node of the comparator 71 at this time is specified by the reference potential Vref since the reference potential Vref is applied to the node ND.

If the internal power-source potential VCI varies, the capacitor C3 detects the variation to vary the potential VNC at the node NC. The comparator 71 varies the output potential V71 on the basis of the potential difference between the potential VND at the node ND and the potential VNC at the node NC. The potential VNC at the node NC is varied by the coupling of the capacitor C3.

The comparator 71 detects the potential difference between the potential VND at the node ND and the internal power-source potential VCI to restore the potential at the output node. Thus, the time period over which the comparator 71 operates is the time period over which the potential difference exists between the potential VND at the node ND and the potential VNC. Varying the capacitance of the capacitor C3 and the resistance of the resistor R79 may suitably change the setting of the time period of operation. That is, the time period of operation of this circuit varies depending upon the capacitance of the capacitor C3 and the resistance of the resistor R79.

For example, if the internal power-source potential VCI shifts to a lower level by the amount not less than the offset potential VOS and the potential VNC at the node NC becomes relatively lower than the potential VND at the node ND, the comparator 71 receives the potential difference between the potential VNC and the potential VND to operate. As a result, the comparator 71 acts to cause the driver transistor Q71 to conduct heavily. This cause a current flow through the driver transistor Q71 to restore the lowered internal power-source potential VCI.

If the internal power-source potential VCI shifts to a higher level, on the other hand, the potential VNC at the node NC is relatively higher than the potential VND at the node ND, and the comparator 71 receives the potential difference between the potential VNC and the potential VND to operate. As a result, the comparator 71 acts to change the gate potential of the driver transistor Q71 so that the driver transistor Q71 turns off. However, if the driver transistor Q71 is in the OFF position in the stable state, no changes occur in the internal power-source potential VCI. That is, the comparator 71 performs the effective operation only when the internal power-source potential VCI decreases.

Since the node NC receives the output potential V71 through the capacitor C3, the coupling of the capacitor C3 allows the variation in the output potential V71 to be transmitted to the node NC earlier. Thus, the second mode of the twenty-fifth preferred embodiment enables control with a good response.

During the high-speed operation, the resistors R76 and R79 allow the comparator 71 to independently execute the above operation without being influenced by the external power-source potential VCE and the reference potential Vref.

The resistor R76 may be replaced with a variable resistance element as shown in FIG. 60. The PMOS transistor Q55 is used as the variable resistance element, and the gate potential thereof may be set to the selection signal SM56. In the high-speed operation mode wherein the cycle of the operation is short, it is necessary to change a delay between the nodes ND and NC by the resistance in accordance with the cycle.

For example, to decrease the amount of delay by the resistance during the high-speed operation, the gate potential of the PMOS transistor Q55 should he changed to a lower level. If the selection signal SM56 which is "H" during the high-speed operation is applied to the gate of the NMOS transistor Q56 to decrease the resistance thereof, the resistance of the PMOS transistor Q55 decreases to shorten the time period of the operation of the comparator 71.

The variable resistance element shown in FIG. 60 may be applied to the circuit of the first mode shown in FIG. 65. The variable resistance element may be formed using an NMOS transistor and a bipolar transistor as well as the structure of FIG. 60.

Twenty-sixth Preferred Embodiment

<First Mode>

Figure 67:
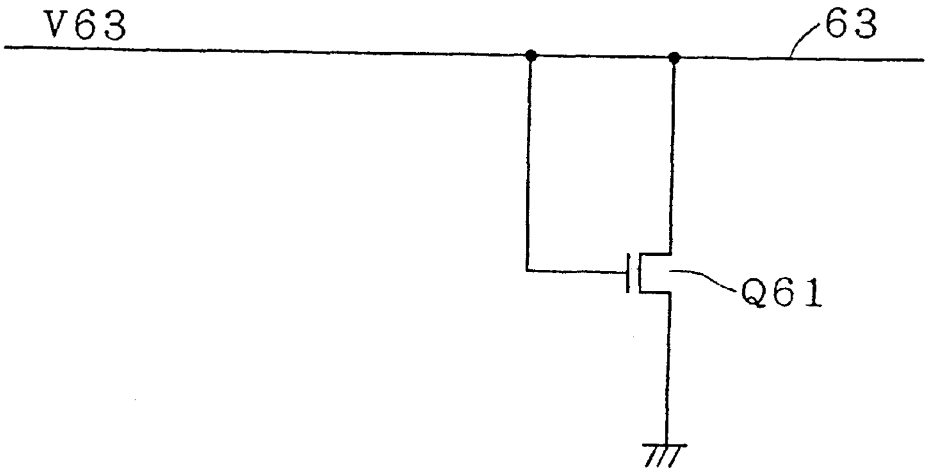
FIG. 67 is a circuit diagram of a potential stabilizing circuit according to a first mode of a twenty-sixth preferred embodiment of the present invention.

FIG. 67 is a circuit diagram of a potential stabilizing circuit according to a first mode of a twenty-sixth preferred embodiment of the present invention. As shown in FIG. 67, an NMOS transistor Q61 serving as an active load is connected to an output signal line 63. That is, the NMOS transistor Q61 has a gate an d drain connected to the output signal line 63, and a source grounded. An output potential V63 from the output signal line 63 includes the output potential V71 or internal power-source potential VCI fed from the internal power-source potential supply circuit of the twenty-second to twenty-fifth preferred embodiments and the like.

In the circuit of the first mode, a current flows between the output signal line 63 and the ground when the output potential V63 of the output signal line 63 rises. The circuit of the first mode may provide the source-drain voltage of the NMOS transistor Q61 generated by this current a s an output potential. This arrangement includes one diode connection of the NMOS transistor Q61, but may have any number of diode connections.

In this circuit, if the output potential V63 is the output potential V71 of the internal power-source potential supply circuit of the first mode of the twenty-second preferred embodiment shown in FIG. 58, current constantly flows from the output node of the comparator 71 through the NMOS transistor Q61, and the internal power-source potential supply circuit constantly causes corresponding current to flow.

For example, if the output potential V63 shifts to a lower level, the potential difference between the output potential V63 and the ground decreases to decrease the gate-source voltage of the NMOS transistor Q61, resulting in a decreased mount of current. This means that the output potential V63 which has been stable by the constant current flow momentarily shifts to the lower level to reduce the current flowing between the output signal line 63 and the ground, and the amount of reduced current acts substantially as a current for charging the output node of the comparator 71 to function to raise the output potential V71 (output potential V63), thereby restoring the lowered output potential V71.

If the output potential V63 shifts to a higher level, on the other hand, the potential difference between the output potential V63 and the ground increases to increase the gate-source voltage of the NMOS transistor Q61, resulting in an increased amount of current. This means that the output potential V63 which has been stable by the constant current flow momentarily shifts to the higher level to increase the flowing current, and the amount of increased current acts substantially as a current for discharging the output node of the comparator 71 to function to lower the output potential V71, thereby restoring the raised output potential V71.

<Second Mode>

Figure 68:
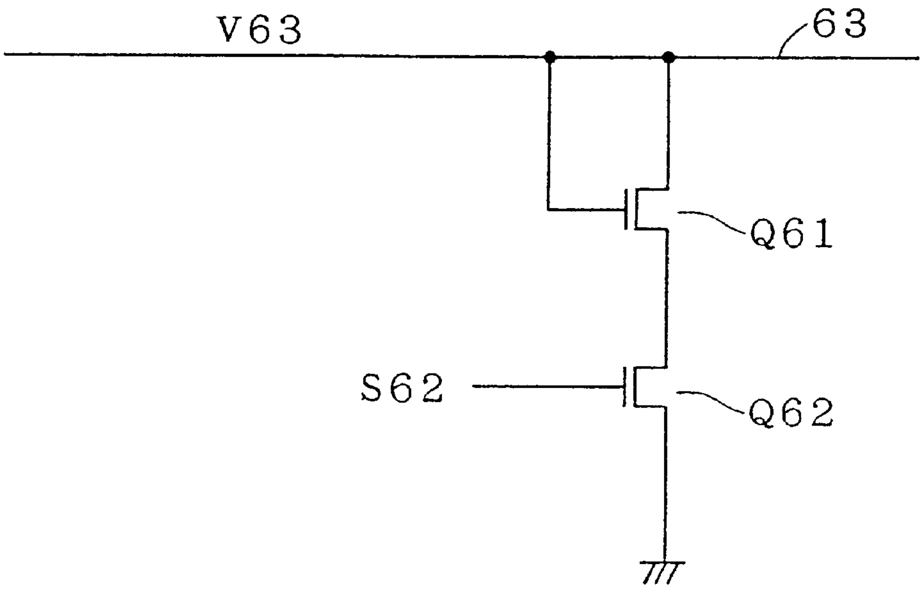
FIG. 68 is a circuit diagram of the potential stabilizing circuit according to a second mode of the twenty-sixth preferred embodiment of the present invention.

FIG. 68 is a circuit diagram of the potential stabilizing, circuit according to a second mode of the twenty-sixth preferred embodiment of the present invention. In the second mode, an NMOS transistor Q62 is connected between the source of the NMOS transistor Q61 and the ground. An activation signal S62 is applied to the gate of the NMOS transistor Q62. Other constructions of the second mode are similar to those of the first mode.

The second mode may turn on/off the NMOS transistor Q62 by using the activation signal S62 which is "H"/"L" to control the active/inactive state of the potential stabilizing circuit. Thus, the activation signal S62 is normally set to "H" to achieve a circuit equivalent to the circuit of the first mode, and the activation signal S62 is set to "L" to separate a current path between the output signal line 63 and the ground when no excess current flow is desirable, for example, when a chip is stationary.

<Third Mode>

Figure 69:
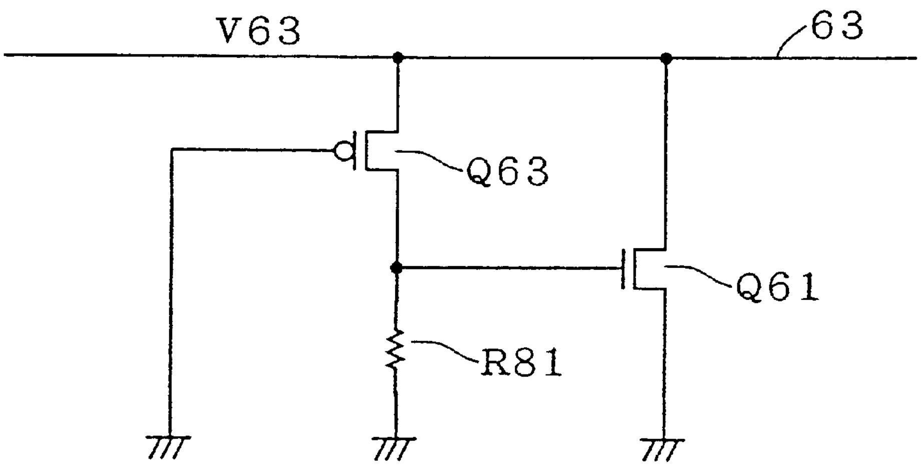
FIG. 69 is a circuit diagram of the potential stabilizing circuit according to a third mode of the twenty-sixth preferred embodiment of the present invention.

FIG. 69 is a circuit diagram of the potential stabilizing circuit according to a third mode of the twenty-sixth preferred embodiment of the present invention. As shown in FIG. 69, the NMOS transistor Q61 has the drain connected to the output signal line 63, and the source grounded. A PMOS transistor Q63 has a source connected to the output signal line 63, a drain connected to a first end of a resistor R81, and a gate grounded. A second end of the resistor R81 is grounded. The first end of the resistor R81 is connected to the gate of the NMOS transistor Q61.

Thus, the amount of current flow is determined by the gate-source voltage of the NMOS transistor Q61 and the resistance of the resistor R81 in the potential stabilizing circuit of the third mode. Specifically, a current flow in the potential stabilizing circuit develops a voltage between the gate and source of the NMOS transistor Q61. This voltage is developed as a voltage across the resistor R81. Thus, the amount of current flow in the circuit is the gate-source voltage of the NMOS transistor Q61 divided by the resistance of the resistor R81.

The resistor R81 serves-as a current supply means between the output signal line 63 and the ground, and the NMOS transistor Q61 serves as a current control means for controlling the amount of current through the resistor R81. It should be noted that the resistance of the PMOS transistor Q63 functions to alleviate the electric field between the resistor R81 and the output signal line 63.

The potential stabilizing circuit of the third mode as above constructed, similar to that of the first mode, acts to stabilize the output potential V63.

<Fourth Mode>

Figure 70:
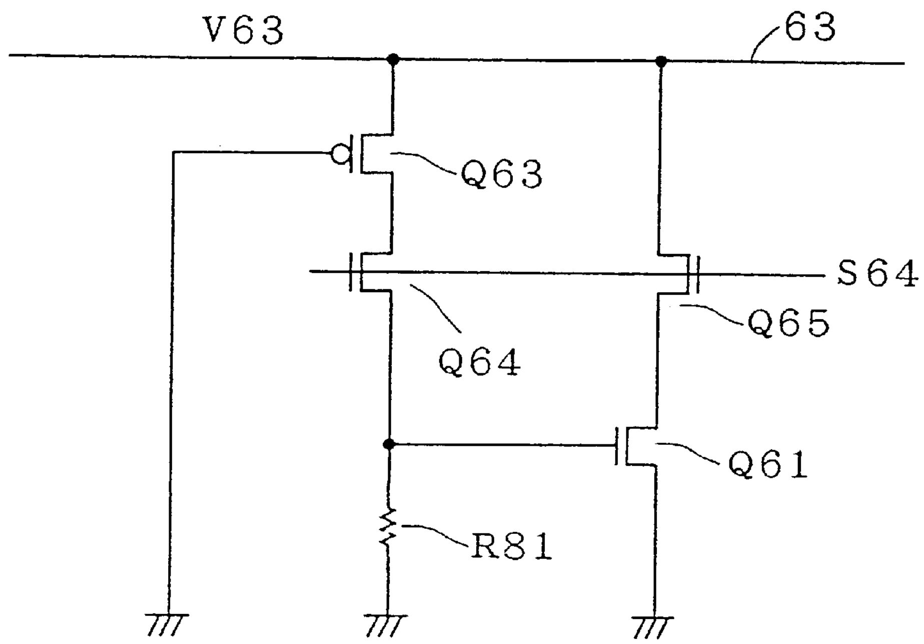
FIG. 70 is a circuit diagram of the potential stabilizing circuit according to a fourth mode of the twenty-sixth preferred embodiment of the present invention.

FIG. 70 is a circuit diagram of the potential stabilizing circuit according to a fourth mode of the twenty-sixth preferred embodiment of the present invention. In the fourth mode, an NMOS transistor Q65 is connected between the drain of the NMOS transistor Q61 and the output signal line 63, and an NMOS transistor Q64 is connected between the drain of the PMOS transistor Q63 and the first end of the resistor R81. An activation signal S64 is applied to the gates of the NMOS transistors Q64 and Q65. Other constructions of the fourth mode are similar to those of the third mode.

The fourth mode may turn on/off the NMOS transistors Q64 and Q65 by using the activation signal S64 which is "H"/"L" to control the active/inactive state of the potential stabilizing circuit. Thus, the activation signal S64 is normally set to "H" to achieve a circuit equivalent to the circuit of the third mode, and the activation signal S64 is set to "L" to separate the current path between the output signal line 63 and the ground when no excess current flow is desirable, for example, when the chip is stationary.

<Fifth Mode>

Figure 71:
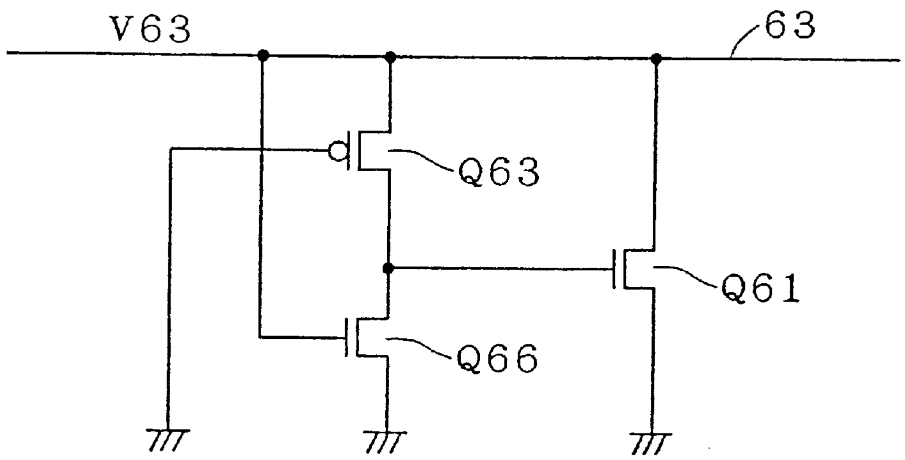
FIG. 71 is a circuit diagram of the potential stabilizing circuit according to a fifth mode of the twenty-sixth preferred embodiment of the present invention.

FIG. 71 is a circuit diagram of the potential stabilizing circuit according to a fifth mode of the twenty-sixth preferred embodiment of the present invention. As shown in FIG. 71, the NMOS transistor Q61 has the drain connected to the output signal line 63 and the source grounded. The PMOS transistor Q63 has the source connected to the output signal line 63, the drain connected to the drain of an NMOS transistor Q66, and the gate grounded. The source of the NMOS transistor Q66 is grounded. The drain of the NMOS transistor Q66 is connected to the gate of the NMOS transistor Q61.

Thus, the amount of current flow is determined by the gate-source voltage of the NMOS transistor Q61 and the resistance of the NMOS transistor Q66 in the potential stabilizing circuit of the fifth mode. Specifically, a current flow in the potential stabilizing circuit develops a voltage between the gate and source of the NMOS transistor Q61. This voltage is developed as a drain-source voltage of the NMOS transistor Q66. Thus, the amount of current flow in the circuit is the gate-source voltage of the NMOS transistor Q61 divided by the resistance of the NMOS transistor Q66.

The NMOS transistor Q66 serves as a current supply means between the output signal line 63 and the ground, and the NMOS transistor Q61 serves as a current control means for controlling the amount of current through the NMOS transistor Q66. It should be noted that the resistance of the PMOS transistor Q63 functions to alleviate the electric field between the NMOS transistor Q66 and the output signal line 63.

The potential stabilizing circuit of the fifth mode as above constructed, similar to that of the first mode, acts to stabilize the output potential V63.

The circuit of the fifth mode has further functions to be described below. The circuit of the fifth mode is described below, as an example, when the output potential V71 of the internal power-source potential supply circuit of the first mode of the twenty-second preferred embodiment shown in FIG. 58 is the output potential V63.

The resistance of the NMOS transistor Q66 varies depending upon the potential difference between the output potential V63 and the ground level. As the output potential V63 decreases, the gate-source voltage of the NMOS transistor Q66 decreases and the resistance increases. This means that the output potential V63 which has been stable by the constant current flow momentarily shifts to the lower level to increase the resistance of the NMOS transistor Q66 and reduce the amount of flowing current, and the amount of reduced current acts substantially as a current for charging the output node of the comparator 71 to function to raise the output potential V71, thereby restoring the lowered output potential V71, or the output potential V63.

If the output potential V63 shifts to a higher level, on the other hand, the potential difference between the output potential V63 and the ground increases to increase the gate-source voltage of the NMOS transistor Q66 to decrease the resistance of the NMOS transistor Q66, resulting in an increased mount of current. This means that the output potential V63 which has been stable by the constant current flow momentarily shifts to the higher level to increase the flowing current, and the amount of increased current acts substantially as a current for discharging the output node of the comparator 71 to function to lower the output potential V71, thereby restoring the raised output potential V71, or the output potential V63.

<Sixth Mode>

Figure 72:
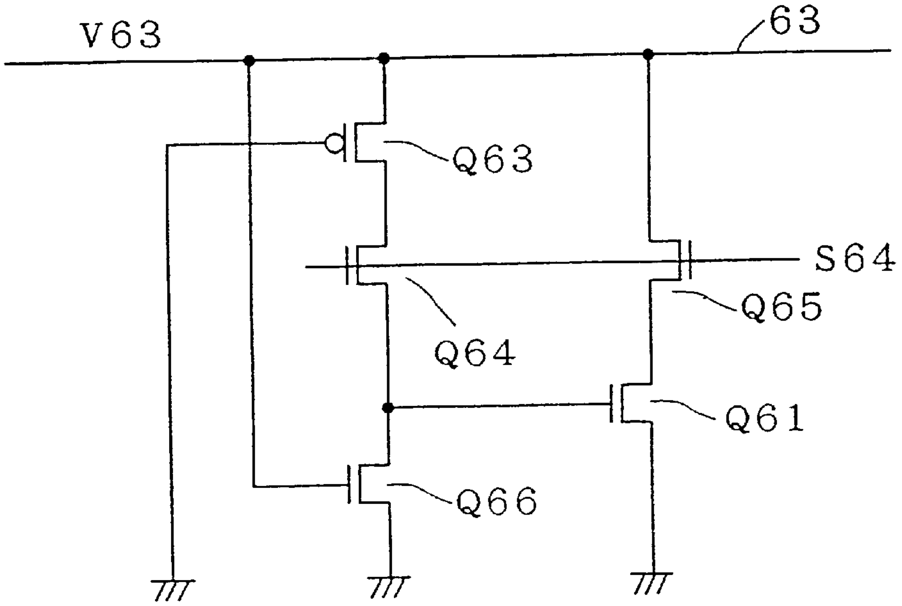
FIG. 72 is a circuit diagram of the potential stabilizing circuit according to a sixth mode of the twenty-sixth preferred embodiment of the present invention.

FIG. 72 is a circuit diagram of the potential stabilizing circuit according to a sixth mode of the twenty-sixth preferred embodiment of the present invention. In the sixth mode, the NMOS transistor Q65 is connected between the drain of the NMOS transistor Q61 and the output signal line 63, and the NMOS transistor Q64 is connected between the drain of the PMOS transistor Q63 and the drain of the NMOS transistor Q66. The activation signal S64 is applied to the gates of the NMOS transistors Q64 and Q65. Other constructions of the sixth mode are similar to those of the fifth mode.

The sixth mode may turn on/off the NMOS transistors Q64 and Q65 by using the activation signal S64 which is "H"/"L" to control the active/inactive state of the potential stabilizing circuit. Thus, the activation signal S64 is normally set to "H" to achieve a circuit equivalent to the circuit of the fifth mode, and the activation signal S64 is set to "L" to separate the current path between the output signal line 63 and the ground when no excess current flow is desirable, for example, when the chip is stationary.

<Seventh Mode>

Figure 73:
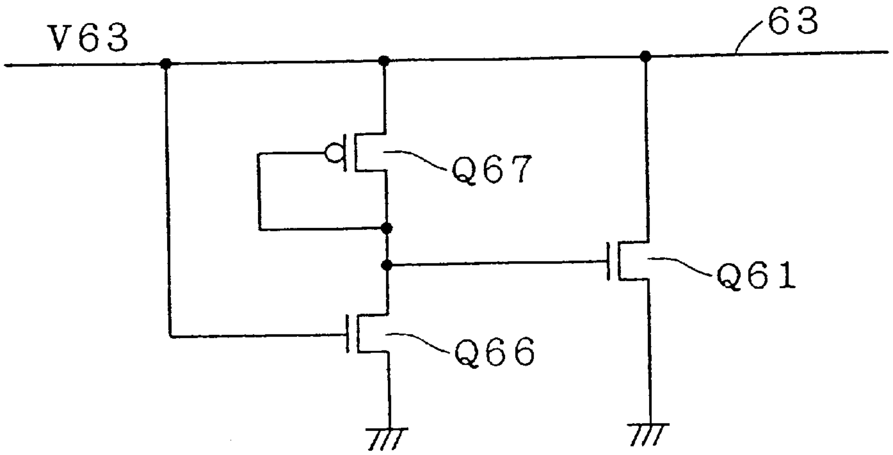
FIG. 73 is a circuit diagram of the potential stabilizing circuit according to a seventh mode of the twenty-sixth preferred embodiment of the present invention.

FIG. 73 is a circuit diagram of the potential stabilizing circuit according to a seventh mode of the twenty-sixth preferred embodiment of the present invention. As shown in FIG. 73, the NMOS transistor Q61 has the drain connected to the output signal line 63, and the source grounded. A PMOS transistor Q67 has a source connected to the output signal line 63, and a gate and drain connected to the drain of the NMOS transistor Q66. The source of the NMOS transistor Q66 is grounded. The drain of the NMOS transistor Q66 is connected to the gate of the NMOS transistor Q61.

The potential stabilizing circuit of the seventh mode as above constructed includes the diode-connected PMOS transistor Q67 in place of the PMOS transistor Q63 used as the resistor and is similar in operation and effect to that of the fifth mode.

<Eighth Mode>

Figure 74:
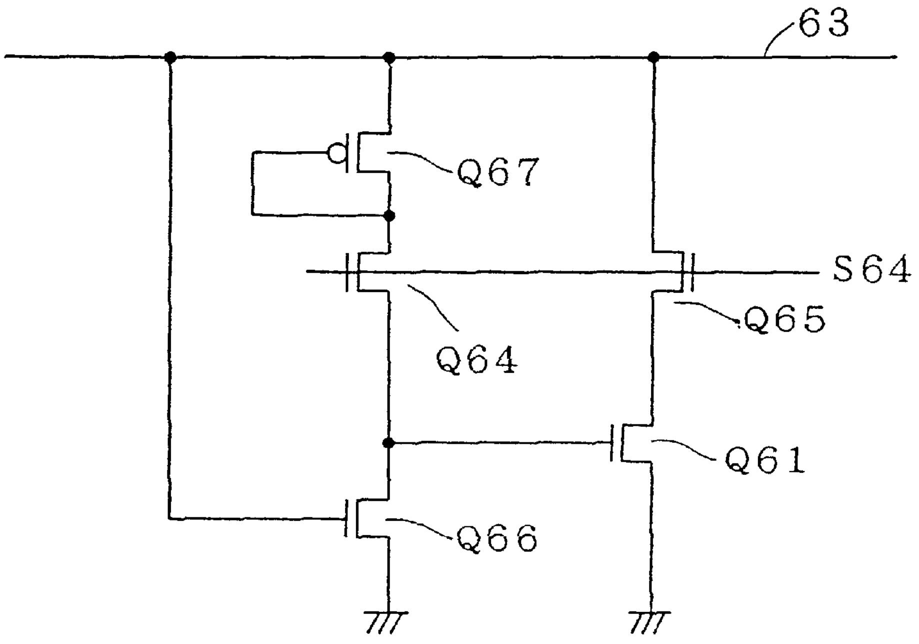
FIG. 74 is a circuit diagram of the potential stabilizing circuit according to an eighth mode of the twenty-sixth preferred embodiment of the present invention.

FIG. 74 is a circuit diagram of the potential stabilizing circuit according to an eighth mode of the twenty-sixth preferred embodiment of the present invention. In the eighth mode, the NMOS transistor Q65 is connected between the drain of the NMOS transistor Q61 and the output signal line 63, and the NMOS transistor Q64 is connected between the drain of the PMOS transistor Q67 and the drain of the NMOS transistor Q66. The activation signal S64 is applied to the gates of the NMOS transistors Q64 and Q65. Other constructions of the eighth mode are similar to those of the seventh mode.

The eighth mode may turn on/off the NMOS transistors Q64 and Q65 by using the activation signal S64 which is "H"/"L" to control the active/inactive state of the potential stabilizing circuit. Thus, the activation signal S64 is normally set to "H" to achieve a circuit equivalent to the circuit of the seventh mode, and the activation signal S64 is set to "L" to separate the current path between the output signal line 63 and the ground when no excess current flow is desirable, for example, when the chip is stationary.

<Ninth Mode>

Figure 75:
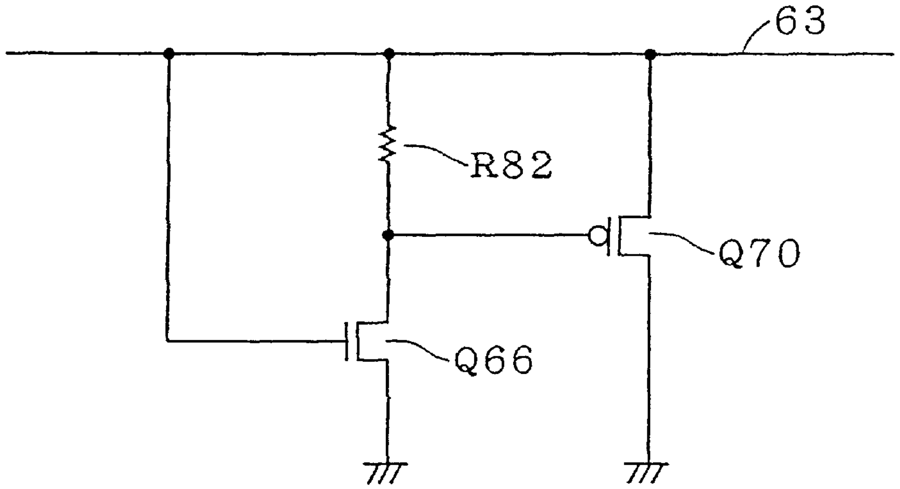
FIG. 75 is a circuit diagram of the potential stabilizing circuit according to a ninth mode of the twenty-sixth preferred embodiment of the present invention.

FIG. 75 is a circuit diagram of the potential stabilizing circuit according to a ninth mode of the twenty-sixth preferred embodiment of the present invention. A shown in FIG. 75, a PMOS transistor Q70 has a source connected to the output signal line 63, and a drain grounded. A resistor R82 has a first end connected to the output signal line 63, and a second end connected to the drain of the NMOS transistor Q66. The source of the NMOS transistor Q66 is grounded. The drain of the NMOS transistor Q66 is connected to the gate of the PMOS transistor Q70.

Thus, the amount of current flow is determined by the gate-source voltage of the PMOS transistor Q70 and the resistance of the resistor R82 in the potential stabilizing. circuit of the ninth mode. Specifically, a current flow in the potential stabilizing circuit develops a voltage between the gate and source of the PMOS transistor Q70. This voltage is developed as a voltage across the resistor R92. Thus, the amount of current flow in the circuit is the gate-source voltage of the PMOS transistor Q70 divided by the resistance of the resistor R82. It should be noted that the resistance of the NMOS transistor Q66 functions to alleviate the electric field between the resistor R82 and the ground.

The potential stabilizing circuit of the ninth mode as above constructed. similar to that of the fifth mode, acts to stabilize the output potential V63.

<Tenth Mode>

Figure 76:
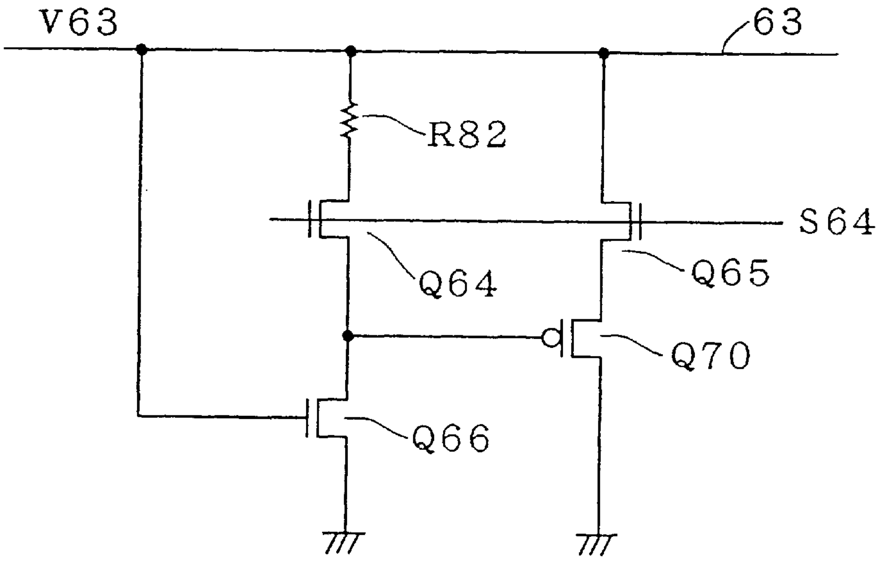
FIG. 76 is a circuit diagram of the potential stabilizing circuit according to a tenth mode of the twenty-sixth preferred embodiment of the present invention.

FIG. 76 is a circuit diagram of the potential stabilizing circuit according to a tenth mode of the twenty-sixth preferred embodiment of the present invention. In the tenth mode, the NMOS transistor Q65 is connected between the drain of the PMOS transistor Q70 and the output signal line 63, and the NMOS transistor Q64 is connected between the second end of the resistor R82 and the drain of the NMOS transistor Q66. The activation signal S64 is applied to the gates of the NMOS transistors Q64 ad Q65. Other constructions of the tenth mode are similar to those of the ninth mode.

The tenth mode may turn on/off the NMOS transistors Q64 and Q65 by using the activation signal S64 which is "H"/"L" to control the active/inactive state of the potential stabilizing circuit. Thus, the activation signal S64 is normally set to "H" to achieve a circuit equivalent to the circuit of the ninth mode, and the activation signal S64 is set to "L" to separate the current path between the output signal line 63 and the ground when no excess current flow is desirable, for example, when a chip is stationary.

<Eleventh Mode>

Figure 77:
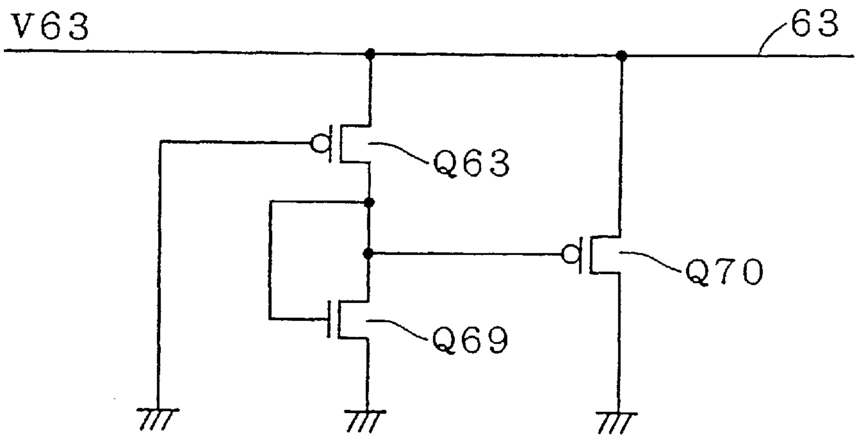
FIG. 77 is a circuit diagram of the potential stabilizing circuit according to an eleventh mode of the twenty-sixth preferred embodiment of the present invention.

FIG. 77 is a circuit diagram of the potential stabilizing circuit according to an eleventh mode of the twenty-sixth preferred embodiment of the present invention. As shown in FIG. 77, the PMOS transistor Q70 has the source connected to the output signal line 63, and the drain grounded. The PMOS transistor Q63 has the source connected to the output signal line 63, and the drain connected to the drain and gate of an NMOS transistor Q69. The source of the NMOS transistor Q69 having common drain and gate is grounded. The drain of the NMOS transistor Q69 is connected to the gate of the PMOS transistor Q70.

The potential stabilizing circuit of the eleventh mode as above constructed includes the NMOS transistor Q69 used as the diode in place of the NMOS transistor Q66 used as the resistor and is similar in operation and effect to that of the ninth mode.

<Twelfth Mode>

Figure 78:
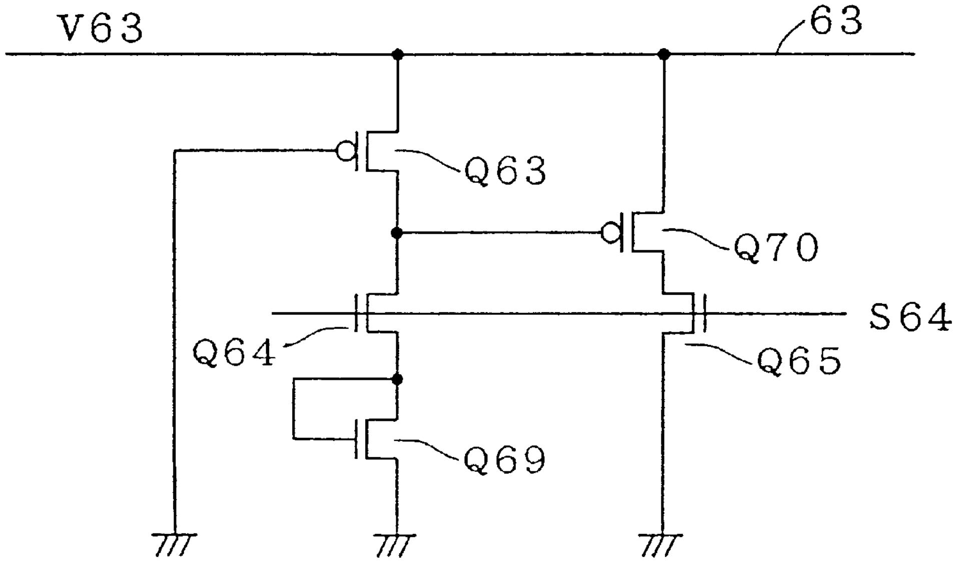
FIG. 78 is a circuit diagram of the potential stabilizing circuit according to a twelfth mode of the twenty-sixth preferred embodiment of the present invention.

FIG. 78 is a circuit diagram of the potential stabilizing circuit according to a twelfth mode of the twenty-sixth preferred embodiment of the present invention. In the twelfth mode, the NMOS transistor Q65 is connected between the drain of the PMOS transistor Q70 and the output signal line 63, and the NMOS transistor Q64 is connected between the drain of the PMOS transistor Q63 and the drain of the NMOS transistor Q69. The activation signal S64 is applied to the gates of the NMOS transistors Q64 and Q65. Other constructions of the twelfth mode are similar to those of the eleventh mode.

The twelfth mode may turn on/off the NMOS transistors Q64 and Q65 by using the activation signal S64 which is "H"/"L" to control the active/inactive state of the potential stabilizing circuit. Thus, the activation signal S64 is normally set to "H" to achieve a circuit equivalent to the circuit of the eleventh mode, and the activation signal S64 is set to "L" to separate the current path between the output signal line 63 and the ground when no excess current flow is desirable, for example, when the chip is stationary.

<Thirteenth Mode>

Figure 79:
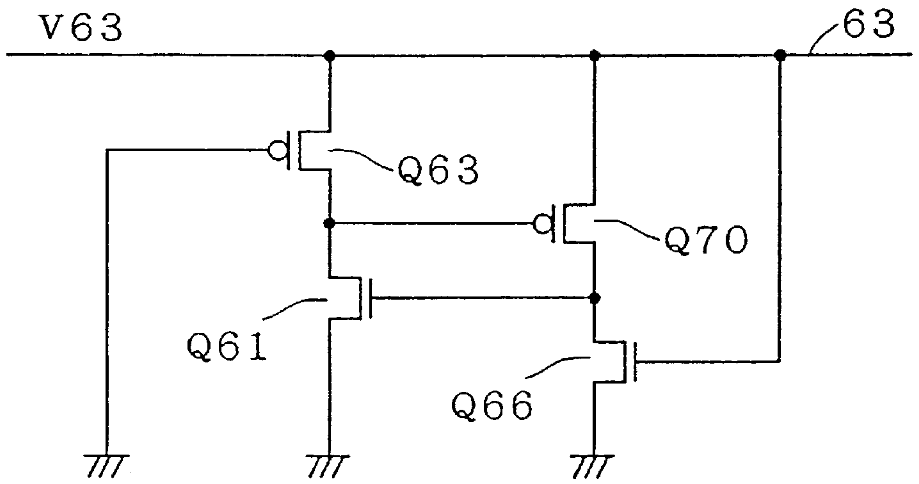
FIG. 79 is a circuit diagram of the potential stabilizing circuit according to a thirteenth mode of the twenty-sixth preferred embodiment of the present invention.

FIG. 79 is a circuit diagram of the potential stabilizing circuit according to a thirteenth mode of the twenty-sixth preferred embodiment of the present invention. As shown in FIG. 79, the PMOS transistor Q70 has the source connected to the output signal line 63, and the drain connected to the drain of the NMOS transistor Q66. The NMOS transistor Q66 has the source grounded, and the gate connected to the output signal line 63.

The PMOS transistor Q63 has the source connected to the output signal line 63, and the drain connected to the drain of the NMOS transistor Q61. The NMOS transistor Q61 has the source grounded, and the drain connected to the gate of the PMOS transistor Q70. The drain of the NMOS transistor Q66 is connected to the gate of the NMOS transistor Q61.

Thus, the amount of current flow is determined by the gate-source voltage of the NMOS transistor Q61 and the resistance of the NMOS transistor Q66 in the potential stabilizing circuit of the thirteenth mode. Specifically, a current flow in the potential stabilizing circuit develops a voltage between the gate and source of the NMOS transistor Q61. This voltage is developed as a drain-source voltage of the NMOS transistor Q66. Thus, the amount of current flow in the NMOS transistor Q66 in the circuit is the gate-source voltage of the NMOS transistor Q61 divided by the resistance of the NMOS transistor Q66. It should be noted that the resistance of the PMOS transistor Q63 functions to alleviate the electric field between the NMOS transistor Q66 and the output signal line 63.

Further, the amount of current flow is determined by the gate-source voltage of the PMOS transistor Q70 and the resistance of the PMOS transistor Q63 in the potential stabilizing circuit of the thirteenth mode. Specifically, a current flow in the potential stabilizing circuit develops a voltage between the gate and source of the PMOS transistor Q70. This voltage is developed as a drain-source voltage of the PMOS transistor Q63. Thus, the amount of current flow in the PMOS transistor Q63 in the circuit is the gate-source voltage of the PMOS transistor Q70 divided by the resistance of the PMOS transistor Q63. It should be noted that the resistance of the NMOS transistor Q66 functions to alleviate the electric field between the PMOS transistor Q63 and the ground.

The potential stabilizing circuit of the thirteenth mode as above constructed has a combination of the structures of the fifth and ninth modes to form a cross-coupled configuration of the NMOS transistors Q61 and Q66 and the PMOS transistors Q70 and Q63, and is similar in operation and effect to the combination of the fifth and ninth modes.

<Fourteenth Mode>

Figure 80:
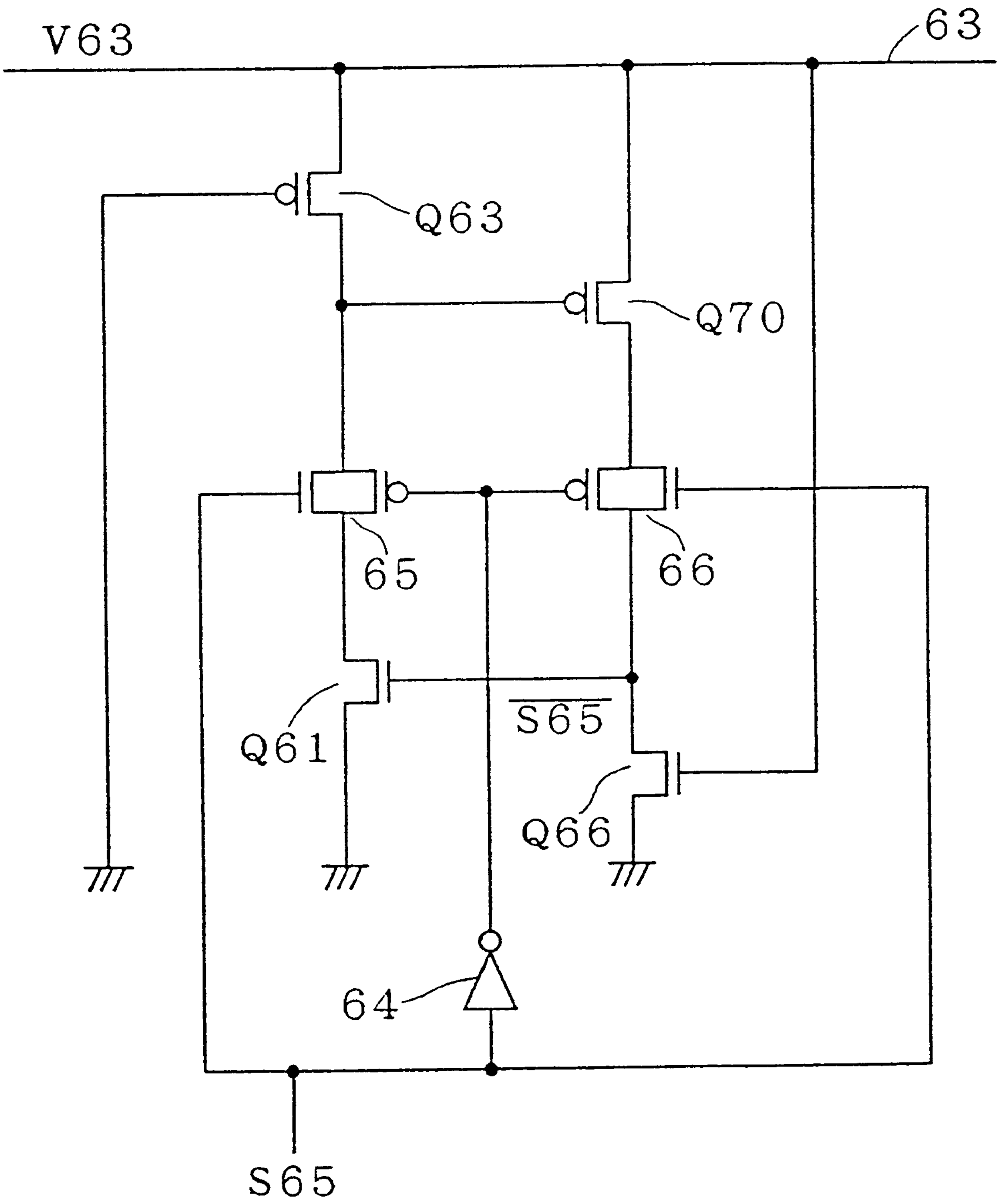
FIG. 80 is a circuit diagram of the potential stabilizing circuit according to a fourteenth mode of the twenty-sixth preferred embodiment of the present invention.

FIG. 80 is a circuit diagram of the potential stabilizing circuit according to a fourteenth mode of the twenty-sixth preferred embodiment of the present invention. In the fourteenth mode, a transmission gate 65 is connected between the drain of the NMOS transistor Q61 and the drain of the PMOS transistor Q63, and a transmission gate 66 is connected between the drain of the PMOS transistor Q70 and the drain of the NMOS transistor Q65. An activation signal S65 is applied to the NMOS gates of the transmission gates 65 and 66, and the inverted signal of the activation signal S65 is applied to the PMOS gates thereof through an inverter 64. Other constructions of the fourteenth mode are similar to those of the thirteenth mode.

The fourteenth mode may turn on/off the transmission gates 65 and 66 by using the activation signal S65 which is "H"/"L" to control the active/inactive state of the potential stabilizing circuit. Thus, the activation signal S65 is normally set to "H" to achieve a circuit equivalent to the circuit of the thirteenth mode, and the activation signal S65 is set to "L" to separate the current path between the output signal line 63 and the ground when no excess current flow is desirable, for example, when the chip is stationary.

<Example of Application 1>

Figure 81:
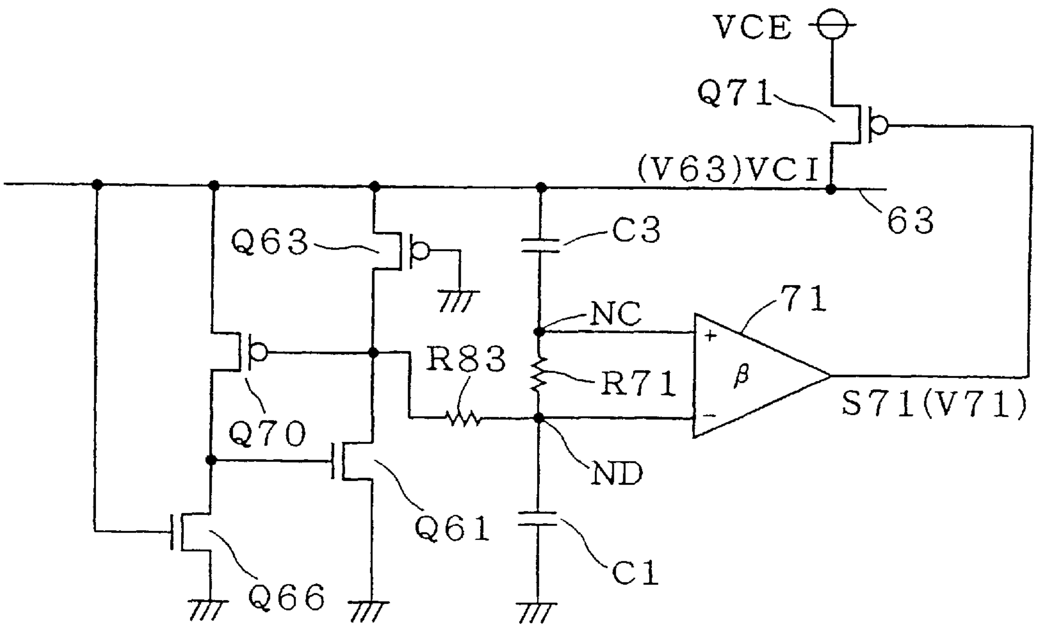
FIG. 81 is a circuit diagram showing a first example of application of the potential stabilizing circuit of the twenty-sixth preferred embodiment.

FIG. 81 is a circuit diagram of an example of application of the potential stabilizing circuit of the thirteenth mode of the twenty-sixth preferred embodiment shown in FIG. 79 to the internal power-source potential supply circuit.

As shown in FIG. 81, the resistor R71 is connected between the node ND serving as the negative input terminal of the comparator 71 and the node NC serving as the positive input terminal thereof. The capacitor C1 is connected between the node ND and the ground. The output potential V71 from the comparator 71 is applied as the control signal S71 to the gate of the PMOS driver transistor Q71. The driver transistor Q71 has the source connected to the external power-source potential VCE and the drain for providing the internal power-source potential VCI which in turn is applied as the feedback potential to the node NC through the capacitor C3.

The drain of the NMOS transistor Q61 of the potential stabilizing circuit of the thirteenth mode is connected to the node ND through a resistor R83.

In this arrangement, with the internal power-source potential VCI being stable, when the comparator 71 is in the stable state, that is, when the potential VND at the node ND equals the potential at the node NC, then the comparator 71 is normally established not to act upon the output node of the comparator 71.

If the internal power-source potential VCI varies, the capacitor C3 detects the variation to vary the potential at the node NC. The internal power-source potential VCI is restored by the potential difference between the varied potential VND at the node ND and the potential VNC at the node NC. The potential at the node NC is varied by the coupling of the capacitor C3. The difference between the potential VND at the node ND and the potential VNC at the node NC at this time is transmitted to the comparator 71. The comparator 71 operates while the potential difference exists to restore the output potential V71 to the original potential. The time period of this operation is determined by the length of time required until the potential VND at the node ND equals the potential VNC at the node NC by the resistance of the resistor R71 formed between the node ND and the node NC. The time period of operation is varied depending upon the capacitance of the capacitor C3 and the resistance of the resistor R71.

For example, if the internal power-source potential VCI shifts to a lower level, the potential VNC at the node NC also shifts to a lower level because of the capacitor coupling. Thus, the potential VNC is relatively lower than the potential VND, and the comparator 71 receives the potential difference between the potential VNC and the potential VND to operate. The comparator 71 functions to raise the internal power-source potential VCI to restore the lowered internal power-source potential VCI.

At the same time, the potential difference between the output potential V63 and the ground level decreases to decrease the gate-source voltage of the NMOS transistor Q61 and PMOS transistor Q71, resulting in a decreased amount of current. Thus, the internal power-source potential VCI which has been stable by the constant current flow momentarily shifts to the lower level to reduce the current flowing between the output signal line 63 and the ground, and the amount of reduced current acts substantially as a current for charging the output signal line 63 to function to raise the internal power-source potential VCI, thereby restoring the lowered output potential V71.

If the internal power-source potential VCI shifts to a higher level, on the other hand, the potential VNC at the node NC also shifts to a higher level because of the capacitor coupling Thus, the potential VNC at the node NC is relatively higher than the potential VND at the node ND, and the comparator 71 receives the potential difference between the potential VNC and the potential VND to operate. The comparator 71 acts to change the gate potential of the driver transistor Q71 so that the driver transistor 71 turns off. However, if the driver transistor Q71 is in the OFF position in the stable state, no changes occur in the internal power-source potential VCI.

At the same time, the potential difference between the output potential V63 and the ground level increases to increase the gate-source voltage of the NMOS transistor Q61 and PMOS transistor Q71, resulting in an increased amount of current. Thus, the internal power-source potential VCI which has been stable by the constant current flow momentarily shifts to the higher level to increase the flowing current, and the amount of increased current acts substantially as a current for discharging the output signal line 63 to function to lower the internal power-source potential VCI, thereby restoring the raised internal power-source potential VCI.

The time period over which the comparator 71 operates is the time period over which the potential difference exists between the potential VND at the node ND and the potential VNC at the node NC. Varying the resistance of the resistor R71 may change the setting of the time period of operation.

<Example of Application 2>

Figure 82:
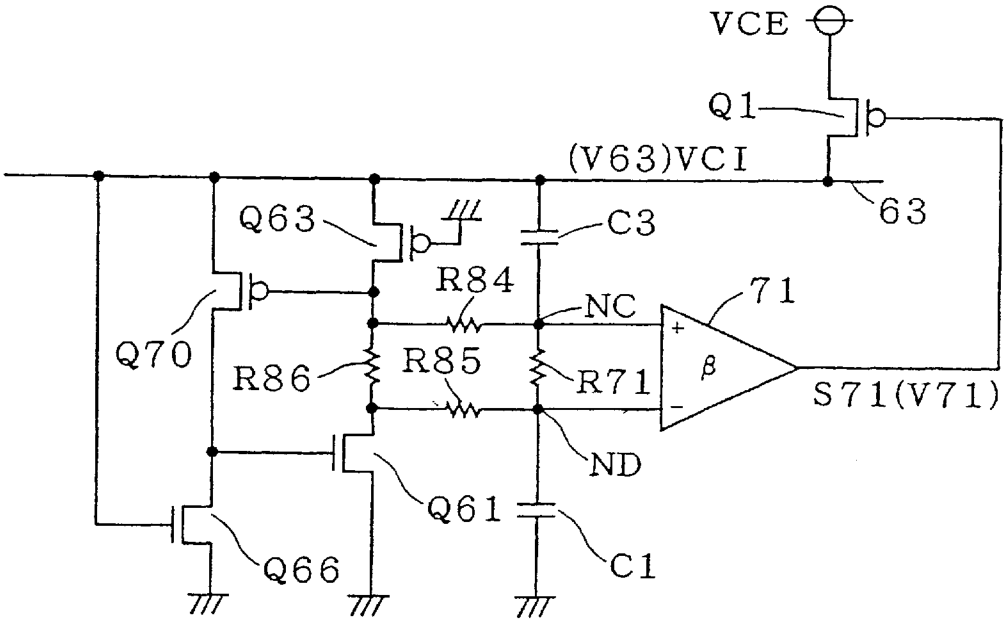
FIG. 82 is a circuit diagram showing a second example of application of the potential stabilizing circuit of the twenty-sixth preferred embodiment.

FIG. 82 is a circuit diagram of an example of application of the potential stabilizing circuit of the thirteenth mode of the twenty-sixth preferred embodiment shown in FIG. 79 to the internal power-source potential supply circuit.

As shown in FIG. 82, a resistor R86 is connected between the drain of the PMOS transistor Q63 and the drain of the NMOS transistor Q61 of the potential stabilizing circuit of the thirteenth mode. The node NC is connected to the drain of the PMOS transistor Q63 and a first end of the resistor R86 through a resistor R84, and the node ND is connected to the drain of the NMOS transistor Q61 and a second end of the resistor R86 through a resistor R85. Other constructions of FIG. 82 are similar to those of the example of application 1 shown in FIG. 81.

In this application, the comparator 71 is normally established not to act upon the output node when the comparator 71 is in the stable state, that is, when the offset potential VOS caused by the resistor R86 is set between the potential VND at the node ND and the potential VNC at the node NC if the internal power-source potential VCI is stable.

If the internal power-source potential VCI varies, the capacitor C3 detects the variation to vary the potential at the node NC. The internal power-source potential VCI is restored by the potential difference between the potential VND at the node ND and the potential VNC at the node NC. The potential at the node NC is varied by the coupling of the capacitor C3. The difference between the potential VND at the node ND and the potential VNC at the node NC at this time is transmitted to the comparator 71. The comparator 71 operates while the potential difference exists to restore the output potential V71 to the original potential. The time period of this operation is determined by the length of time required until the potential VND at the node ND equals the potential VNC at the node NC by the resistance of the resistor R71 formed between the node ND and the node NC. The time period of operation is varied depending upon the capacitance of the capacitor C3 and the resistance of the resistor R71.

For example, if the internal power-source potential VCI shifts to a lower level by the amount not less than the offset potential VOS, the potential VNC at the node NC also shifts to a lower level because of the capacitor coupling. Thus, the potential VNC is relatively lower than the potential VND, and the comparator 71 receives the potential difference between the potential VNC and the potential VND to operate. The comparator 71 functions to raise the internal power-source potential VCI to restore the lowered internal power-source potential VCI.

At the same time, the potential difference between the output potential V63 and the ground level decreases to decrease the gate-source voltage of the NMOS transistor Q61 and PMOS transistor Q71, resulting in a decreased amount of current. Thus, the internal power-source potential VCI which has been stable by the constant current flow momentarily shifts to the lower level to reduce the current flowing between the output signal line 63 and the ground, and the amount of reduced current acts substantially as a current for charging the output signal line 63 to function to raise the internal power-source potential VCI, thereby restoring the lowered output potential V71.

As above described, the comparator 71 does not raise the output potential V71 until the potential at the output node of the comparator 71 changes and the potential VNC at the node NC becomes lower than the potential VND at the node ND by the amount greater than the offset potential VOS. Previously setting the offset potential VOS in this manner prevents the comparator 71 from operating in response to a relatively small variation in the output potential V71.

If the internal power-source potential VCI shifts to a higher level, on the other hand, the potential VNC at the node NC also shifts to a higher level because of the capacitor coupling. Thus, the potential VNC at the node NC is relatively higher than the potential VND at the node ND, and the comparator 71 receives the potential difference between the potential VNC and the potential VND to operate. The comparator 71 acts to change the gate potential of the driver transistor Q71 so that the driver transistor Q71 turns off. However, if the driver transistor Q71 is in the OFF position in the stable state, no changes occur in the internal power-source potential VCI.

At the same time, the potential difference between the output potential V63 and the ground level increases to increase the gate-source voltage of the NMOS transistor Q61 and PMOS transistor Q71, resulting in an increased amount of current. Thus, the internal power-source potential VCI which has been stable by the constant current flow momentarily shifts to the higher level to increase the flowing current, and the amount of increased current acts substantially as a current for discharging the output signal line 63 to function to lower the internal power-source potential VCI, thereby restoring the raised internal power-source potential VCI.

The time period over which the comparator 71 operates is the time period over which the potential difference exists between the potential VND at the node ND and the potential VNC at the node NC. Varying the resistance of the resistor R71 may change the setting of the time period of operation.

Principle of Twenty-seventh to Twenty-ninth Preferred Embodiments

<Problem>

In the internal power-source potential supply circuit represented by the arrangement of FIG. 1, the external power-source potential VCE is level-converted to be supplied as the internal power-source potential VCI for driving the load. The conversion from the external power-source potential VCE to the internal power-source potential VCI is performed by the comparator 1 and the PMOS transistor Q1 having the gate receiving the control signal S1 from the comparator 1. The inputs to the comparator 1 are the reference potential Vref and the divided internal power-source potential DCI obtained by feeding back the internal power-source potential VCI.

In the internal power-source potential supply circuit as above constructed, if the divided internal power-source potential DCI is lower than the reference potential Vref, the control signal S1 has a lower potential to cause the PMOS transistor Q1 to conduct heavily. This increases the current supply capability from the internal power-source potential VCI to raise the lowered internal power-source potential VCI. Conversely, if the divided internal power-source potential DCI is higher than the reference potential Vref, the control signal S1 has a higher potential to cause the PMOS transistor Q1 to conduct lightly. This stops the current supply capability from the internal power-source potential VCI to prevent further increase in raised internal power-source potential VCI. The comparator 1 may include a differential amplifier having a current mirror circuit. This function controls the internal power-source potential VCI so that the divided internal power-source potential DCI equals the reference potential Vref.

However, the decrease in the potential restoring delay time interval between detecting the increase and decrease in the internal power-source potential VCI and restoring the internal power-source potential VCI to a steady state has a limitation. Increase in the amount of current flowing in the internal power-source potential supply circuit speeds up the operation of the comparator 1 for driving the gate of the PMOS transistor Q1 for current supply to achieve the decrease in potential restoring delay time correspondingly. However, this is not practicable since current consumption becomes greater than necessary.

In this manner, the presence of the potential restoring delay time of the internal power-source potential VCI always means the presence of a potential drop from a set potential. Thus, the semiconductor integrated circuit which is the load receiving the internal power-source potential VCI to operate is adversely affected to cause a delay of operation and the like.

Description will be given on an arrangement which is not influenced by the potential drop of the output potential which is prone to a potential drop, such as the internal power-source potential VCI for the internal power-source potential supply circuit shown in FIG. 1.

<Method of Improvement>

Figure 83:
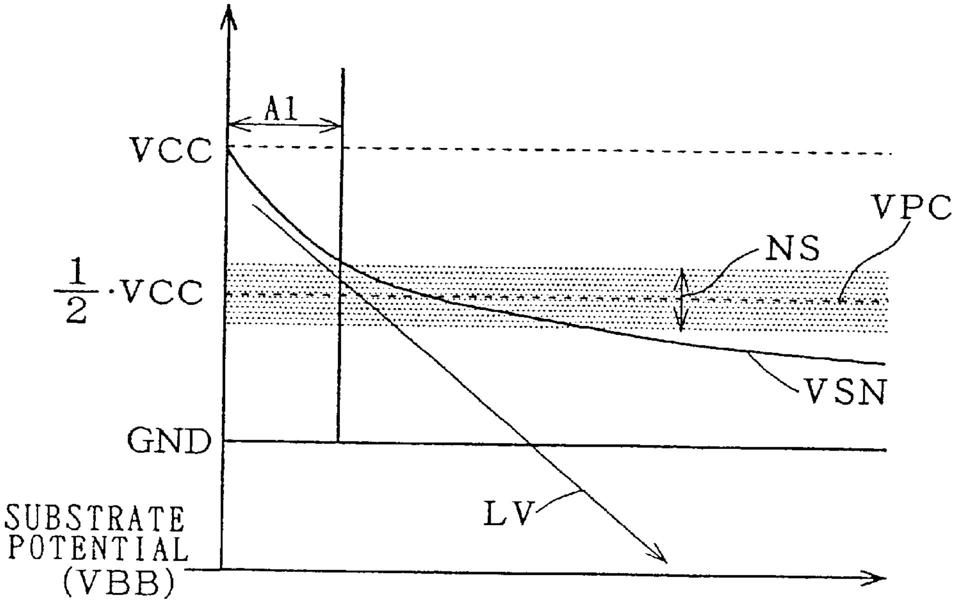
FIG. 83 is a graph representing a problem of a leak current in a DRAM.

An object of twenty-seventh to twenty-ninth preferred embodiments is to improve the retention characteristic of memory cells during the DRAM self-refresh operation and the like. Referring to FIG. 83, a storage potential VSN written to a storage node (SN) of a memory cell in an earlier stage decreases over time along a leak direction LV because of charge leakage.

Charges mainly leak into a substrate formed with memory cells. When the storage potential VSN reaches a sense amplifier insensitive region NS adjacent the precharge potential VCC/2 of bit lines, the reduction in the amount of read charges from the memory cells to the bit lines prevents a sense amplifier connected to the bit line from sufficiently detecting and amplifying data, resulting in read-out error.

The read-out error does not arise just when the storage potential VSN reaches VCC/2 but practically arises when the storage potential VSN enters the sense amplifier insensitive region NS prior to reaching VCC/2. That is, the storage potential VSN falls in the sense amplifier insensitive region NS prior to reaching VCC/2. This correspondingly shortens a retention characteristic security range A1 and deteriorates the retention characteristic.

<First Method>

Figure 84:
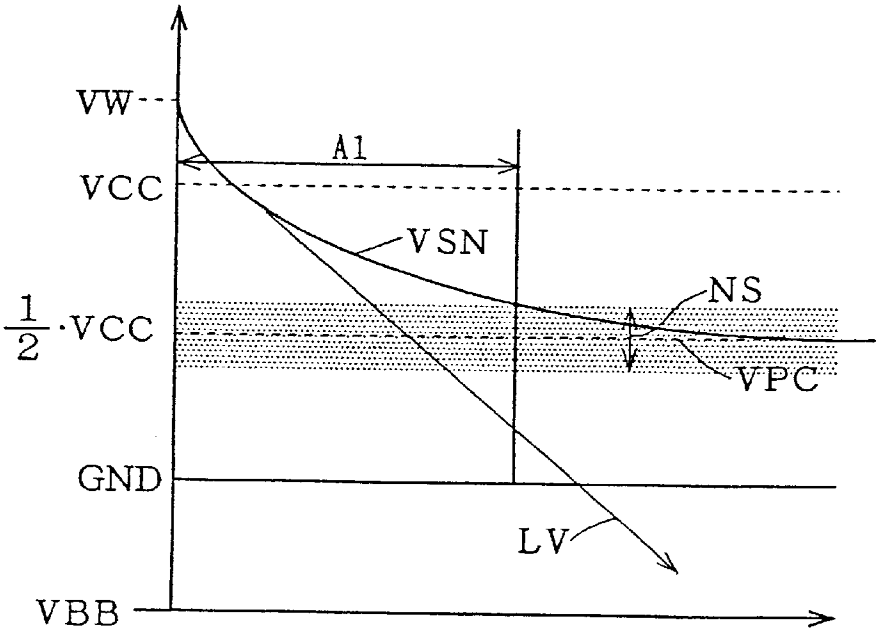
FIG. 84 is a graph showing the result of a first method for improvement in retention characteristics of the DRAM.

Various techniques may be considered to improve the retention characteristic. To increase the early storage potential VSN, as shown in FIG. 84, setting a write voltage VW during the write operation higher than the power-source potential VCC of the normal internal power-source potential VCI may extend the retention characteristic security range Al which is time required until the storage potential VSN reaches the sense amplifier insensitive region NS. The internal power-source potential supply circuit of the second preferred embodiment shown in FIG. 10 and the like may be used, for example, as the internal power-source potential supply circuit for supplying two types of internal power-source potentials VCI.

<Second Method>

Figure 85:
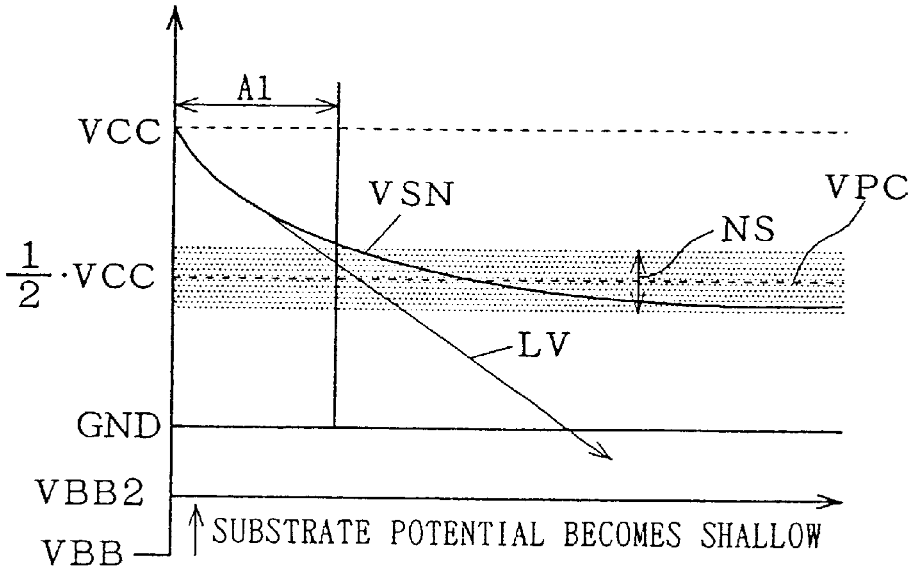
FIG. 85 is a graph showing the result of a second method for improvement in retention characteristics of the DRAM.

Referring to FIG. 85, if the substrate potential VBB is shallow (close to the GND level), the electric field between the storage node and the substrate is alleviated when the charges accumulate at the storage node leak into the substrate. and the retention characteristic security range Al until the storage potential VSN reaches the sense amplifier insensitive region NS may be extended.

<Third Method>

Figure 86:
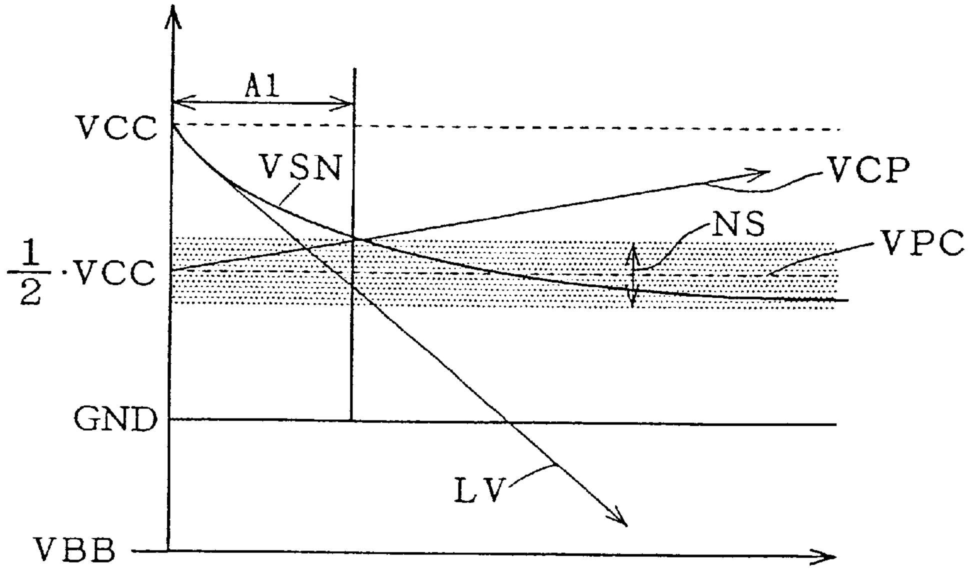
FIG. 86 is a graph showing the result of a third method for improvement in retention characteristics of the DRAM.

Referring to FIG. 86, if a cell plate potential VCP of a cell plate which is an electrode opposite to the storage node is varied to rise so as to reverse the storage potential VSN, the storage potential VSN rises because of a memory cell coupling phenomenon, causing a phenomenon equivalent to the increase in the amount of charges This extends the retention characteristic security range A1 until the storage potential VSN reaches the sense amplifier insensitive region NS.

<Fourth Method>

Figure 87:
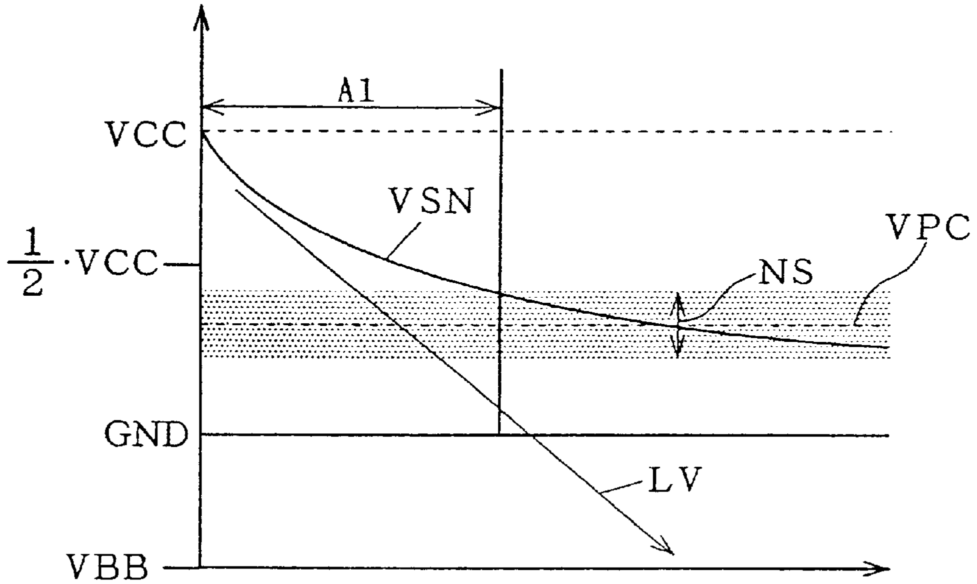
FIG. 87 is a graph showing the result of a fourth method for improvement in retention characteristics of the DRAM.

With reference to FIG. 87, if a precharge potential VPC of a bit line (for example, a bit line BL or /BL shown in FIG. 95) is made lower than the normal precharge potential VCC/2, the sense amplifier insensitive region NS simultaneously shifts to a lower potential (substrate potential). This extends the retention characteristic security range A1 until the storage potential VSN reaches the sense amplifier insensitive region NS.

<Fifth Method>

Figure 88:
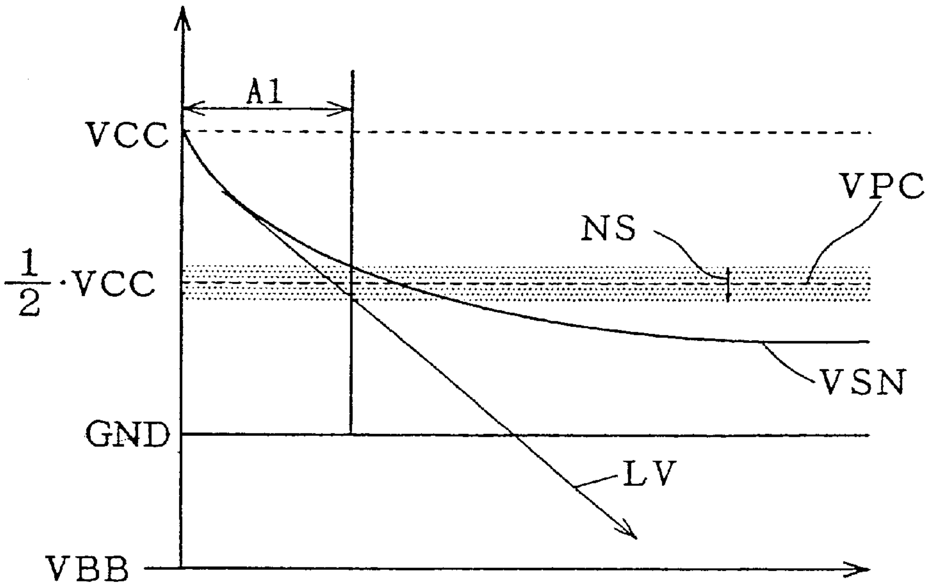
FIG. 88 is a graph showing the result of a fifth method for improvement in retention characteristics of the DRAM.

Referring to FIG. 88, the sensitivity of the sense amplifier may be increases to reduce the sense amplifier insensitive region NS itself, thereby extending the retention characteristic security range A1.

Twenty-seventh Preferred Embodiment

<First Mode>

Figure 89:
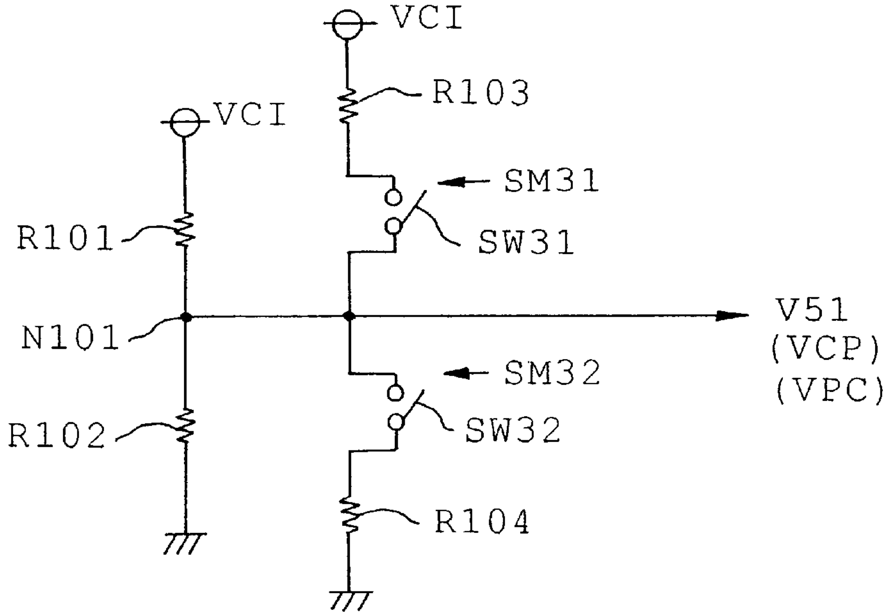
FIG. 89 is a circuit diagram of an output potential supply circuit according to a first mode of a twenty-seventh preferred embodiment of the present invention.

FIG. 89 is a circuit diagram of an output potential supply circuit according to a first mode of the twenty-seventh preferred embodiment of the present invention. As shown in FIG. 89, resistors R101 and R102 are connected in series between the internal power-source potential VCI and the ground, and a resistor R103, switches SW31 sand SW32 and a resistor R104 are connected in series between the internal power-source potential VCI and the ground. The switches SW31 and SW32 turn on/off in response to selection signals SM31 and SM32, respectively. A node N101 between the resistors R101 and R102 is connected to a node between the switches SW31 and SW32. A potential at the node N101 is specified as an output potential V51.

With this arrangement, the switches SW31 and SW32 are turned off by using the selection signals SM31 and SM32 in normal operation. If the output potential is desired to be changed to "H" (VCE) or "L" (GND) during the memory chip test, data retention mode, and sleep mode, one of the switches SW31 and SW32 is turned on to change the ratio of the resistance between the internal power-source potential VCI and the node N101 to the resistance between the ground potential and the node N101, thereby changing the output potential V51 to "H" or "L".

Specifically, if the selection signals SM31 and SM32 are provided so that only the switch SW31 turns on, the resistance between the internal power-source potential VCI and the node N101 decreases, and the output potential V51 shifts to a higher level than the potential during the normal operation. Conversely. if the selection signals SM31 and SM32 are provided so that only the switch SW32 turns on, the level of the output potential V51 is lower than the potential during the normal operation.

Figure 90:
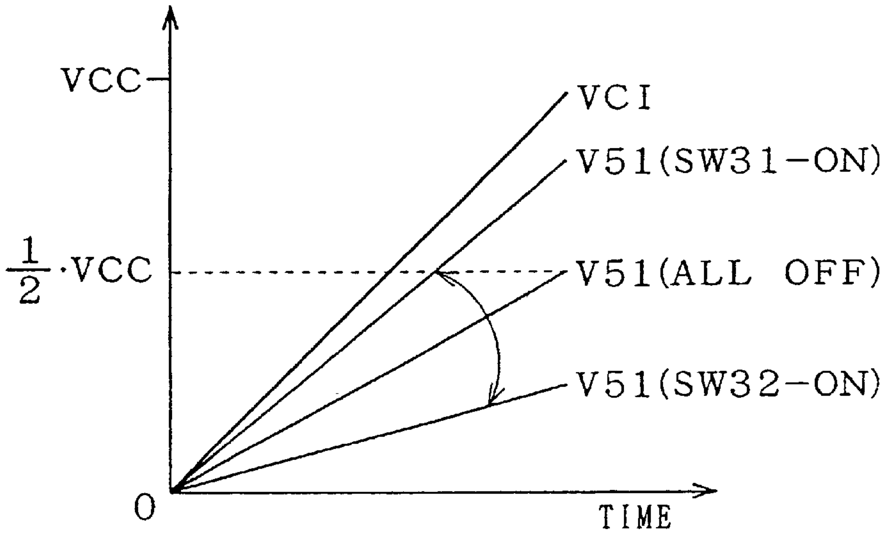
FIG. 90 is a graph illustrating the operation of the first mode of the twenty-seventh preferred embodiment.

FIG. 90 is a graph showing the result of operation of the output potential supply circuit of the first mode. As shown in FIG. 90, both of the switches SW31 and SW32 are off during the normal operation. Thus, if the resistors R010 and R102 have the same resistance, the output potential V51 equals VCC/2 when the internal power-source potential VCI rises up to the power-source potential VCC.

If only the switch SW31 is turned on, the output potential V51 is set to a potential higher than VCC/2. If only the switch SW32 is turned on, the output potential V51 is set to a potential lower than VCC/2.

Thus, the output potential V51 of the output potential supply circuit of the first mode may be used as the cell plate potential VCP (for example, the cell plate potential VCP shown in FIG. 95) to be applied to the third method. Specifically, the cell plate potential VCP which equals VCC/2 is outputted by turning off the switches SW31 and SW32 during the normal operation. In the cases of the memory chip test, data retention mode and sleep mode, only the switch SW31 is turned on to raise the cell plate potential VCP up to a potential higher than VCC/2. At this time, the output potential V51 (cell plate potential VCP) rises as illustrated in FIG. 86 because of an RC time constant of the output capacitance associated with the output of the output potential V51 and the resistor constituting the circuit.

The output potential V51 of the first mode may be used as the precharge potential VPC to be applied to the fourth method. Specifically, the precharge potential VPC which equals VCC/2 is outputted by turning off the switches SW31 and SW32 during the normal operation. In the cases of the memory chip test, data retention mode, and sleep mode, only the switch SW32 is turned on to set the precharge potential VPC to a potential lower than VCC/2 as illustrated in FIG. 87.

<Second Mode>

Figure 91:
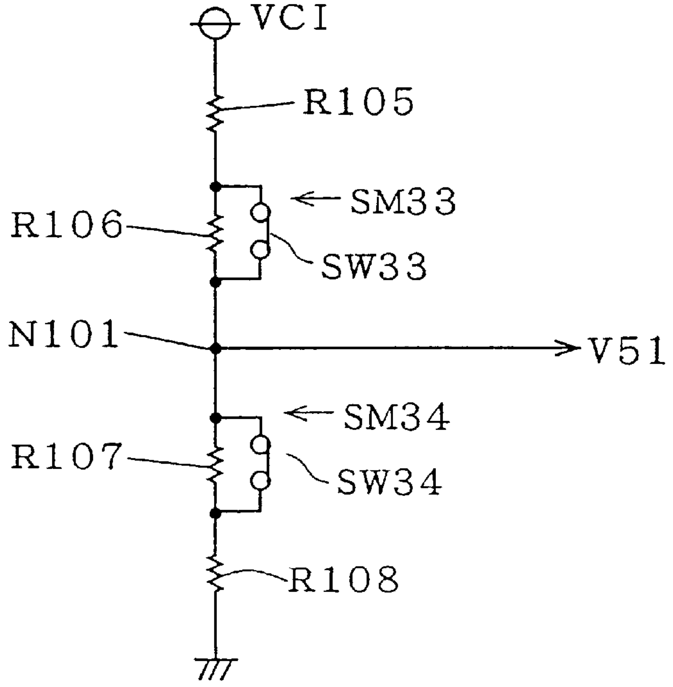
FIG. 91 is a circuit diagram of the output potential supply circuit according to a second mode of the twenty-seventh preferred embodiment.

FIG. 91 is a circuit diagram of the output potential supply circuit according to a second mode of the twenty-seventh preferred embodiment of the present invention. As shown in FIG. 91, resistors R105 to R108 are connected in series between the internal power-source potential VCI and the ground. A switch SW33 is connected across the resistor R106, and a switch SW34 is connected across the resistor R107. The switches SW33 and SW34 turn on/off in response to selection signals SM33 and SM34, respectively. A potential at the node N101 between the resistors R106 and R107 is specified as the output potential V51.

With this arrangement, the switches SW33 and SW34 are turned on by using the selection signals SM33 and SM34 in normal operation. If the output potential is desired to be changed to "H" (VCE) or "L" (GND) during the memory chip test, data retention mode, and sleep mode, one of the switches SW31 and SW32 is turned on to change the ratio of the resistance between the internal power-source potential VCI and the node N101 to the resistance between the ground potential and the node N101, thereby changing the output potential V51 to "H" or "L".

Specifically, if the selection signals SM33 and SM34 are provided so that only the switch SW33 turns on, the resistance between the internal power-source potential VCI and the node N101 increases, and the output potential V51 shifts to a lower level than the potential during the normal operation. Conversely. if the selection signals SM33 and SM34 are provided so that only the switch SW34 turns on, the level of the output potential V51 is higher than the potential during the normal operation.

Figure 92:
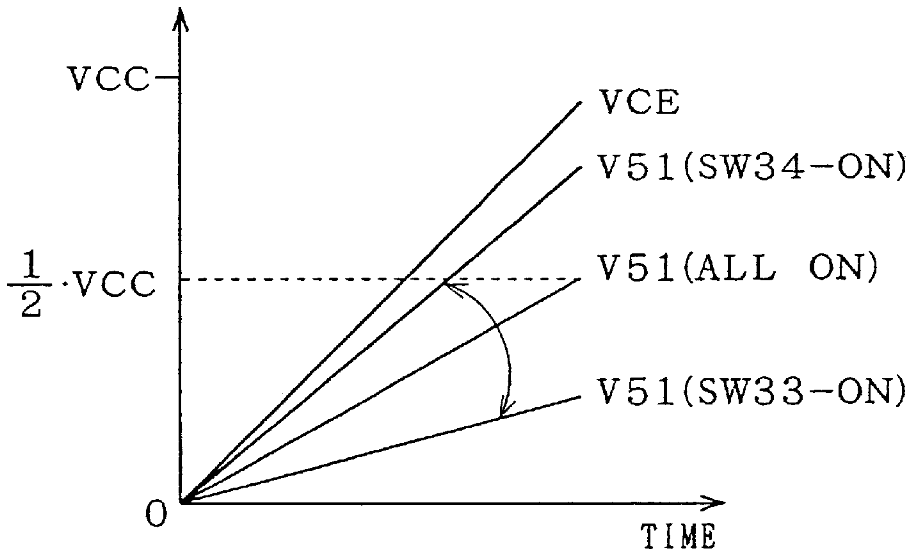
FIG. 92 is a graph illustrating the operation of the second mode of the twenty-seventh preferred embodiment.

FIG. 92 is a graph showing the result of operation of the output potential supply circuit of the second mode. As shown in FIG. 92, both of the switches SW33 and SW34 are on during the normal operation. Thus, if the resistors R105 and R108 have the same resistance, the output potential V51 equals VCC/2 when the internal power-source potential VCI rises up to the power-source potential VCC.

If only the switch SW33 is turned on, the output potential V51 is set to a potential lower than VCC/2. If only the switch SW34 is turned on, the output potential V51 is to a potential higher than VCC/2.

Thus, the output potential V51 of the output potential supply circuit of the second mode may be used as the cell plate potential VCP to be applied to the third method. Specifically, the cell plate potential VCP which equals VCC/2 is outputted by turning on the switches SW33 and SW34 during the normal operation. In the cases of the memory chip test, data retention mode and sleep mode, only the switch SW34 is turned on to raise the cell plate potential VCP up to a potential higher than VCC/2. At this time, the output potential V51 rises because of an RC time constant of the output capacitance associated with the output of the output potential V51 and the resistor constituting the circuit.

The output potential V51 of the second mode may be used as the precharge potential VPC to be applied to the fourth method. Specifically, the precharge potential VPC which equals VCC/2 is outputted by turning on the switches SW33 and SW34 during the normal operation. In the cases of the memory chip test, data retention mode, and sleep mode, only the switch SW33 is turned on to set the precharge potential VPC to a potential lower than VCC/2.

<Third Mode>

Figure 93:
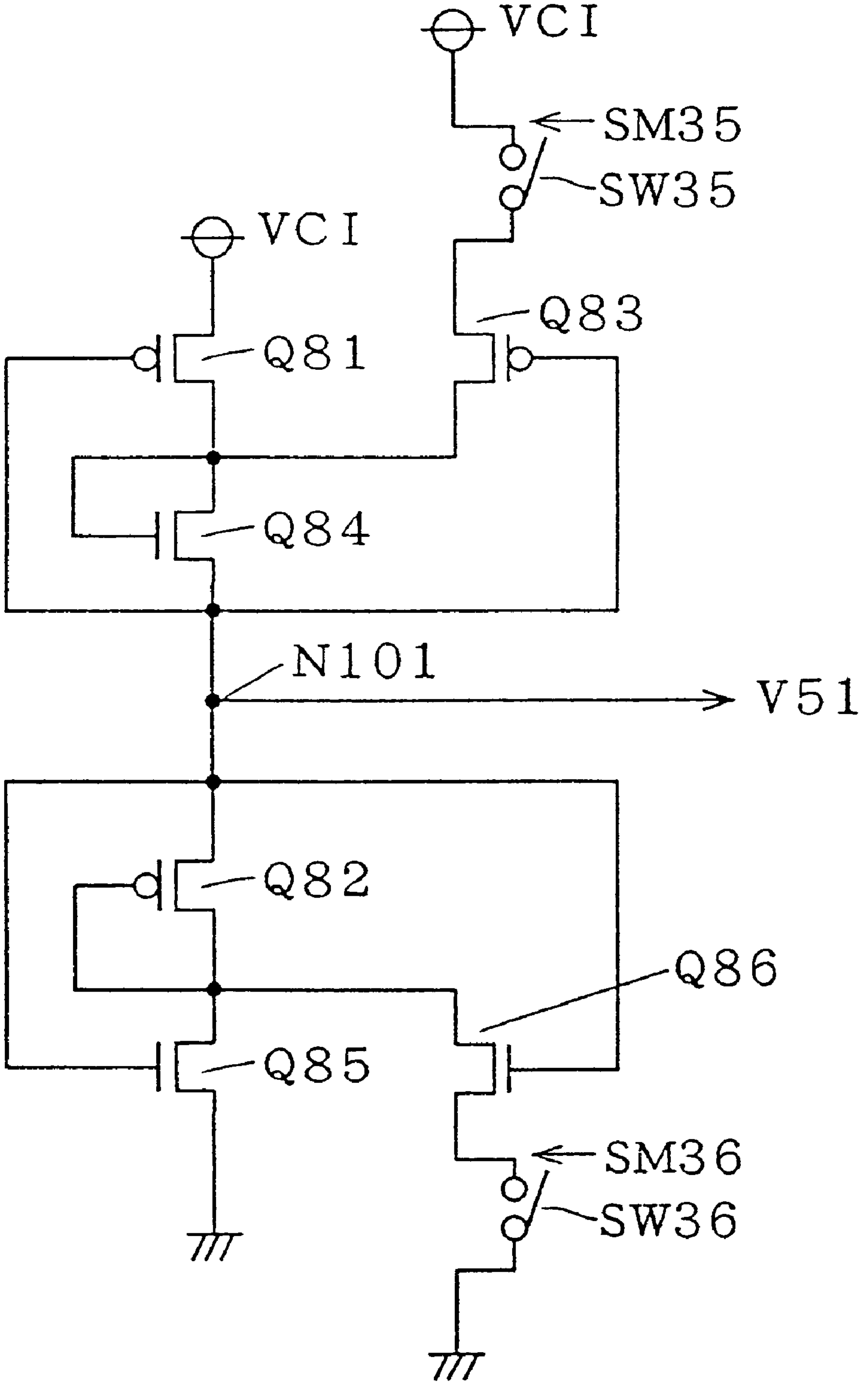
FIG. 93 is a circuit diagram of the output potential supply circuit according to a third mode of the twenty-seventh preferred embodiment.

FIG. 93 is a circuit diagram of the output potential supply circuit according to a third mode of the twenty-seventh preferred embodiment of the present invention. As shown in FIG. 93, the output potential supply circuit comprises PMOS transistors Q81 to Q83, NMOS transistors Q84 to Q86, and switches SW35 and SW36. The transistors Q81, Q84, Q82, and Q85 are connected in this order between the internal power-source potential VCI and the ground. The drain of the PMOS transistor Q81 is connected to the drain and gate of the NMOS transistor Q84 and the drain of the PMOS transistor Q83. The source of the NMOS transistor Q84 is connected to the gate of the PMOS transistor Q81, the source of the PMOS transistor Q82, the gate of the PMOS transistor Q83, and the gates of the NMOS transistors Q85 and Q86. The drain and gate of the PMOS transistor Q82 are connected to the drain of the NMOS transistor Q85 and the drain of the NMOS transistor Q86. The source of the PMOS transistor Q83 is connected to the internal power-source potential VCI through the switch SW35, and the source of the NMOS transistor Q86 is grounded through the switch SW36. The switches SW35 and SW36 turn on/off in response to selection signals SM35 and SM36, respectively. A potential of the source of the NMOS transistor Q82 (at the node N101) serves as the output potential V51.

With this arrangement, the switches SW35 and SW36 are turned off by using the selection signals SM35 and SM36 in normal operation. If the output potential is desired to be changed to "H" or "L" during the memory chip test, data retention mode, and sleep mode, one of the switches SW35 and SW36 is turned on to change the ratio of the resistance between the internal power-source potential VCI and the node N101 to the resistance between the ground potential and the node N101, thereby changing the output potential V51 to "H" or "L".

Specifically, if the selection signals SM35 and SM36 are provided so that only the switch SW35 turns on in the same manner as in the first mode, the resistance between the internal power-source potential VCI and the node N101 decreases, and the output potential V51 shifts to a higher level. Conversely, the selection signals SM35 and SM36 are provided so that only the switch SW36 turns on, the level of the output potential V51 is lowered.

Figure 94:
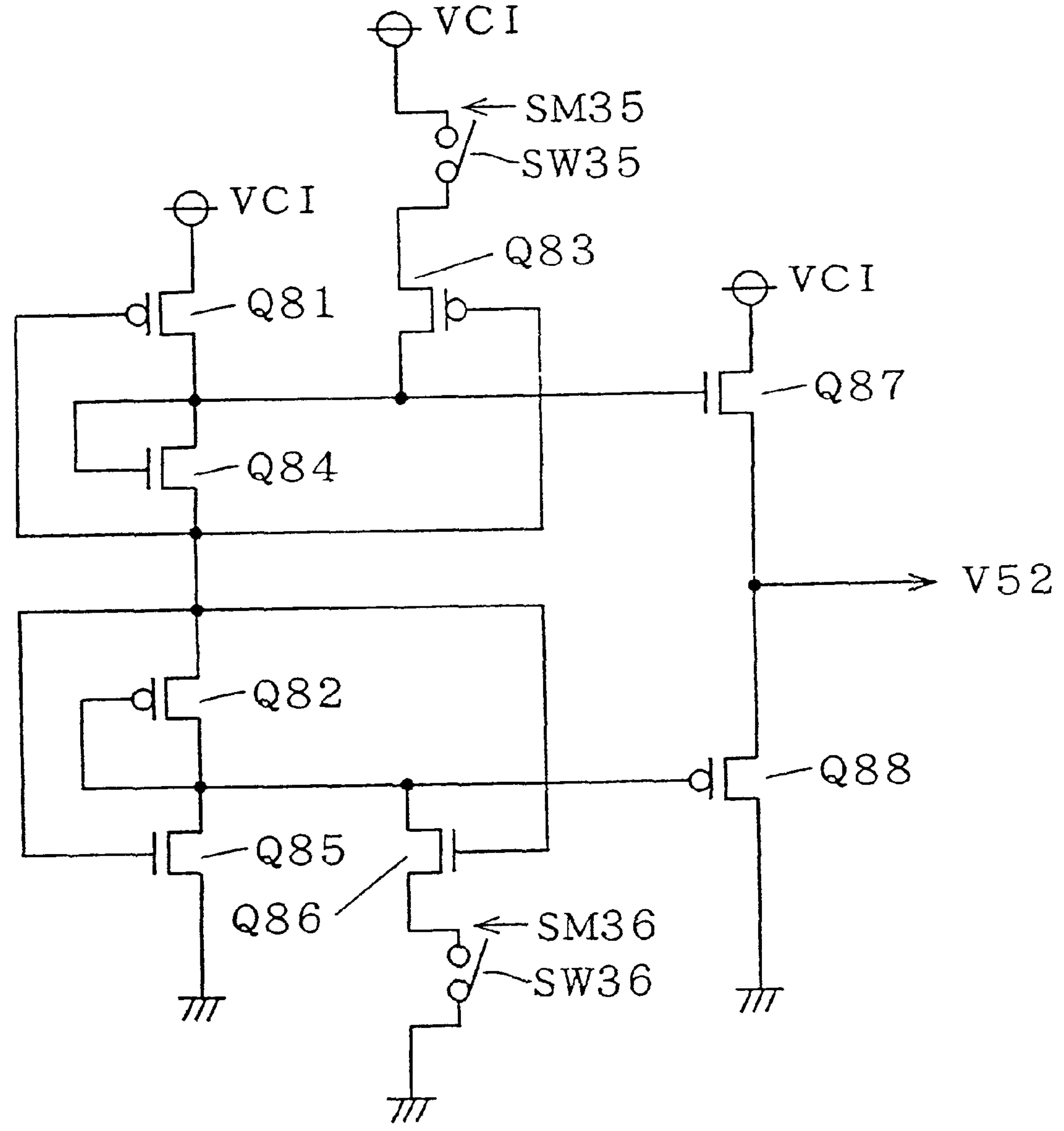
FIG. 94 is a circuit diagram of another form of the output potential supply circuit according to the third mode of the twenty-seventh preferred embodiment.

The output potential supply circuit may be constructed as shown in FIG. 94. As illustrated in FIG. 94, an NMOS transistor Q87 and a PMOS transistor Q88 are connected in series between the internal power-source potential VCI and the ground. The gate of the NMOS transistor Q87 is connected to the source of the NMOS transistor Q83, and the gate of the PMOS transistor Q88 is connected to the drain of the NMOS transistor Q86. A potential of the source of the NMOS transistor Q87 (the drain of the PMOS transistor Q88) serves as an output potential V52. Other constructions of FIG. 94 are similar to those of FIG. 93.

The arrangement of FIG. 94 is adapted such that a buffer circuit comprised of the NMOS transistor Q87 and the PMOS transistor Q88 buffers the potential related to the output potential V51 of FIG. 93 to output the output potential V52.

Twenty-eighth Preferred Embodiment

Figure 95:
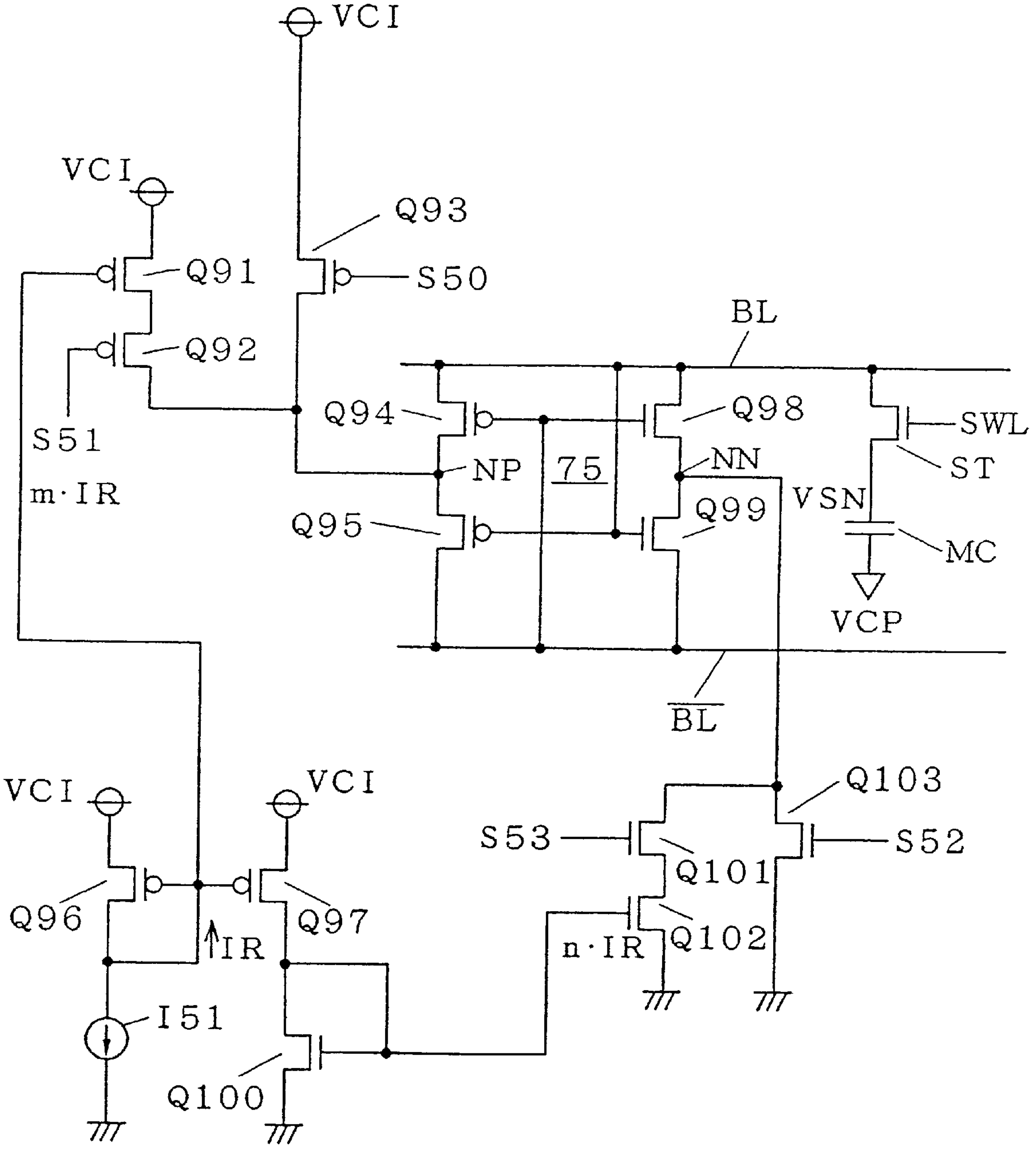
FIG. 95 is a circuit diagram of a sense amplifier according to a twenty-seventh preferred embodiment of the present invention.

FIG. 95 is a circuit diagram of a sense amplifier according to a twenty-eighth preferred embodiment of the present invention. As shown in FIG. 95, the sense amplifier comprises PMOS transistors Q91 to Q97, NMOS transistors Q98 to Q103, and a constant current source I51.

An amplifying portion 75 including the transistors Q94, Q95, Q98, and Q99 is connected between a pair of bit lines BL and $\overline{BL}$. The PMOS transistors Q94 and Q95 are connected in series between the bit lines BL and $\overline{BL}$, and the NMOS transistors Q98 and Q99 are connected in series between the bit lines BL and $\overline{BL}$. The gates of the transistors Q94 and Q98 are connected to the bit line $\overline{BL}$, and the gates of the transistors Q95 and Q99 are connected to the bit line BL.

A first electrode of a memory cell MC is connected to the bit line BL through a selection transistor ST having a gate receiving a selection signal SWL. The potential of the first electrode of the memory cell MC is a storage potential, and a second electrode of the memory cell MC receives the cell plate potential VCP. Only one memory cell MC is illustrated for purposes of convenience, but a plurality of memory cells MC are practically connected between one pair of bit lines BL and $\overline{BL}$.

The PMOS transistors Q96 and Q97 having sources commonly receiving the internal power-source potential VCI are current-mirror connected, and the gate and drain of the PMOS transistor Q96 are grounded through the constant current source I51. The drain of the PMOS transistor Q97 is connected to the drain and gate of the NMOS transistor Q100 having a source grounded. The constant current source I51 supplies a slight reference current IR.

The PMOS transistor Q91 having a source receiving the internal power-source potential VCI is current-mirror connected to the PMOS transistor Q96 in such a manner that the transistor size ratio of the PMOS transistor Q91 to the PMOS transistor Q96 is 1 to n (n>1). The drain of the PMOS transistor Q91 is connected to a first node NP between the PMOS transistors Q94 and Q95 of the amplifying portion 75 through the PMOS transistor Q92. The PMOS transistor Q93 is connected between the internal power-source potential VCI and the node NP. Restoration signals S51, S50 are applied to the gates of the PMOS transistors Q92 and Q93, respectively.

The NMOS transistor Q102 having a source grounded is current-mirror connected to the NMOS transistor Q100 in such a manner that the transistor size ratio of the NMOS transistor Q102 to the NMOS transistor Q100 is 1 to m (m>1). The drain of the NMOS transistor Q102 is connected to a node NN between the NMOS transistors Q98 and Q99 of the amplifying portion 75 through the NMOS transistor Q101. The NMOS transistor Q103 is connected between the node NN and the ground. Sense signals S52, S53 are applied to the gates of the NMOS transistors Q103 and Q101, respectively.

The sense amplifier having the above described construction is adapted to slowly perform a sense operation during the sense operation at the time of self-refresh to increase the sensitivity of the sense amplifier to extend the retention characteristic security range A1 which is time required until the storage potential VSN reaches the sense amplifier insensitive region NS of the amplifying portion 75 of the sense amplifier, improving the retention characteristic.

During the normal operation, a high-speed operation is sometimes required, and it is hence necessary to charge and discharge the source nodes of the sense amplifier (NMOS transistors Q98 and Q99) and a restoration amplifier (PMOS transistors Q94 and Q95 at high speeds.

During the self-refresh operation, noises are quiet and the low-speed operation is permitted. In such cases, the source nodes of the sense amplifier and restoration amplifier are charged and discharged, with current limited, to reduce the sense amplifier insensitive region NS, improving the sensitivity of the sense amplifier.

The sense amplifier of the twenty-eighth preferred embodiment having the above described construction may be applied to the fifth method. Specifically, the restoration signals S50, S51 and sense signals S52, S53 are set to "L", "H", "H", "L", respectively, during the normal operation to sufficiently increase the charging and discharging current of the source nodes of the sense amplifier and the restoration amplifier for high-speed operation.

On the other hand, during the sense operation for self-refresh, the restoration signals S50, S51 and sense signals S52, S53 are set to "L", "L", "H", respectively, to limit the charging and discharging current of the source nodes of the sense amplifier and restoration amplifier to n times and m times the reference current IR, respectively. The values n and m may be equal to each other or different from each other. Consequently, the sensitivity is improved over the sensitivity during the normal operation.

The self-refresh operation may be used when an operation is required to be kept noise-free other than when the self-refresh operation is performed. An example of the operation which is required to be kept noise-free is such an operation that the operating current when a multiplicity of devices formed on the same substrate operate in unison momentarily reaches its peak, resulting in noises on power-source lines.

Twenty-ninth Preferred Embodiment

Figure 96:
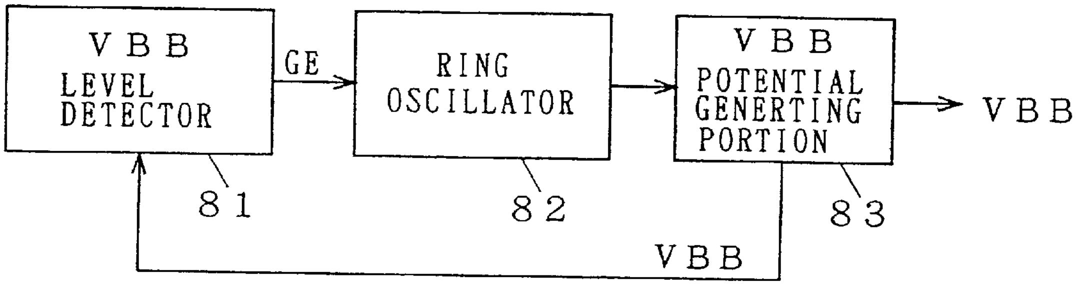
FIG. 96 is a block diagram of a VBB generating circuit according to a twenty-ninth preferred embodiment of the present invention.

FIG. 96 is a block diagram of a VBB generating circuit according to a twenty-ninth preferred embodiment of the present invention. As shown in FIG. 96, the VBB generating circuit comprises a VBB level detector 81, a ring oscillator 82, and a VBB potential generating portion 83. The VBB potential generating portion 83 is an existing VBB potential generating portion employing a charge pumping system, and the ring oscillator 82 has an existing structure. The VBB level detector 81 receives a substrate potential VBB generated from the VBB potential generating portion 83 to output a level detection signal GE to the ring oscillator 82 on the basis of the substrate potential VBB. The ring oscillator 82 is on/off controlled in response to the level detection signal GE. The VBB potential generating portion 83 is inactive when the ring oscillator 82 is off.

Figure 97:
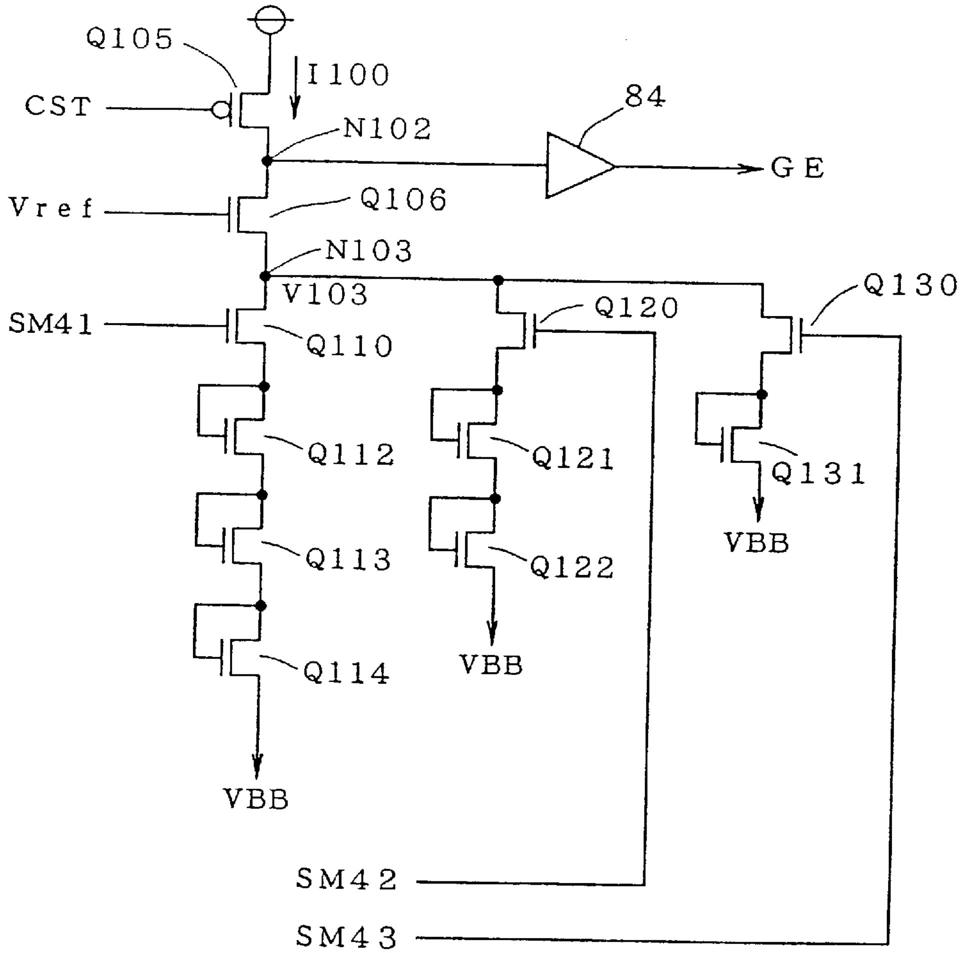
FIG. 97 is a circuit diagram showing the internal structure of a VBB level detector 81 shown in FIG. 96.
Figure 98:
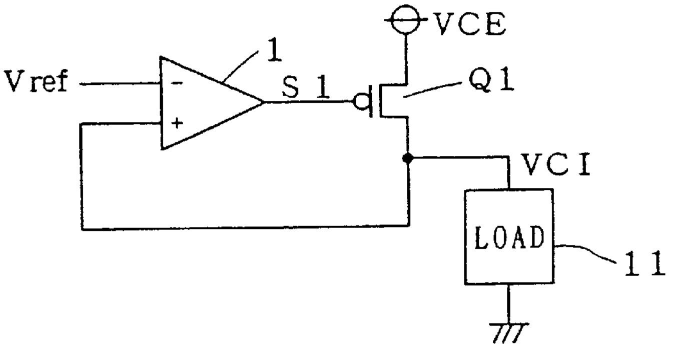
FIG. 98 Prior Art
FIGS. 98 and 99 are circuit diagrams of conventional internal power-source potential supply circuits.
Figure 99:
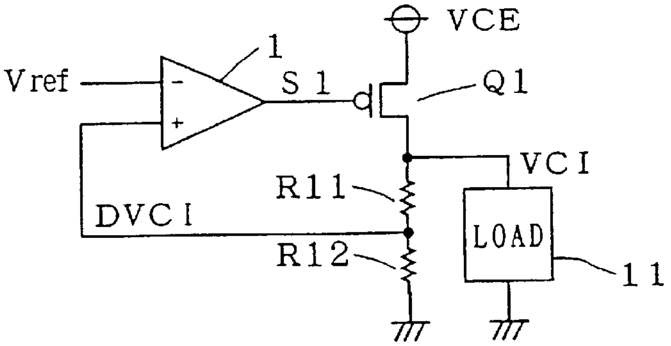
FIG. 99 Prior Art
Figure 100:
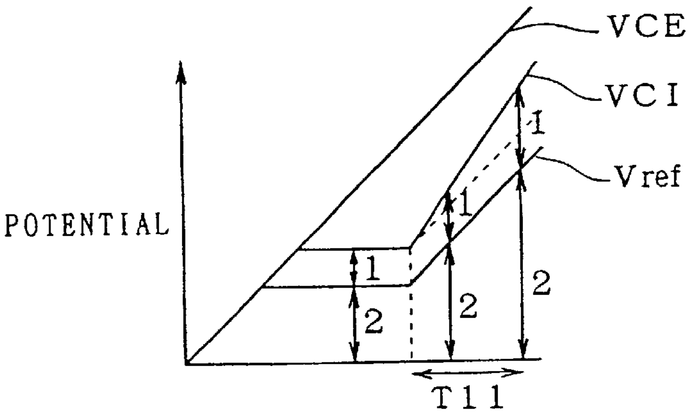
FIG. 100 Prior Art
FIG. 100 is a graph showing the operation of the conventional internal power-source potential supply circuits.

FIG. 97 is a circuit diagram showing the internal structure of the VBB level detector 81. As shown in FIG. 97, a PMOS transistor Q105 serving as a variable current source is connected between a power supply Vcc and an intermediate node N102 and has a gate receiving a control signal CST. A reference current I100 is fed from the power supply Vcc to the intermediate node N102 on the basis of the potential of the control signal CST.

The intermediate node N102 is connected to the drain of an NMOS transistor Q106 having a gate receiving the reference potential Vref. The source of the NMOS transistor Q106 is connected to a group of in-series diode-connected NMOS transistors Q112 to Q114 through an NMOS transistor Q110, is connected to a group of in-series diode-connected NMOS transistors Q121 and Q122 through an NMOS transistor Q120, and is connected to a diode-connected NMOS transistor Q131 through an NMOS transistor Q130.

The substrate potential VBB is applied to the source of the NMOS transistor Q114, the source of the NMOS transistor Q122, and the source of the NMOS transistor Q131. Switching signals SM41 to SM43 are applied to the gates of the NMOS transistors Q110, Q120, Q130, respectively. The diode connected NMOS transistors Q112 to Q114, Q121, Q122, Q131 have the same threshold voltage. The resistance of each of the control transistors Q110, Q120, Q130 is assumed to he zero when each control transistor is on.

An amplifier 84 has an input portion connected to the intermediate node N102 and amplifies the potential at the intermediate node N102 to output the level detection signal GE.

With this arrangement, the reference potential Vref is interiorly established, and the amount of current flowing through the NMOS transistor Q106 is controlled on the basis of the reference potential Vref. As the reference potential Vref increases, the amount of current flowing through the NMOS transistor Q106 increases to increase the detection level of a potential V103 at a node N103 correspondingly. Likewise, as the reference potential Vref decreases, the detection level of the potential V103 decreases.

The switching signals SM41 to SM43 determine the potential difference (V103–VBB) between the potential V103 and the substrate potential VBB. If the switching signals SM41 to SM43 are "H", "L", "L", respectively (first setting), then the NMOS transistor Q110 is on whereas the NMOS transistors Q120 and Q130 are off, and the amount of voltage drop of the three in-series diode-connected NMOS transistors Q112 to Q114 is equal to the potential difference (V103–VBB).

If the switching signals SM41 to SM43 are "L", "H", "L", respectively (second setting), then the NMOS transistor Q120 is on whereas the NMOS transistors Q110 and Q130 are off, and the amount of voltage drop of the two in-series diode-connected NMOS transistors Q121 and Q122 is equal to the potential difference (V103–VBB).

If the switching signals SM41 to SM43 are "L", "L", "H", respectively (third setting), then the NMOS transistor Q130 is on whereas the NMOS transistors Q110 and Q120 are off, and the amount of voltage drop of the one diode-connected NMOS transistor Q131 is equal to the potential difference (V103–VBB).

In this manner, the twenty-ninth preferred embodiment is adapted to set the bias potential (V103–VBB) of the potential V103 relative to the substrate potential VBB by using the switching signals SM41 to SM43 and to control the detection level of the potential V103 by using the NMOS transistor Q100 receiving the reference potential Vref, thereby to finally change the detection level of the substrate potential VBB.

Thus, the VBB generating circuit of the twenty-ninth preferred embodiment may be applied to the second method. Specifically, the first setting is normally made to provide a relatively deep detection level of the substrate potential, thereby providing the relatively deep substrate potential VBB outputted from the VBB potential generating portion 83. For extending the retention characteristic security range A1 to improve the retention characteristic, the second or third setting is made to provide a relatively shallow detection level of the substrate potential, thereby providing the relatively shallow substrate potential VBB outputted from the VBB potential generating portion 83.

While the invention has been described in detail, the foregoing description is in all aspects illustrative and not restrictive. It is understood that numerous other modifications and variations can be devised without departing from the scope of the invention.

I claim:

1. An output potential supply circuit for supplying an output potential for use in a semiconductor memory, comprising:

a first resistor element having a first end receiving an internal power-source potential, and a second end specified as an output node; and a second resistor element having a first node connected to said output node, and a second end receiving a fixed potential, said output node providing a potential specified as said output potential, wherein a resistance ratio of said first resistor element to said second resistor element is variable.

2. The output potential supply circuit of claim 1, wherein said semiconductor memory includes a memory cell having a first capacitance element and a bit line, said memory cell having a first electrode electrically connected to said bit line for read and write operations, wherein a potential at said first electrode of said memory cell is specified as a storage node potential, and a potential at a second electrode of said memory cell is specified as a cell plate potential, wherein said output node has a second capacitance element, and wherein said output potential is said cell plate potential.

3. The output potential supply circuit of claim 1, wherein said semiconductor memory includes a memory cell having a capacitance element and a bit line, said memory cell being formed on a semiconductor substrate, said memory cell having a first electrode electrically connected to said bit line for read and write operations, wherein a potential at said first electrode of said memory cell is specified as a storage node potential, and a potential at a second electrode of said memory cell is specified as a cell plate potential, and wherein said output potential is a precharge potential to which said bit line is set before the write operation.

* * * * *